(12) United States Patent
Song et al.

(10) Patent No.: US 9,477,032 B2
(45) Date of Patent: Oct. 25, 2016

(54) SUBSTRATES FOR PACKAGING FLIP-CHIP LIGHT EMITTING DEVICE AND FLIP-CHIP LIGHT EMITTING DEVICE PACKAGE STRUCTURES

(71) Applicant: SAMSUNG ELECTRONICS CO., LTD., Suwon-si, Gyeonggi-do (KR)

(72) Inventors: Jong-Sup Song, Suwon-si (KR); Sung-Soo Park, Suwon-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/469,097

(22) Filed: Aug. 26, 2014

(65) Prior Publication Data

US 2015/0187999 A1    Jul. 2, 2015

(30) Foreign Application Priority Data

Dec. 27, 2013  (KR) .................. 10-2013-0165843

(51) Int. Cl.
| | |
|---|---|
| *F21V 8/00* | (2006.01) |
| *H05K 1/02* | (2006.01) |
| *H05K 1/11* | (2006.01) |
| *H01L 33/48* | (2010.01) |
| *H05K 1/03* | (2006.01) |
| *G02F 1/1335* | (2006.01) |
| *H01L 33/56* | (2010.01) |
| *H01L 33/62* | (2010.01) |
| *H01L 33/54* | (2010.01) |

(52) U.S. Cl.
CPC .......... *G02B 6/0073* (2013.01); *G02B 6/0051* (2013.01); *G02B 6/0053* (2013.01); *H01L 33/486* (2013.01); *H05K 1/0271* (2013.01); *H05K 1/113* (2013.01); *G02F 1/133603* (2013.01); *G02F 2001/133607* (2013.01); *G02F 2001/133614* (2013.01); *H01L 33/54* (2013.01); *H01L 33/56* (2013.01); *H01L 33/62* (2013.01); *H05K 1/0306* (2013.01); *H05K 2201/10106* (2013.01)

(58) Field of Classification Search
None
See application file for complete search history.

(56) References Cited

U.S. PATENT DOCUMENTS

| | | | |
|---|---|---|---|
| 6,747,293 B2 | 6/2004 | Nitta et al. | |
| 8,304,805 B2 | 11/2012 | Lochtefeld | |
| 2009/0189171 A1 | 7/2009 | Lee et al. | |
| 2010/0015738 A1* | 1/2010 | Kim | H01L 33/0079 438/26 |
| 2012/0162565 A1* | 6/2012 | Lee | G02F 1/133308 349/58 |
| 2012/0193662 A1 | 8/2012 | Donofrio et al. | |
| 2013/0175554 A1* | 7/2013 | Han | H05K 3/284 257/88 |
| 2013/0277093 A1* | 10/2013 | Sun | H01L 25/0753 174/252 |
| 2014/0226345 A1 | 8/2014 | Song et al. | |

* cited by examiner

*Primary Examiner* — Shaun Campbell
*Assistant Examiner* — Aneta Cieslewicz
(74) *Attorney, Agent, or Firm* — Muir Patent Law, PLLC

(57) ABSTRACT

A substrate for packaging flip-chip light emitting device (LED) includes a substrate including a chip mount region, a first metal pattern overlapping a part of the chip mount region and disposed on the substrate, a second metal pattern disposed in a region including the chip mount region that is not overlapped with the first metal pattern, at an outer side of the first metal pattern, a third metal pattern disposed at an outer side of the second metal pattern, a first isolation line defined in a boundary between the first metal pattern and the second metal pattern, a second isolation line defined in a boundary between the second metal pattern and the third metal pattern, a lower pad disposed on a bottom of the substrate, and a via disposed to connect the first and second metal patterns to the lower pad in the substrate.

17 Claims, 51 Drawing Sheets

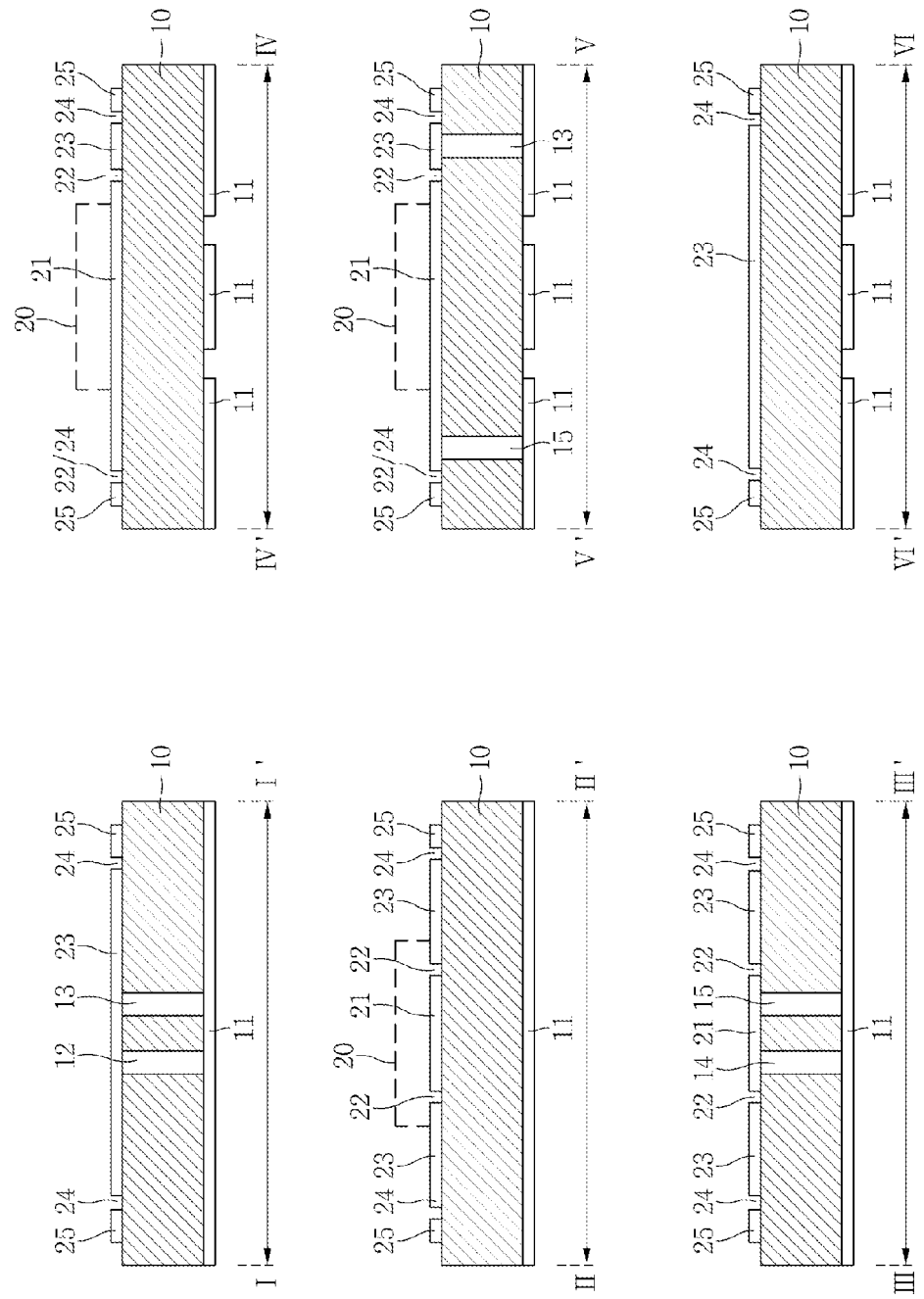

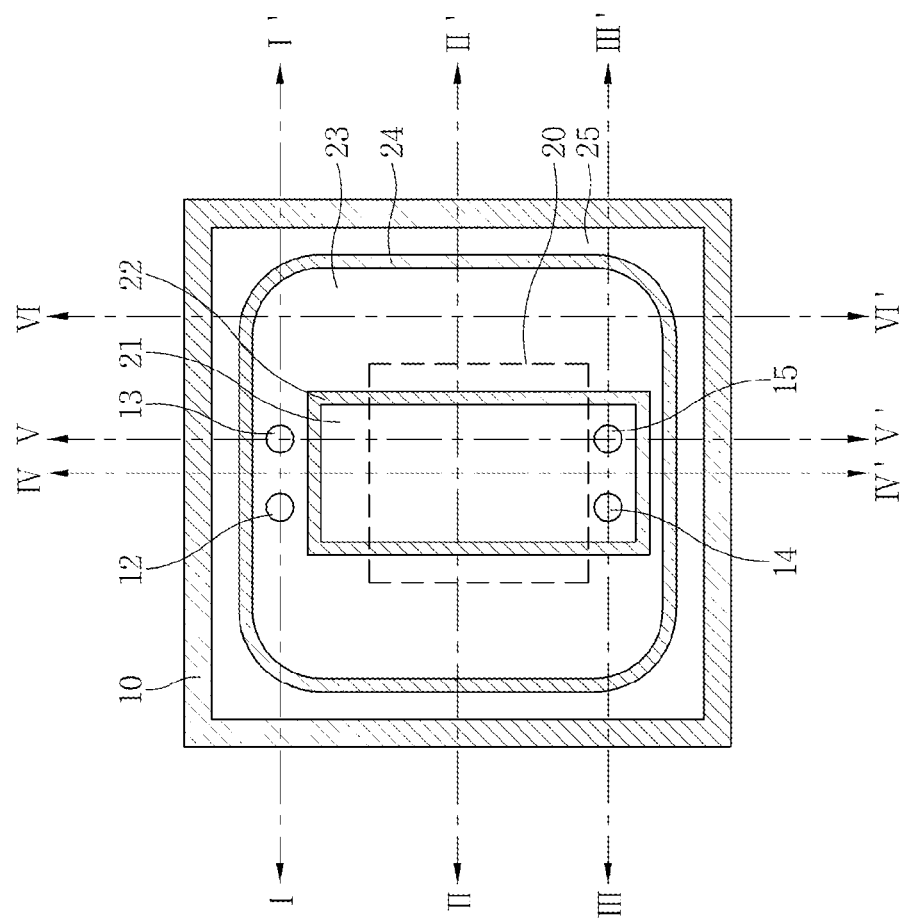

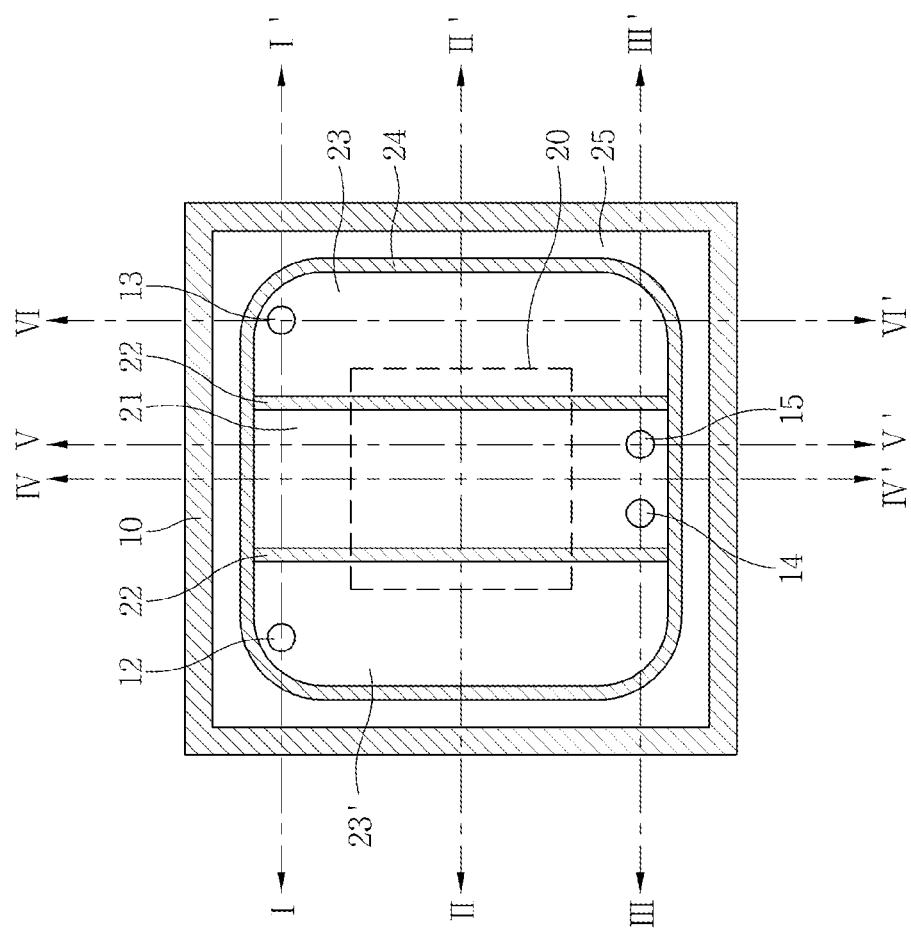

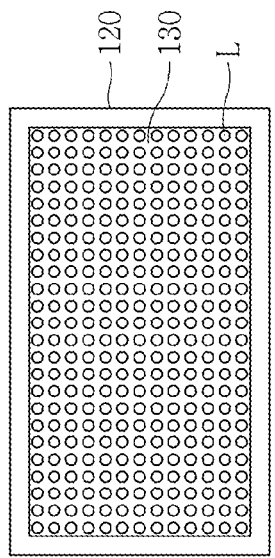
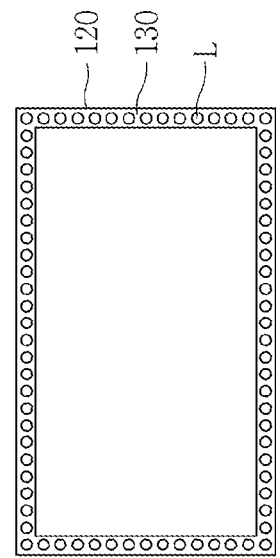

SUBSTRATES FOR PACKAGING FLIP-CHIP LIGHT EMITTING DEVICE AND FLIP-CHIP LIGHT EMITTING DEVICE PACKAGE STRUCTURES

CROSS-REFERENCE TO RELATED APPLICATION

This application claims benefit of priority to Korean Patent Application No. 10-2013-0165843 filed on Dec. 27, 2013, the entire content of which is hereby incorporated by reference.

TECHNICAL FIELD

The present inventive concept relates to a substrate for packaging flip-chip light emitting device (LED), a flip-chip LED package structure, and a display apparatus including the same.

BACKGROUND

Conventionally, a package substrate on which a lower metal pattern having two isolated plating regions is formed is being used to package an LED flip chip. An electrode-isolating line which isolates the lower metal pattern may be formed at a location deviated from a center of a chip mount region. Accordingly, during a high-temperature process of attaching the LED flip chip to the package substrate, thermal stresses due to a difference of thermal expansion coefficients between the package substrate and the LED flip chip (between the package substrate and a plating line, and between the LED flip chip and the plating line) can cause a failure such as chip crack at an attachment region. In addition, it is difficult to form a reflector having a uniform thickness after the LED flip chip is attached.

SUMMARY

Aspects of the inventive concept provide a substrate for packaging flip-chip light emitting device (LED).

Other aspects of the inventive concept provide a flip-chip LED package structure.

Still other aspects of the inventive concept provide a display apparatus including an LED having a substrate for packaging a flip-chip LED or flip-chip LED package structure.

The technical objectives of the inventive concept are not limited to the above disclosure; other objectives may become apparent to those of ordinary skill in the art based on the following descriptions.

One aspect of the inventive concept relates to a substrate for packaging a flip-chip LED including a substrate, a first metal pattern, a second metal pattern, a third metal pattern, a first isolation line, a second isolation line, a lower pad and a via. The substrate includes a chip mount region. The first metal pattern overlaps a part of the chip mount region and is disposed on the substrate. The second metal pattern is disposed in a region including the chip mount region that is not overlapped with the first metal pattern, at an outer side of the first metal pattern. The third metal pattern is disposed at an outer side of the second metal pattern. The first isolation line is defined in a boundary between the first metal pattern and the second metal pattern. The second isolation line is defined in a boundary between the second metal pattern and the third metal pattern. The lower pad is disposed on a bottom of the substrate. The via is disposed to connect the first and second metal patterns to the lower pad in the substrate.

Another aspect of the inventive concept encompasses a flip-chip LED package structure including a substrate, a first metal pattern, a second metal pattern, a third metal pattern, a first isolation line, a second isolation line, a lower pad, a flip chip LED, a via, and a reflector. The substrate includes a chip mount region. The first metal pattern overlaps a part of the chip mount region and is disposed on the substrate. The second metal pattern is disposed in a region including a non-overlapped chip mount region, at an outer side of the first metal pattern. The third metal pattern is disposed at an outer side of the second metal pattern. The first isolation line is defined in a boundary between the first metal pattern and the second metal pattern. The second isolation line is defined in a boundary between the second metal pattern and the third metal pattern. The lower pad is disposed on a bottom of the substrate. The via is disposed to connect the first and second metal patterns to the lower pad in the substrate. The flip chip LED is disposed on the chip mount region of the substrate. The reflector is disposed on the first and second metal patterns located at an outer side of the flip chip LED.

Still another aspect of the inventive concept relates to a display apparatus including an LED panel in which a plurality of LEDs including the substrate for packaging a flip-chip LED or the flip-chip LED package structure have the form of an array or a bar, a light guide plate configured to uniformly distribute light supplied from the LED panel in the entire area, a back light unit including a reflection sheet disposed under the light guide plate, diffusion sheet disposed on the light guide plate, a prism sheet disposed on the diffusion sheet, and a protection sheet disposed on the prism sheet, and an LCD panel disposed on the back light unit.

Still another aspect of the inventive concept encompasses a substrate for packaging a flip-chip light emitting device (LED), including a substrate, a first metal pattern, a second metal pattern, a third metal pattern, a first isolation line, a second isolation line, a lower pad, and a via. The substrate includes a chip mount region. The first metal pattern overlaps a part of the chip mount region and is disposed on the substrate. The second metal pattern has a first portion disposed at a first outer side of the first metal pattern and a second portion disposed at a second outer side of the first metal pattern. The third metal pattern is disposed at an outer side of the second metal pattern. The first isolation line is defined in a boundary between the first metal pattern and the second metal pattern. The second isolation line is defined in a boundary between the third metal pattern and the first and second metal patterns. The lower pad is disposed on a bottom of the substrate. The via is disposed to connect the first and second metal patterns to the lower pad in the substrate.

Details of embodiments of the present inventive concept are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings, the thickness of layers and regions may be exaggerated for clarity.

FIG. 1B shows cross-sectional views taken along lines I-I', II-II', III-III', IV-IV', V-V', and VI-VI' in FIG. 1A, FIG. 4A is a top perspective view of a substrate for packaging a flip-chip LED in accordance with an embodiment of the inventive concept, FIG. 6A is a top perspective view of a substrate for packaging a flip-chip LED in accordance with an embodiment of the inventive concept.

DETAILED DESCRIPTION

Figure 1A:
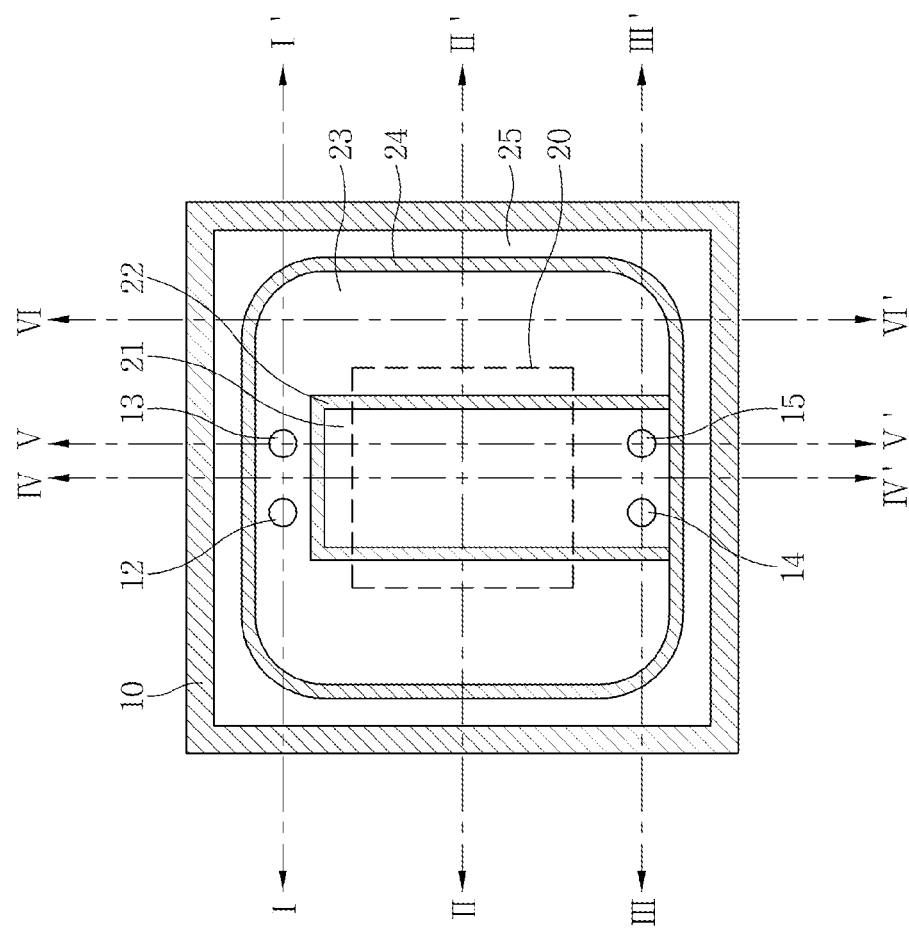
FIG. 1A is a top perspective view of a substrate for packaging a flip-chip LED in accordance with an embodiment of the inventive concept.

Various embodiments of the present inventive concept will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art.

The terminology used herein to describe embodiments of the inventive concept is not intended to limit the scope of the inventive concept. The articles "a," "an," and "the" are singular in that they have a single referent; however, the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In the following explanation, the same reference numerals denote the same components throughout the specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

FIG. 1A is a top perspective view of a substrate for packaging a flip-chip LED in accordance with an embodiment of the inventive concept, and FIG. 1B shows cross-sectional views taken along lines I-I', II-II', III-III', IV-IV', V-V', and VI-VI' in FIG. 1A.

Referring to FIGS. 1A and 1B, a substrate for packaging a flip-chip LED in accordance with an embodiment of the inventive concept may include a substrate 10, a first metal pattern 21, a second metal pattern 23, a third metal pattern 25, a first isolation line 22, a second isolation line 24, a lower pad 11, and vias 12, 13, 14, and 15.

The substrate 10 may include a polyphthalamide (PPA) resin substrate, a sintered ceramic substrate such as $Al_2O_3$ and AlN, or a substrate having a structure in which non-sintered ceramic sheets are stacked. The substrate 10 may include a chip mount region 20 on which a flip-chip LED is mounted.

The first metal pattern 21 may include W, Mo, Ag, Cu, etc. The first metal pattern 21 may be formed by a metal plating method. The first metal pattern 21 may be formed to overlap a part of the chip mount region 20 on an upper surface of the substrate 10. As an example, the first metal pattern 21 may be formed to have a width smaller than a width of the chip mount region 20 in a direction, as shown in FIG. 1A and a II-II' cross-sectional view in FIG. 1B. The first metal pattern 21 may be formed to have a width greater than a width of the chip mount region 20 in another direction, as shown in FIG. 1A and IV-IV' and V-V' cross-sectional views in FIG. 1B.

The second metal pattern 23 may include W, Mo, Ag, Cu, etc. The second metal pattern 23 may be formed by a metal plating method. The second metal pattern 23 may be formed at an outer side of the first metal pattern 21 on the substrate 10 and may fully include the chip mount region 20. A corner of the second metal pattern 23 may be rounded.

The third metal pattern 25 may include W, Mo, Ag, Cu, etc. The third metal pattern 25 may be formed by a metal plating method. The third metal pattern 25 may be formed on the substrate 10 at an outer side of the second metal pattern 23 or at an outer side of the second metal pattern 23 including the first metal pattern 21.

The first isolation line 22 may be formed on the substrate 10 at a boundary between the first metal pattern 21 and the second metal pattern 23, and electrically isolate the first metal pattern 21 and the second metal pattern 23. The first isolation line 22 may be formed to expose an upper surface of the substrate 10 at the boundary between the first metal pattern 21 and the second metal pattern 23. The first isolation line 22 may include mutually opposite lines centered around the chip mount region 20, and a couple of lines facing each other may be included in the first isolation line 22 and be formed symmetrical to each other in the chip mount region 20 of the substrate 10. As an example, as shown in FIG. 1A and II-II' cross-sectional view of FIG. 1B, the first isolation line 22 may be formed as a couple of mutually opposite lines passing the chip mount region 20 of the substrate 10 in a direction. The first isolation line 22 may include lines, each of which is formed to be symmetrical with respect to the chip mount region 20 by being equidistantly spaced inward from a corresponding outer side of the chip mount region 20. In addition, as shown in FIG. 1A, and IV-IV' and V-V' cross-sectional views of FIG. 1B, the first isolation line 22 may be formed as a couple of mutually opposite lines passing an outer side of the chip mount region 20 of the package substrate 10 in another direction.

The second isolation line 24 may be formed on the substrate 10 at a boundary between the second metal pattern 23 and the third metal pattern 25, and electrically isolate the second metal pattern 23 and the third metal pattern 25. The second isolation line 24 may be formed to expose an upper surface of the substrate 10 at a boundary between the second metal pattern 23 and the third metal pattern 25. The second isolation line 24 may include mutually opposite lines, and the mutually opposite lines may be formed in an outer side of the chip mount region 20 of the substrate 10. As an example, as shown in FIG. 1A, and II-II', IV-IV', and V-V' cross-sectional views of FIG. 1B, the second isolation line 24 may be formed as mutually opposite lines at an outer side of the chip mount region 20, centered around the chip mount region 20. A corner area of the second isolation line 24 at which the lines are connected may be rounded.

The first isolation line 22 and the second isolation line 24 may be formed as a common line at a predetermined region. As an example, as shown in FIG. 1A, and IV-IV' and V-V' cross-sectional views of FIG. 1B, the first isolation line 22 and the second isolation line 24 may be formed as a common line 22/24 at a predetermined region.

The lower pad 11 may be formed on a bottom of the substrate 10 and include a thermal pad, an electrode pad, etc.

The vias 12, 13, 14, and 15 may be formed in the substrate 10. The first metal pattern 21 and the second metal pattern 23 on the substrate 10 may be electrically connected to the lower pad 11 on the bottom of the substrate 10 by the vias 12, 13, 14, and 15. As an example, as shown in FIG. 1A, and I-I' and V-V' cross-sectional views of FIG. 1B, the vias 12 and 13 may be formed to electrically connect the second metal pattern 23 on the substrate 10 and the lower pad 11 on the bottom of the substrate 10. As shown in FIG. 1A, and and V-V' cross-sectional views of FIG. 1B, the vias 14 and 15 may be formed to electrically connect the first metal pattern 21 on the substrate 10 and the lower pad 11 on the bottom of the substrate 10.

In embodiments of the present inventive concept, the vias electrically connected to the first metal pattern 21 may be formed to have two vias 14 and 15, and the vias electrically connected to the second metal pattern 23 may be formed to have two vias 12 and 13. However, the vias electrically connected to each metal patterns 21, 23 in accordance with the embodiments of the inventive concept may be formed to be as a single via or groups of via. Further, the vias electrically connected to each metal patterns 21, 23 may be formed at any preferred position of the substrate 10 below each metal pattern.

The first metal pattern 21, the second metal pattern 23, the third metal pattern 25, the first isolation line 22, and the second isolation line 24 may be formed in a single process. As an example, a photo imageable solder resist (PSR) thin film that has the same pattern as the first isolation line 22 and second isolation line 24 may be formed on the substrate 10, and a metal layer may be formed on the substrate 10 by a metal plating method. Next, the first metal pattern 21, the second metal pattern 23, the third metal pattern 25, the first isolation line 22, and the second isolation line 24 may be formed on the substrate 10 by removing the PSR thin film.

The substrate for packaging a flip-chip LED in accordance with an embodiment of the inventive concept may include the first isolation line 22 that isolates the first metal pattern 21 and the second metal pattern 23, and the second isolation line 24 that isolates the second metal pattern 23 and the third metal pattern 25. Each of the first isolation line 22 and the second isolation line 24 may be formed to have the mutually opposite lines centered around the chip mount region 20, and the first isolation line 22 may have lines formed to be equidistantly spaced inward from corresponding outer sides of the chip mount region 20 in a direction. Accordingly, during a process of packaging the flip-chip LED or during operation of the manufactured LED, stress due to a difference of thermal expansion coefficients between the flip chip LED and the metal patterns 21, 23, and 25, or between the substrate 10 and the metal patterns 21, 23, and 25 can be minimized, and defects such as chip crack can be prevented.

Figure 2A:
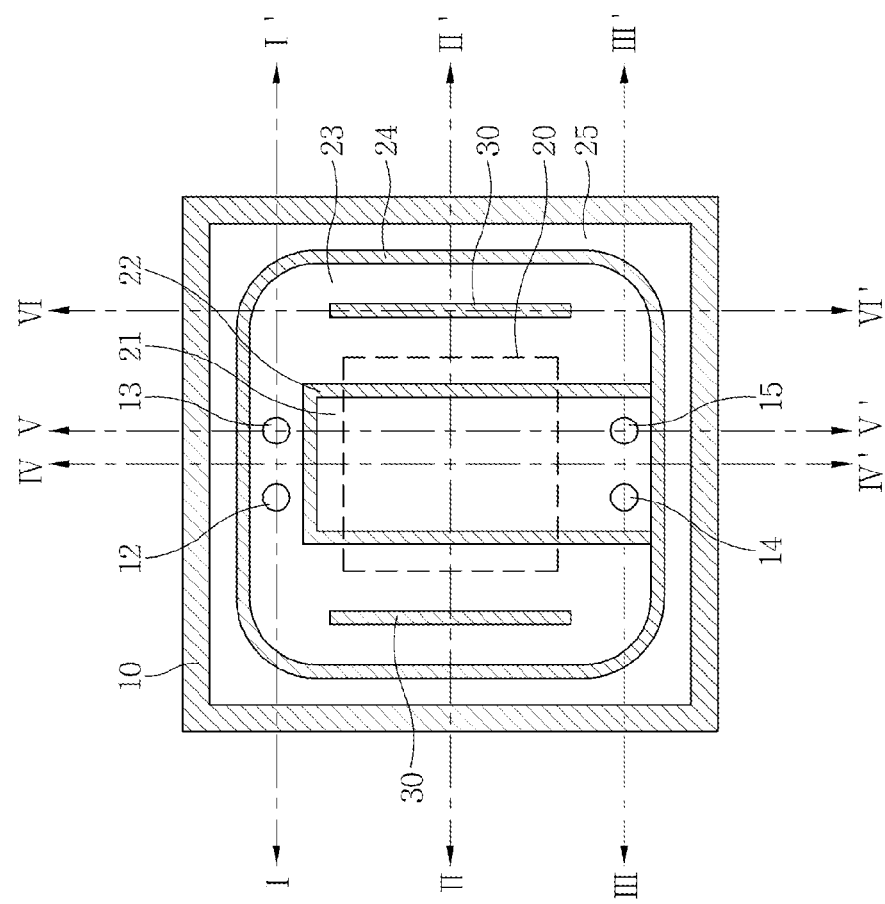
FIG. 2A is a top perspective view of a substrate for packaging a flip-chip LED in accordance with an embodiment of the inventive concept.
Figure 2B:
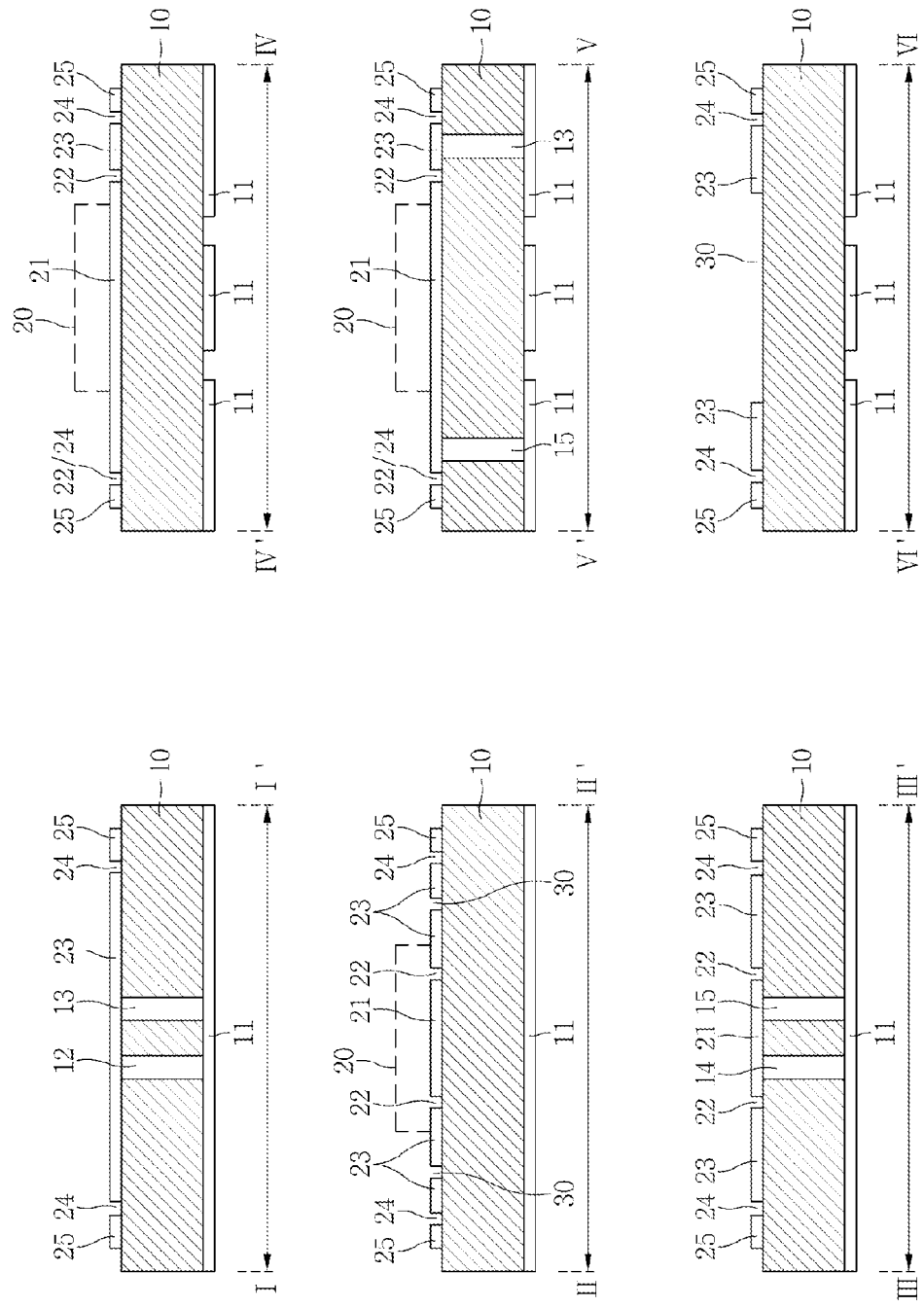
FIG. 2B shows cross-sectional views taken along lines I-I', II-II', III-III', IV-IV', V-V', and VI-VI' in FIG. 2A.

FIG. 2A is a top perspective view showing a substrate for packaging a flip-chip LED in accordance with an embodiment of the inventive concept, and FIG. 2B shows cross-sectional views taken along lines I-I', II-II', III-III', IV-IV', V-V', and VI-VI' in FIG. 2A.

Referring to FIGS. 2A and 2B, a substrate for packaging a flip-chip LED in accordance with an embodiment of the inventive concept may include a substrate 10, a first metal pattern 21, a second metal pattern 23, a third metal pattern 25, a first isolation line 22, a second isolation line 24, slits 30, a lower pad 11, and vias 12, 13, 14, and 15.

The substrate 10, the first metal pattern 21, the second metal pattern 23, the third metal pattern 25, the first isolation line 22, the second isolation line 24, the lower pad 11, and the vias 12, 13, 14, and 15 may be understood with reference to FIGS. 1A and 1B.

Figure 3:
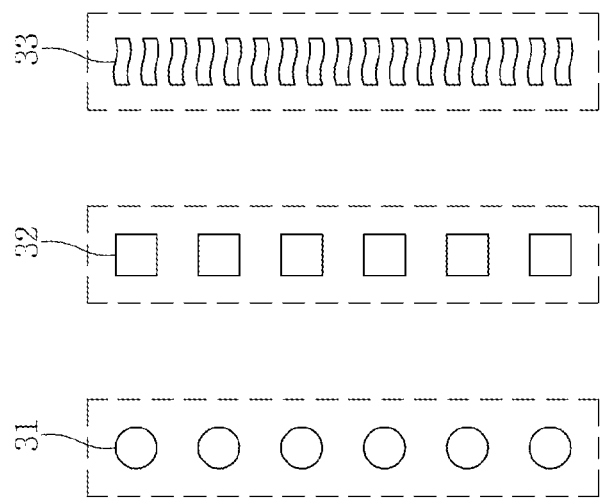
FIG. 3 is a plan view schematically showing various shapes of slit in a substrate for packaging a flip-chip LED in accordance with an embodiment of the inventive concept.

Each of the slits 30 may be formed in the second metal pattern 23 at an outer side of the chip mount region 20 and parallel to the first isolation line 22 formed in the chip mount region 20. Each of the slits 30 may be equidistantly spaced from a corresponding outer side of the chip mount region 20. The slit 30 may be formed to expose an upper surface of the substrate 10 in a region in which the slit is formed. The slit 30 may include symmetrical single lines or groups of lines centered around the chip mount region 20 in a direction. For example, as shown in FIG. 2A, and II-II' and VI-VI' cross-sectional view in FIG. 2B, the slits 30 may be formed in the second metal pattern 23 at the outer side of the chip mount region 20 so as to be parallel to the first isolation line 22 formed to pass through the chip mount region 20, and to be symmetrical with respect to the chip mount region 20 and centered around the chip mount region 20. For example, as shown in FIG. 3, the slit 30 may be formed, for example, by forming a plurality of circular grids 31, polygonal grids 32, or moire grids 33 in a single line. The length of the slit 30 may be the same as or greater than a width of the chip mount region 20.

The first metal pattern 21, the second metal pattern 23, the third metal pattern 25, the first isolation line 22, the second isolation line 24, and the slit 30 may be formed in a single process. As an example, a PSR thin film having the same pattern as the first isolation line 22, second isolation line 24, and slit 30 may be formed on the substrate 10, and a metal layer may be formed on the substrate 10 by a metal plating method. Next, the first metal pattern 21, the second metal pattern 23, the third metal pattern 25, the first isolation line 22, the second isolation line 24, and the slit 30 may be formed on the substrate 10 by removing the PSR thin film.

The substrate for packaging a flip-chip LED in accordance with an embodiment of the inventive concept may include the first isolation line 22 that isolates the first metal pattern 21 and the second metal pattern 23, and the second isolation line 24 that isolates the second metal pattern 23 and the third metal pattern 25 in such a way that each of the first isolation line 22 and the second isolation line 24 has mutually opposite the lines centered around the chip mount region 20. Further, the first isolation line 22 may have lines, each of which is formed to be equidistantly spaced inward from a corresponding outer side of the chip mount region 20 in a direction, and the slit 30 may include symmetrical single lines or groups of lines centered around the chip mount region 20 in a direction. Accordingly, during a process of packaging the flip-chip LED or during operation of the manufactured LED, stress due to a difference of thermal expansion coefficients between the flip chip LED and the metal patterns 21, 23, and 25, or between the substrate 10 and the metal patterns 21, 23, and 25 can be minimized, and defects such as chip crack can be prevented.

Figure 4B:
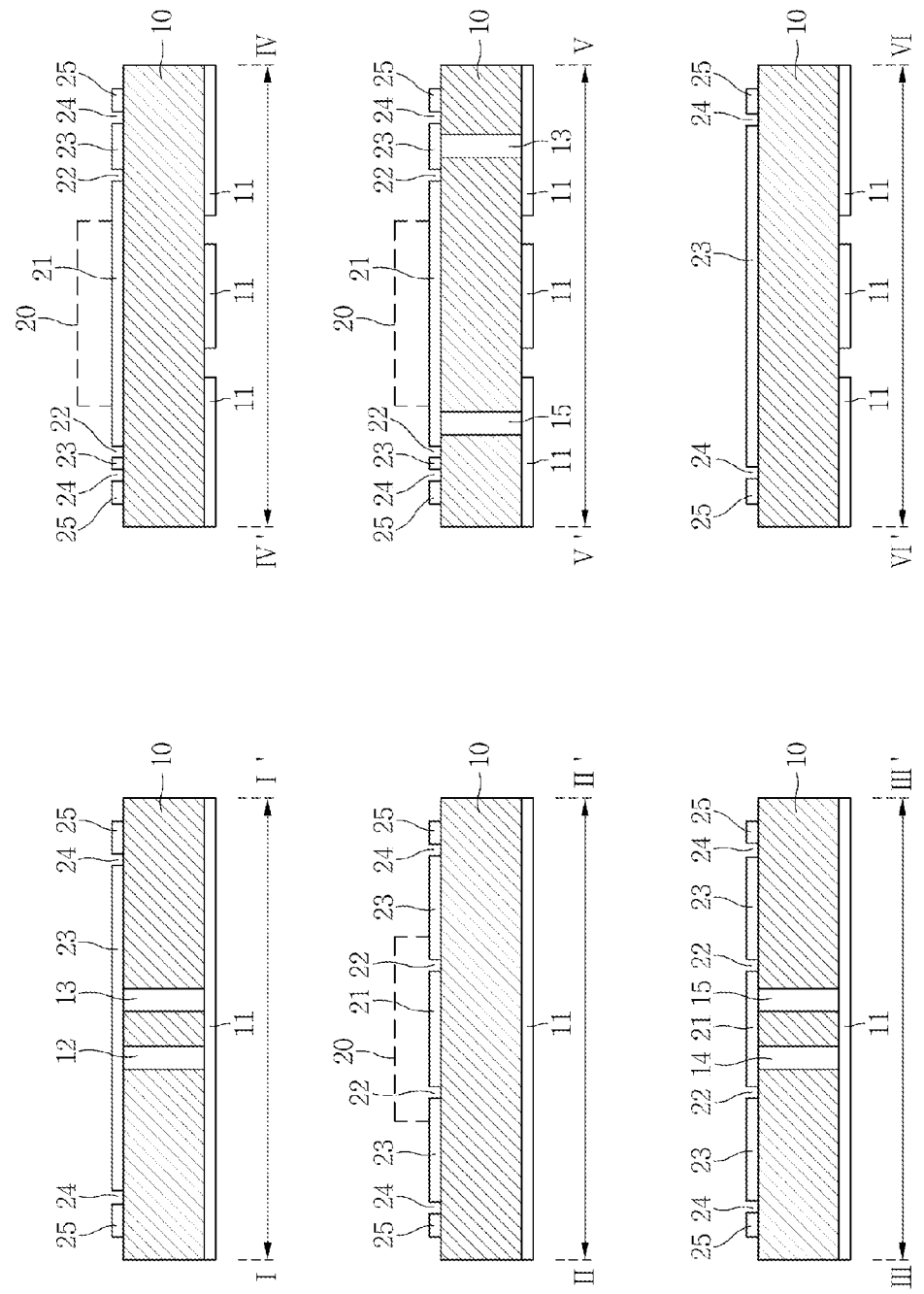
FIG. 4B shows cross-sectional views taken along lines I-I', II-II', III-III', IV-IV', V-V', and VI-VI' in FIG. 4A.

FIG. 4A is a top perspective view showing a substrate for packaging a flip-chip LED in accordance with an embodiment of the inventive concept, and FIG. 4B shows cross-sectional views taken along lines I-I', II-II', III-III', IV-IV', V-V', and VI-VI' in FIG. 4A.

Referring to FIGS. 4A and 4B, a substrate for packaging a flip-chip LED in accordance with an embodiment of the inventive concept may include a substrate 10, a first metal pattern 21, a second metal pattern 23, a third metal pattern 25, a first isolation line 22, a second isolation line 24, a lower pad 11, and vias 12, 13, 14, and 15.

The substrate 10 may include a chip mount region 20 on which a flip chip LED is mounted.

The first metal pattern 21 may be formed to have a part overlapping the chip mount region 20 on the upper surface of the substrate 10.

The second metal pattern 23 may be formed to fully surround the first metal pattern 21 on an outer area of the substrate 10, and fully include the chip mount region 20. Corners of the second metal pattern 23 may be rounded.

The third metal pattern 25 may be formed at an outside of the second metal pattern 23 on the substrate 10.

The first isolation line 22 may be formed on the substrate 10 located in a boundary between the first metal pattern 21 and the second metal pattern 23 such that the first metal pattern 21 is in the form of an island. The first isolation line 22 may include symmetrical lines centered around the chip mount region 20, and the symmetrical lines may be formed in chip mount region 20 of the substrate 10 in a direction.

The second isolation line 24 may be formed on the substrate 10 located in a boundary between the second metal pattern 23 and the third metal pattern 25 such that the second metal pattern 23 is in the form of an island. The second isolation line 24 may include mutually opposite lines with respect to, and centered around, the chip mount region 20, and corners of the second metal pattern 23 at which the lines meet each other may be rounded.

The lower pad 11 and vias 11, 12, 13, and 14 may be understood with reference to FIGS. 1A and 1B.

In the substrate for packaging a flip-chip LED in accordance with an embodiment of the inventive concept, each of the first isolation line 22 and the second isolation line 24 may include lines symmetrical/opposite to each other with respect to, and centered around, the chip mount region 20, and the first isolation line 22 may be formed in the chip mount region 20. Accordingly, during a process of packaging the flip-chip LED or during operation of the manufactured LED, stress due to a difference of thermal expansion coefficients between the flip chip LED and the metal patterns 21, 23, and 25, or between the substrate 10 and the metal patterns 21, 23, and 25 can be minimized, and therefore defects such as chip crack can be prevented.

Figure 5A:
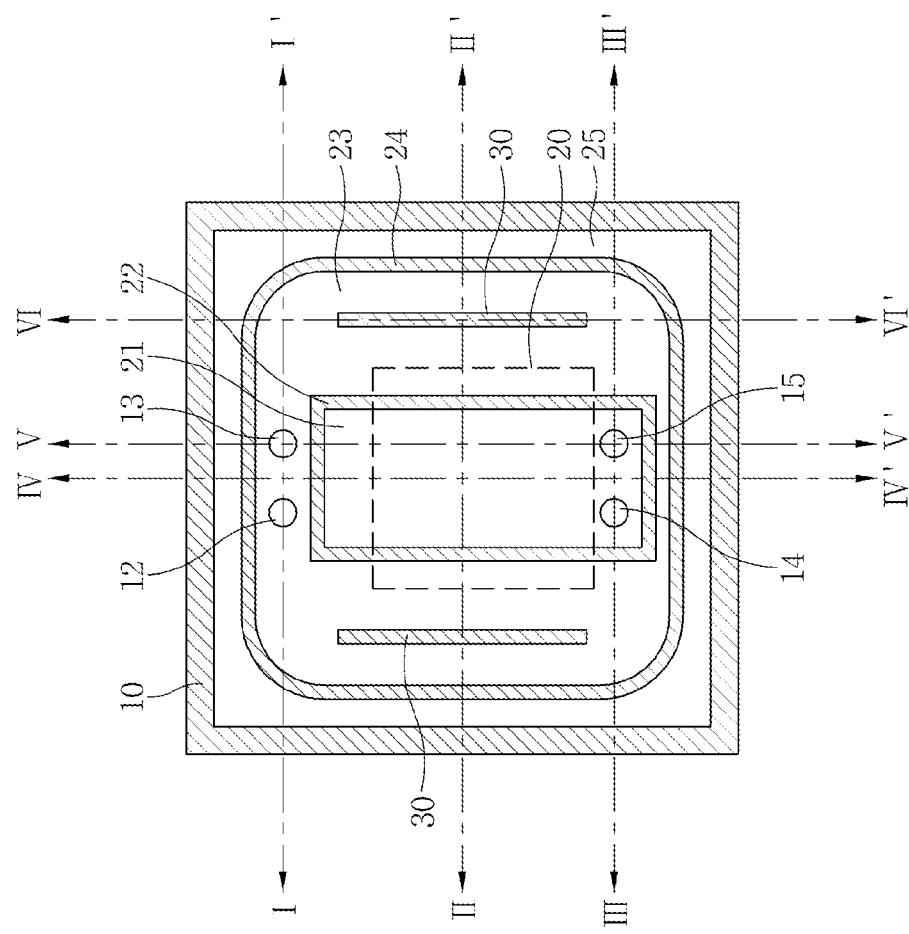
FIG. 5A is a top perspective view of a substrate for packaging a flip-chip LED in accordance with an embodiment of the inventive concept.
Figure 5B:
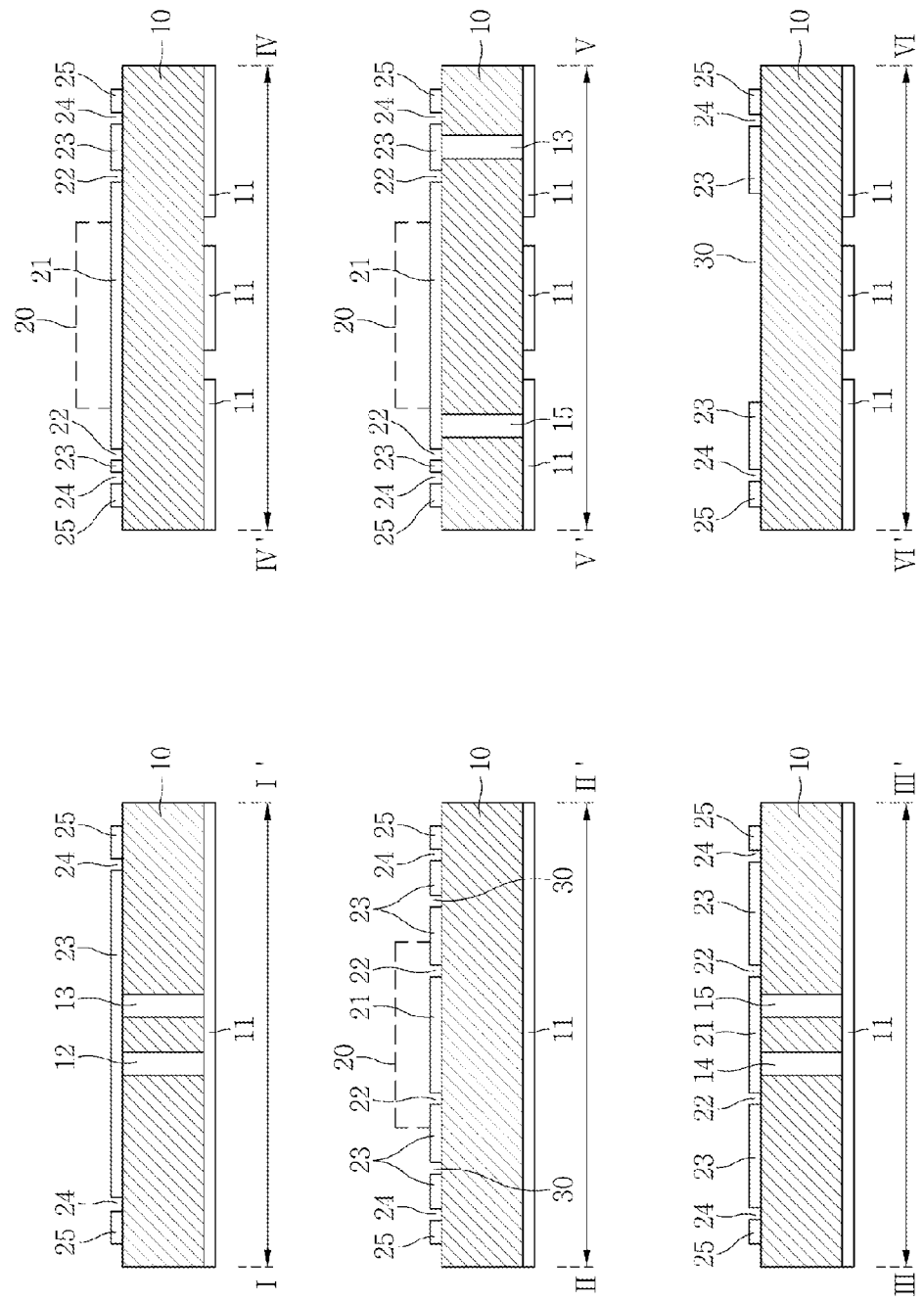
FIG. 5B shows cross-sectional views taken along lines I-I', II-II', III-III', IV-IV', V-V', and VI-VI' in FIG. 5A.

FIG. 5A is a top perspective view showing a substrate for packaging a flip-chip LED in accordance with an embodiment of the inventive concept, and FIG. 5B shows cross-sectional views taken along lines I-I', II-II', III-III', IV-IV', V-V', and VI-VI' in FIG. 5A.

Referring to FIGS. 5A and 5B, a substrate for packaging a flip-chip LED in accordance with an embodiment of the inventive concept may include a substrate 10, a first metal pattern 21, a second metal pattern 23, a third metal pattern 25, a first isolation line 22, a second isolation line 24, slits 30, a lower pad 11, and vias 12, 13, 14, and 15.

The substrate 10, the first metal pattern 21, the second metal pattern 23, the third metal pattern 25, the first isolation line 22, the second isolation line 24, the lower pad 11, and the vias 12, 13, 14, and 15 may be understood with reference to FIGS. 4A and 4B.

The slits 30 may be formed to be opposite to each other and symmetrical with respect to the chip mount region 20 on the second metal pattern 23 disposed at both outer sides of the chip mount region 20, and parallel to the first isolation line 22 formed in the chip mount region 20.

Figure 6B:
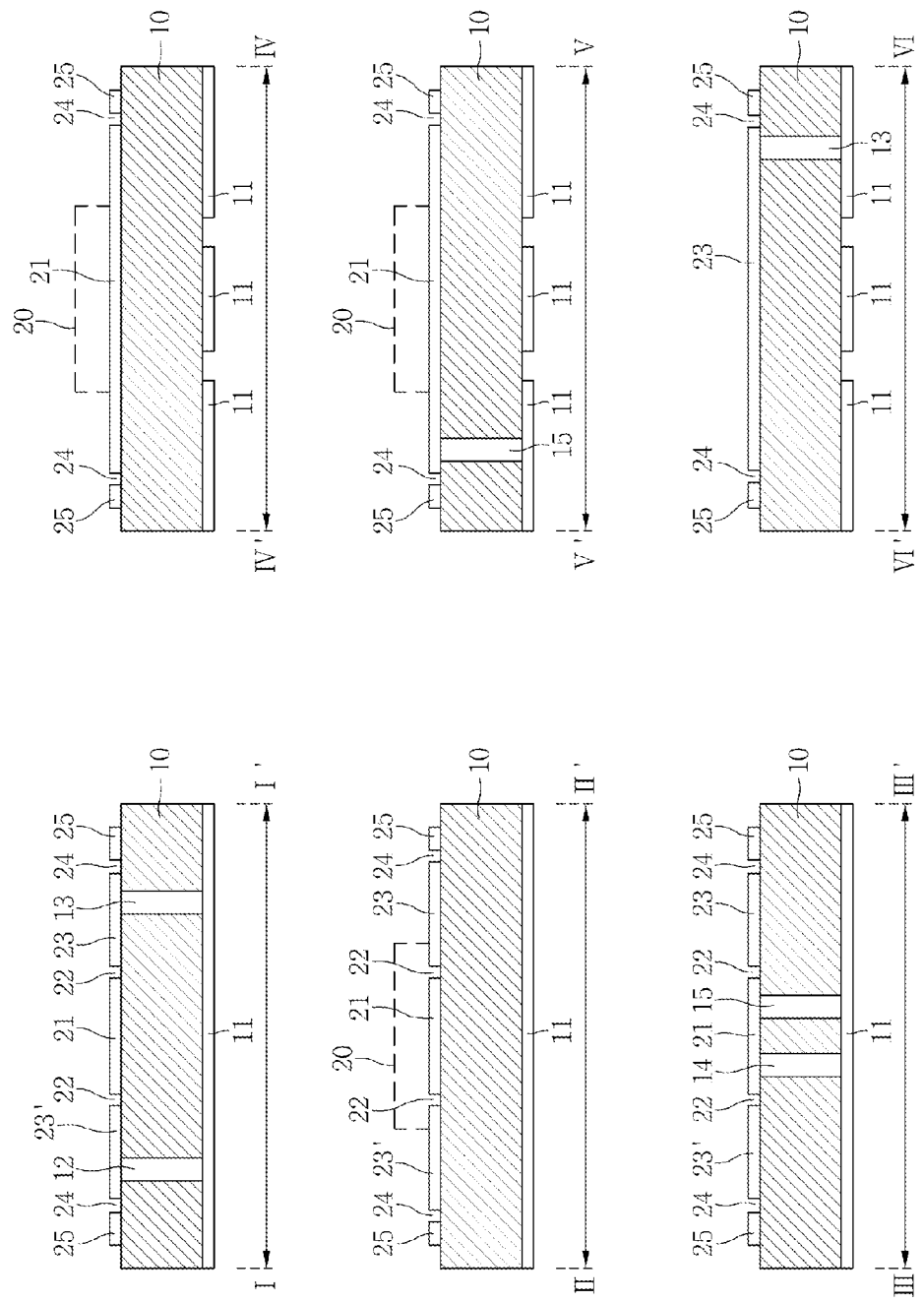
FIG. 6B shows cross-sectional views taken along lines I-I', II-II', III-III', IV-IV', V-V', and VI-VI' in FIG. 6A.

FIG. 6A is a top perspective view showing a substrate for packaging a flip-chip LED in accordance with an embodiment of the inventive concept, and FIG. 6B shows cross-sectional views taken along lines I-I', II-II', III-III', IV-IV', V-V', and VI-VI' in FIG. 6A.

Referring to FIGS. 6A and 6B, a substrate for packaging a flip-chip LED in accordance with an embodiment of the inventive concept may include a substrate 10, a first metal pattern 21, second metal patterns 23 and 23', a third metal pattern 25, a first isolation line 22, a second isolation line 24, a lower pad 11, and vias 12, 13, 14, and 15.

The substrate 10 may include a chip mount region 20 on which a flip chip LED is mounted.

The first metal pattern 21 may be formed to overlap a part of the chip mount region 20 of the substrate 10.

The second metal patterns 23 and 23' may be formed on the substrate 10 and located at both sides of the first metal pattern 21, and each of the second metal patterns 23 and 23' may be formed to include the chip mount region 20 which does not overlap the first metal pattern 21. Corners of the second metal patterns 23 and 23' that do not border the first metal pattern 21 may be rounded.

The third metal pattern 25 may be formed on the substrate 10 and located at an outer side of the second metal patterns 23 and 23' and the first metal pattern 21, and the second metal patterns 23 and 23' and the first metal pattern 21 may be formed in the form of an island by the third metal pattern 25. As an example, as shown in FIG. 6A and the cross-sectional views in FIG. 6B, the third metal pattern 25 may be formed on the substrate 10 and may include a first portion that is located at an outer side of the second metal patterns 23 and 23' and does not border the first metal pattern 21, and a second portion that is located at an outer side of the first metal pattern 21 and does not border the second metal patterns 23 and 23'. The entire metal patterns 21, 23, and 23' that include the first metal pattern 21 and the second metal patterns 23 and 23' formed at both sides of the first metal pattern 21 may be formed in the form of an island surrounded by the third metal pattern 25.

The first isolation line 22 may be formed on the substrate 10 and located at the boundary between the first metal pattern 21 and the second metal patterns 23 and 23'. The first isolation line 22 may be formed to include mutually opposite lines in a direction and to be symmetrical with respect to the chip mount region 20.

The second isolation line 24 may be formed on the substrate 10 and located at a boundary between the first metal pattern 21 and the third metal pattern 25 and at a boundary between the second metal patterns 23 and 23' and the third metal pattern 25. The second isolation line 24 may include a plurality of lines opposite to each other and symmetrical with respect to the chip mount region 20, and corners of the second isolation line 24 at which the lines meet each other may be rounded.

The lower pad 11 may include a thermoelectric pad, an electrode pad, etc. on a lower surface of the substrate 10.

The vias 12, 13, 14, and 15 may be formed in the substrate 10. The via 12 may be formed to connect the second metal pattern 23' and the lower pad 11, the via 13 may be formed to connect the second metal pattern 23 and the lower pad 11, and the vias 14 and 15 may be formed to connect the first metal pattern 21 and the lower pad 11.

In the substrate for packaging a flip-chip LED in accordance with the embodiment of the inventive concept, the first isolation line 22 is formed as symmetrical lines in the chip mount region 20. Accordingly, during a process of packaging the flip-chip LED or during operation of the manufactured LED, stress due to a difference of thermal expansion coefficients between the flip chip LED and the metal patterns 21, 23, 23', and 25, or between the substrate 10 and the metal patterns 21, 23, 23', and 25 can be minimized. By minimizing stress due to thermal expansion, defects such as chip crack can be prevented.

Figure 7A:
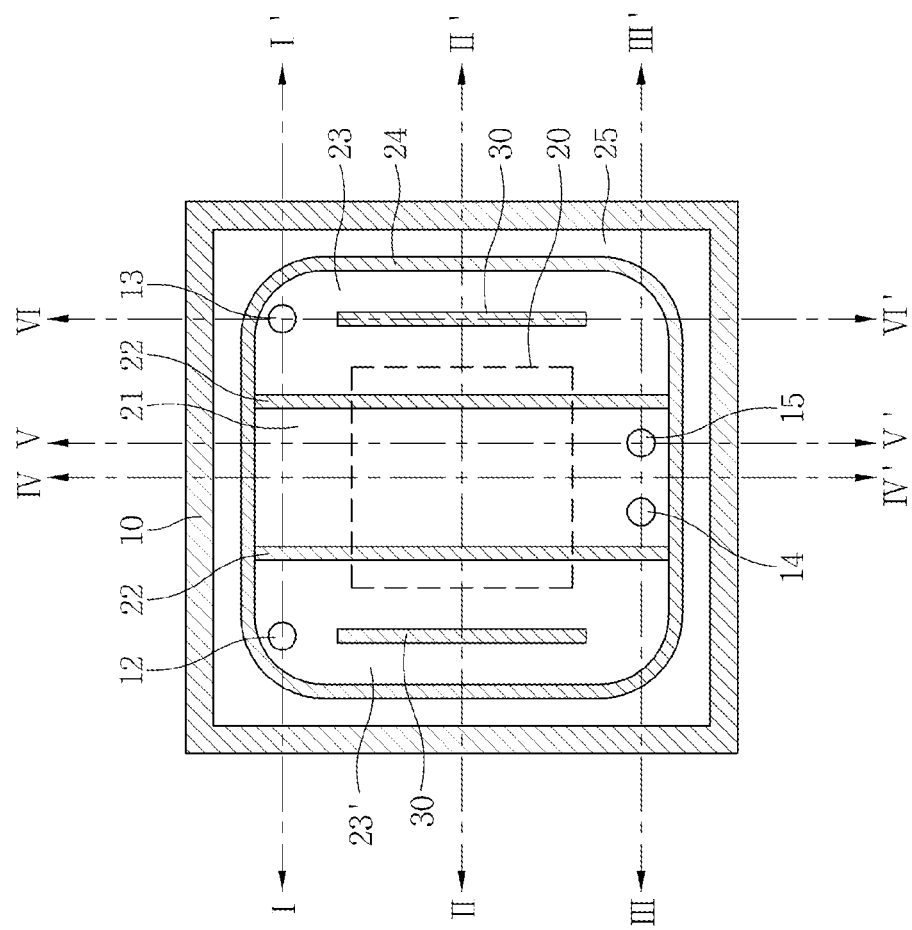
FIG. 7A is a top perspective view of a substrate for packaging a flip-chip LED in accordance with an embodiment of the inventive concept.
Figure 7B:
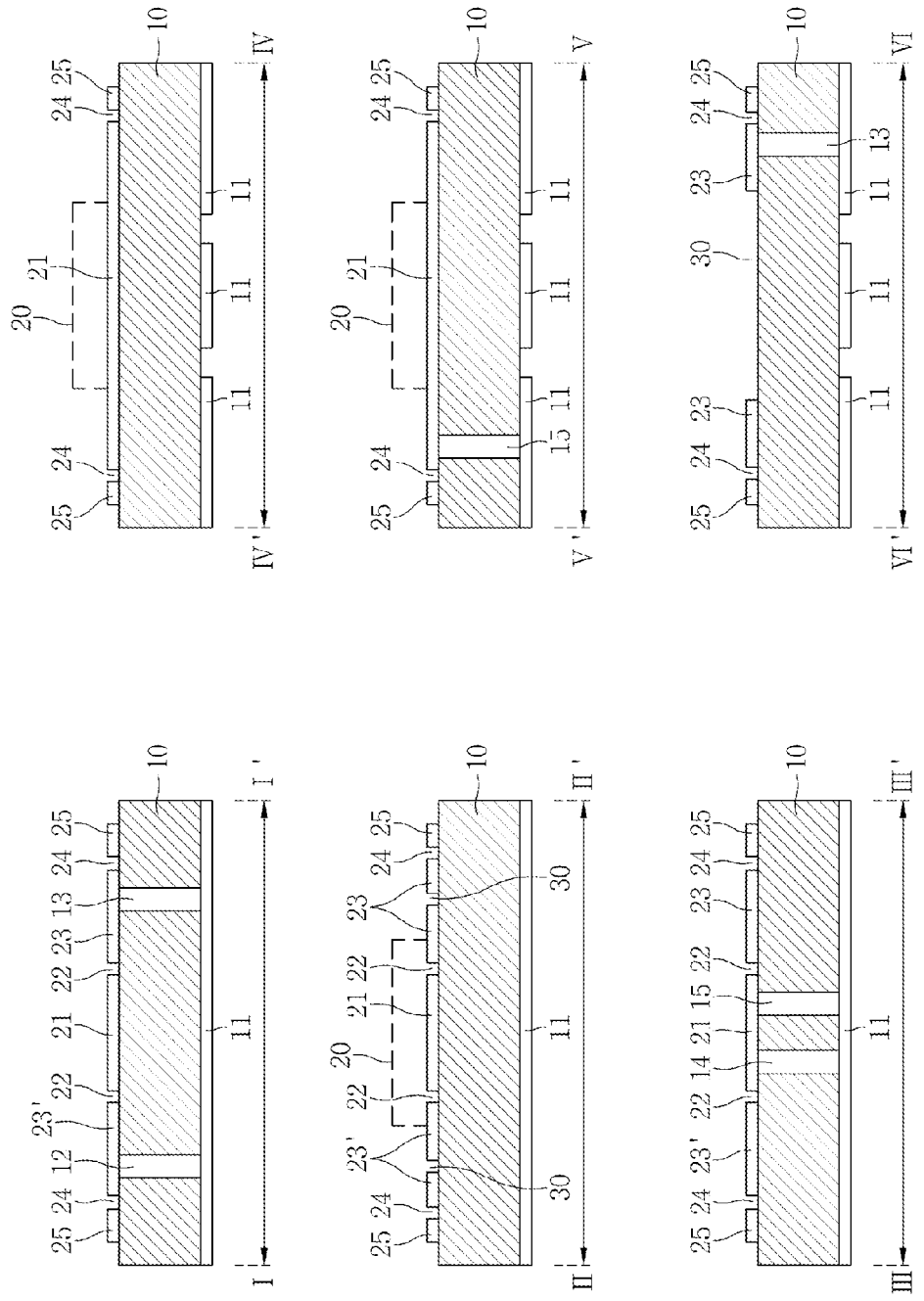
FIG. 7B shows cross-sectional views taken along lines I-I', II-II', III-III', IV-IV', V-V', and VI-VI' in FIG. 7A.

FIG. 7A is a top perspective view showing a substrate for packaging a flip-chip LED in accordance with an embodiment of the inventive concept, and FIG. 7B shows cross-sectional views taken along lines I-I', II-II', III-III', IV-IV', V-V', and VI-VI' in FIG. 7A.

Referring to FIGS. 7A and 7B, a substrate for packaging a flip-chip LED in accordance with an embodiment of the inventive concept may include a substrate 10, a first metal pattern 21, second metal patterns 23 and 23', a third metal pattern 25, a first isolation line 22, a second isolation line 24, a slit 30, a lower pad 11, and vias 12, 13, 14, and 15.

The substrate 10, the first metal pattern 21, the second metal patterns 23 and 23', the third metal pattern 25, the first isolation line 22, the second isolation line 24, the lower pad 11, and vias 12, 13, 14, and 15 may be understood with reference to FIGS. 6A and 6B.

The slit 30 may be formed to be opposite to each other and symmetrical with respect to the chip mount region 20 in the second metal patterns 23 and 23' at both outer sides of the chip mount region 20, and parallel to the first isolation line 22 formed in the chip mount region 20.

Figure 8A:
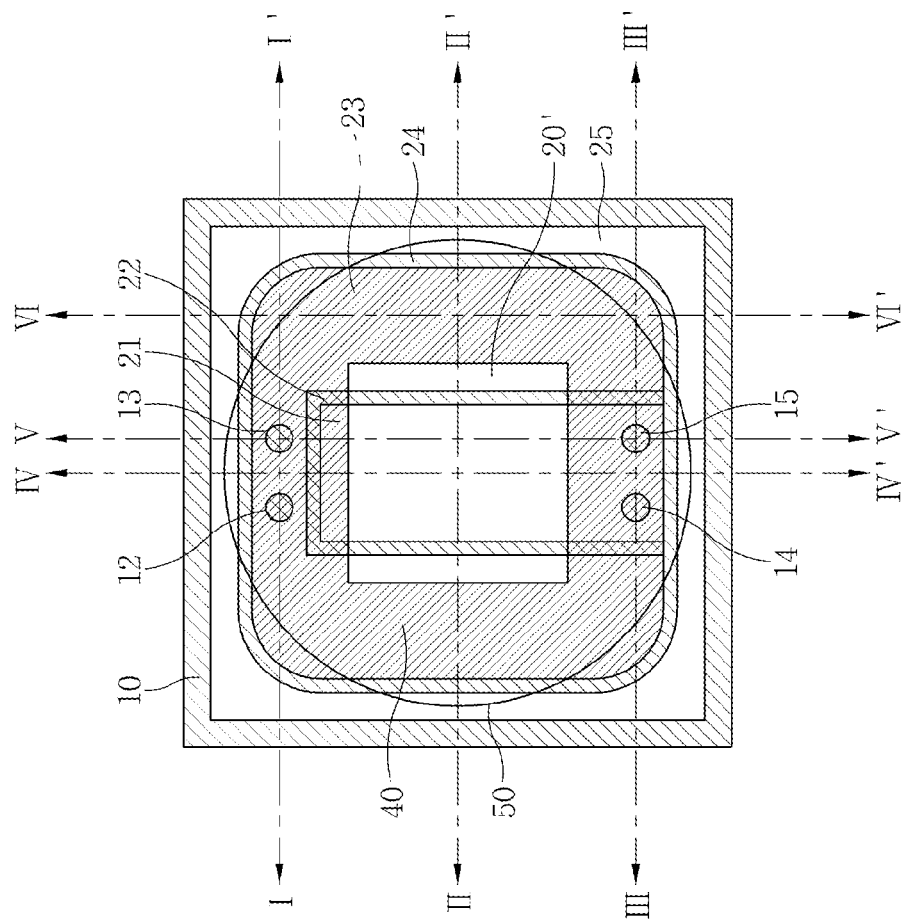
FIG. 8A is a top perspective view of a flip-chip LED package structure in accordance with an embodiment of the inventive concept.
Figure 8B:
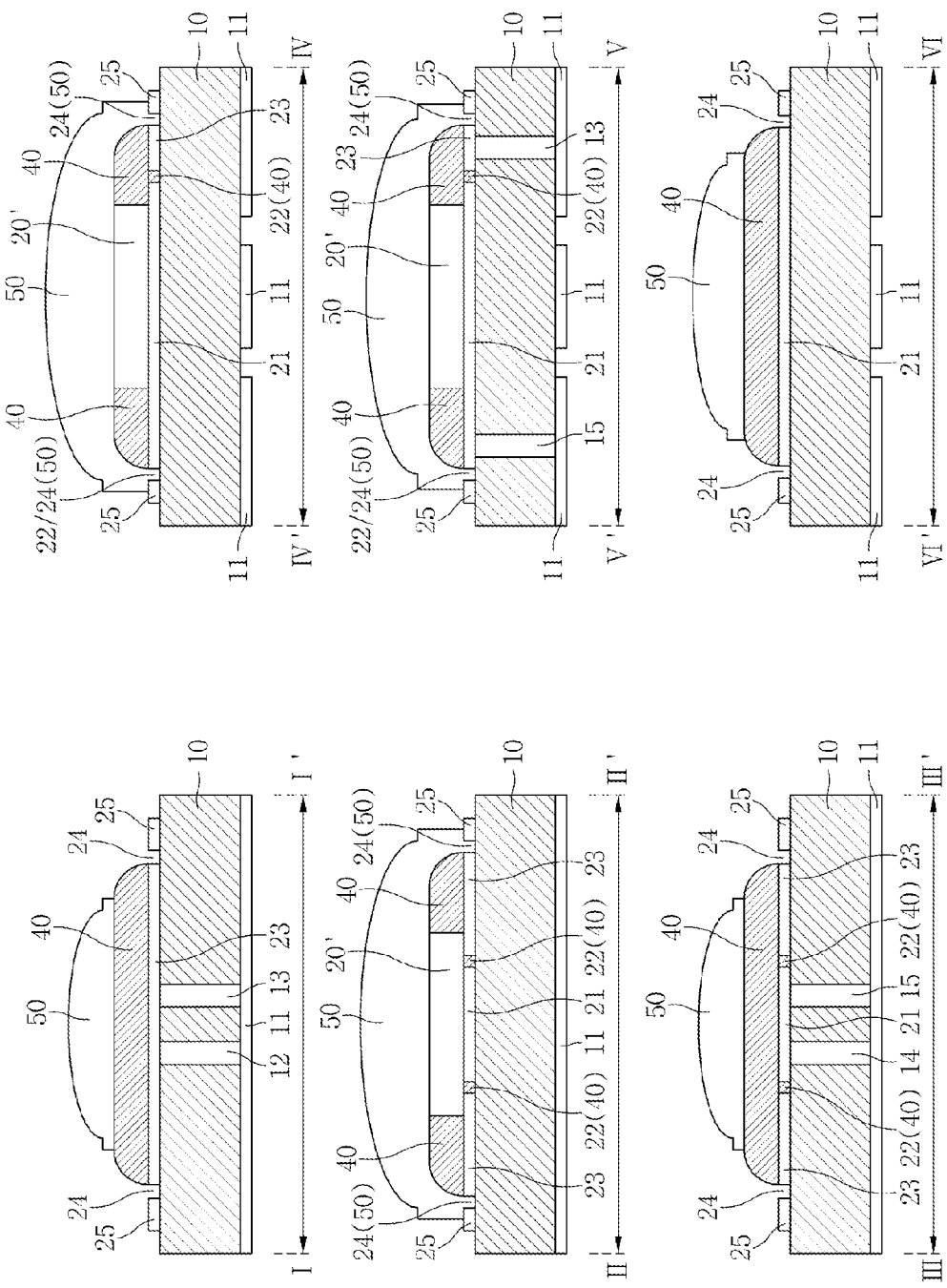
FIG. 8B shows cross-sectional views taken along lines I-I', II-II', III-III', IV-IV', V-V', and VI-VI' in FIG. 8A.

FIG. 8A is a top perspective view showing a flip-chip LED package structure in accordance with an embodiment of the inventive concept, and FIG. 8B shows cross-sectional views taken along lines I-I', II-II', III-III', IV-IV', V-V', and VI-VI' in FIG. 8A.

Referring to FIGS. 8A and 8B, a flip-chip LED package structure in accordance with an embodiment of the inventive concept may include a substrate 10, a first metal pattern 21, a second metal pattern 23, a third metal pattern 25, a first isolation line 22, a second isolation line 24, a lower pad 11, vias 12, 13, 14, and 15, a flip chip LED 20', a reflector 40, and a lens 50.

The substrate 10, the first metal pattern 21, the second metal pattern 23, the third metal pattern 25, the first isolation line 22, the second isolation line 24, the lower pad 11, and the vias 12, 13, 14, and 15 may be understood with reference to FIGS. 1A and 1B.

The flip chip LED 20' may be mounted on a chip mount region of the substrate 10, and each of chip electrodes may be connected to the first metal pattern 21 and the second metal pattern 23.

The reflector 40 may be formed on the second metal pattern 23 and the first metal pattern 21, and located at an outer side of the flip chip LED 20', and block light emitted from a side of the flip chip LED 20'. The reflector 40 may be formed to have a uniform thickness on the substrate 10. As an example, silicon resin in which a reflective material, such as $TiO_2$ or $Al_2O_3$, for forming the reflector 40 are mixed may be dispensed on the substrate 10, and the dispensed silicon resin may have a uniform thickness since the outermost surface tension of the second metal pattern 23 prevents out-diffusion of the dispended silicon resin. The reflector 40 may gap-fill the first isolation line 22 located below and at an outer side of the flip chip LED 20'.

The lens 50 may be formed on the substrate 10 and the flip chip LED 20', and diffuse light emitted from the flip chip LED 20' to the outside. As an example, the lens 50 may be formed in such a way that edge portions, e.g., both endings of each center line, of the lens 50 overlap the third metal pattern 25, and the second isolation line 24 may be overlapped by the lens 50 and be gap-filled with the same material as the lens 50.

Since the flip-chip LED package structure in accordance with an embodiment of the inventive concept may include the reflector 40 uniformly formed on the substrate 10 at an outer side of the flip chip LED 20', light efficiency of an LED device can increase, and reliability of a manufacturing process and a manufactured LED device can be improved.

Figure 9A:
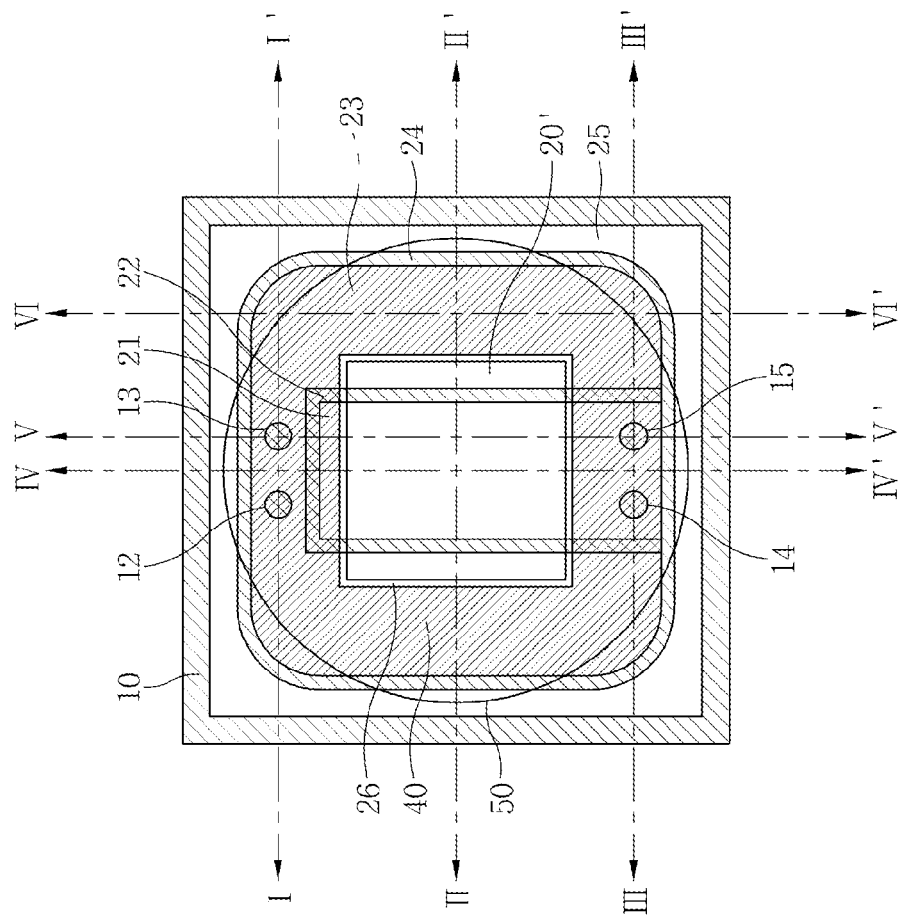
FIG. 9A is a top perspective view of a flip-chip LED package structure in accordance with an embodiment of the inventive concept.
Figure 9B:
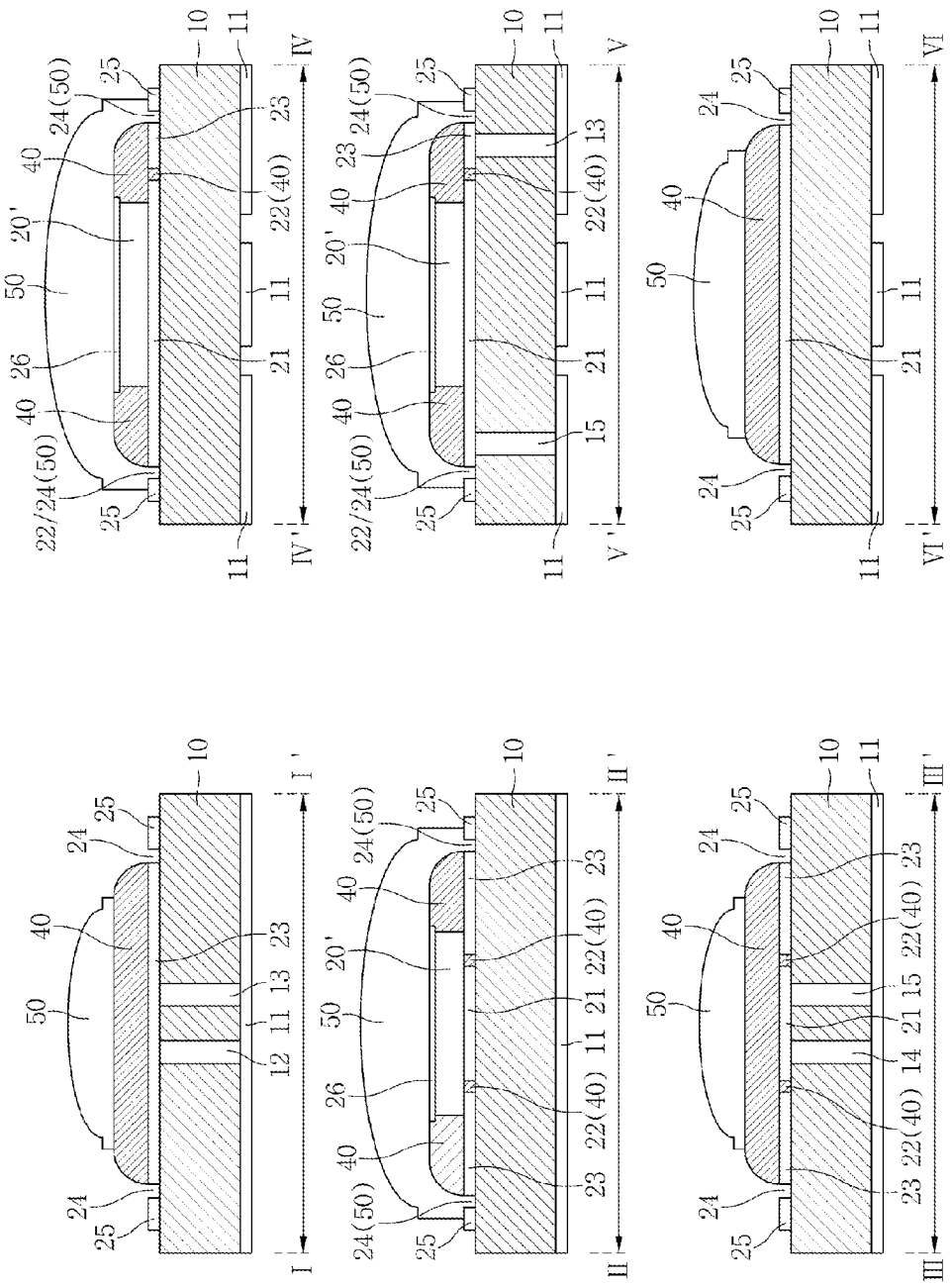
FIG. 9B shows cross-sectional views taken along lines I-I', II-II', III-III', IV-IV', V-V', and VI-VI' in FIG. 9A.

FIG. 9A is a top perspective view showing a flip-chip LED package structure in accordance with an embodiment of the inventive concept, and FIG. 9B shows cross-sectional views taken along lines I-I', II-II', III-III', IV-IV', V-V', and VI-VI' in FIG. 9A.

Referring to FIGS. 9A and 9B, a flip-chip LED package structure in accordance with an embodiment of the inventive concept may include a substrate 10, a first metal pattern 21, a second metal pattern 23, a third metal pattern 25, a first isolation line 22, a second isolation line 24, a lower pad 11, vias 12, 13, 14, and 15, a flip chip LED 20', a phosphor layer pad 26, a reflector 40, and a lens 50.

The substrate 10, the first metal pattern 21, the second metal pattern 23, the third metal pattern 25, the first isolation line 22, the second isolation line 24, the lower pad 11, the vias 12, 13, 14, and 15, the flip chip LED 20', the reflector 40, and the lens 50 may be understood with respect to FIGS. 8A and 8B.

The phosphor layer pad 26 which absorbs light emitted from the flip chip LED 20' and converts the light into light having a different wavelength to be emitted, may be formed on the flip chip LED 20'. The phosphor layer pad 26 may be formed to match up with or to be greater than an upper surface of the flip chip LED 20'. The phosphor layer pad 26 may be formed by attaching a phosphor sheet including a phosphor material. As an example, when the flip chip LED 20' emits a blue light, a white light LED which emits a white light may be formed in such a way that the phosphor layer pad 26 includes one of a yellow phosphor material, or both a green phosphor material and a red phosphor material.

Figure 10A:
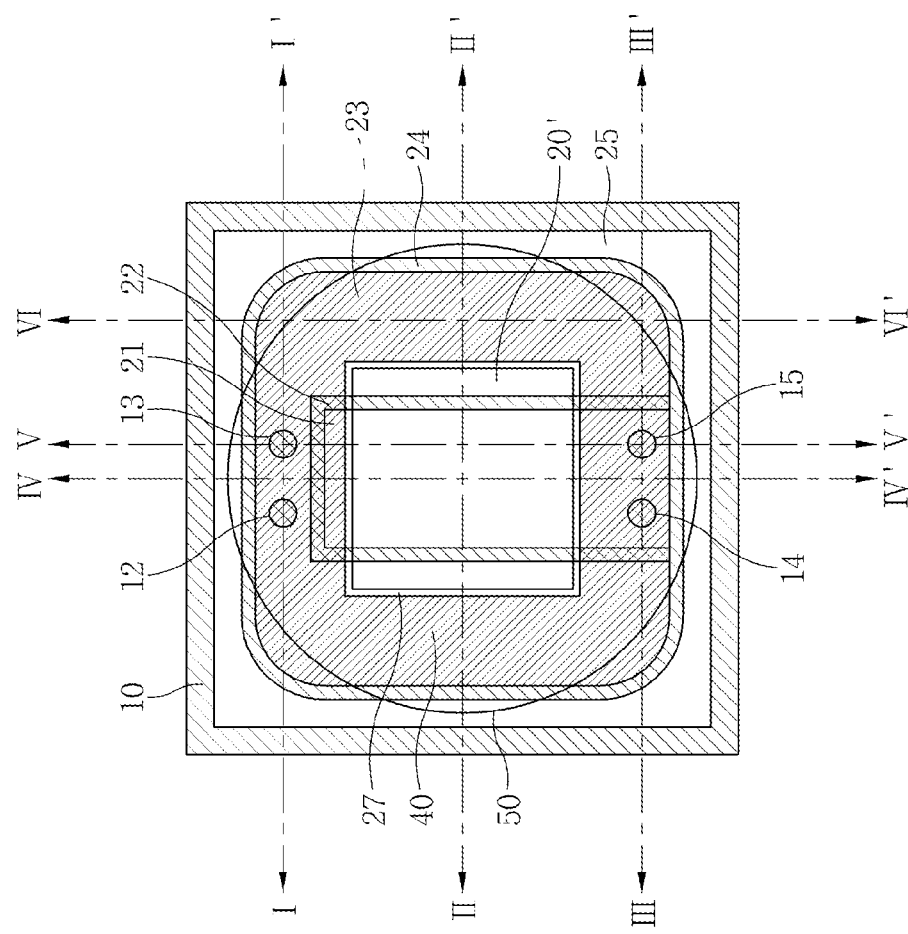
FIG. 10A is a top perspective view of a flip-chip LED package structure in accordance with an embodiment of the inventive concept.
Figure 10B:
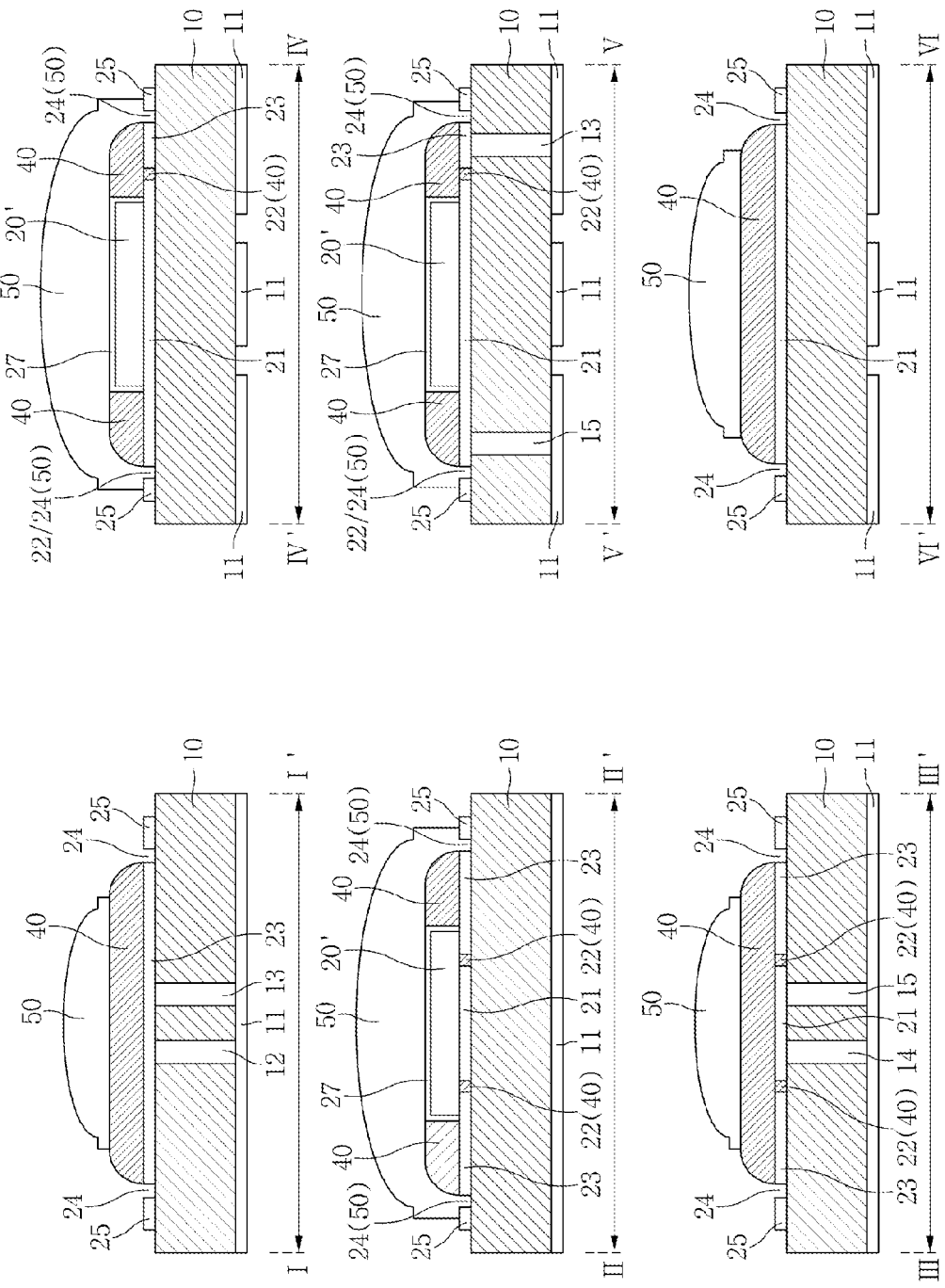
FIG. 10B shows cross-sectional views taken along lines I-I', II-II', III-III', IV-IV', V-V', and VI-VI' in FIG. 10A.

FIG. 10A is a top perspective view showing a flip-chip LED package structure in accordance with an embodiment of the inventive concept, and FIG. 10B shows cross-sectional views taken along lines I-I', II-II', III-III', IV-IV', V-V', and VI-VI' in FIG. 10A.

Referring to FIGS. 10A and 10B, a flip-chip LED package structure in accordance with an embodiment of the inventive concept may include a substrate 10, a first metal pattern 21, a second metal pattern 23, a third metal pattern 25, a first isolation line 22, a second isolation line 24, a lower pad 11, vias 12, 13, 14, and 15, a flip chip LED 20', a phosphor layer cap 27, a reflector 40, and a lens 50.

The substrate 10, the first metal pattern 21, the second metal pattern 23, the third metal pattern 25, the first isolation line 22, the second isolation line 24, the lower pad 11, the vias 12, 13, 14, and 15, the flip chip LED 20', the reflector 40, and the lens 50 may be understood with respect to FIGS. 8A and 8B.

The phosphor layer cap 27, which absorbs light emitted from the flip chip LED 20' and converts the light into light having a different wavelength to be emitted, may be formed on upper and side surfaces of the flip chip LED 20'. The phosphor layer cap 27 may be uniformly formed on the entire surface of the flip chip LED 20' using a conformal method.

Figure 11A:
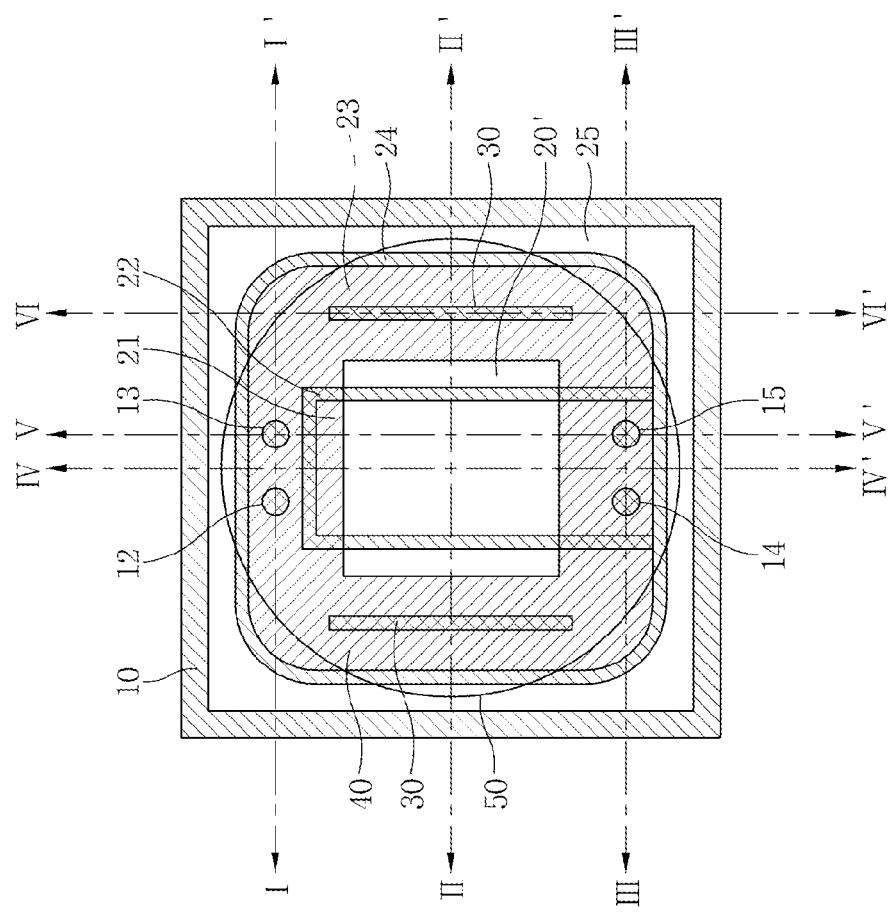
FIG. 11A is a top perspective view of a flip-chip LED package structure in accordance with an embodiment of the inventive concept.
Figure 11B:
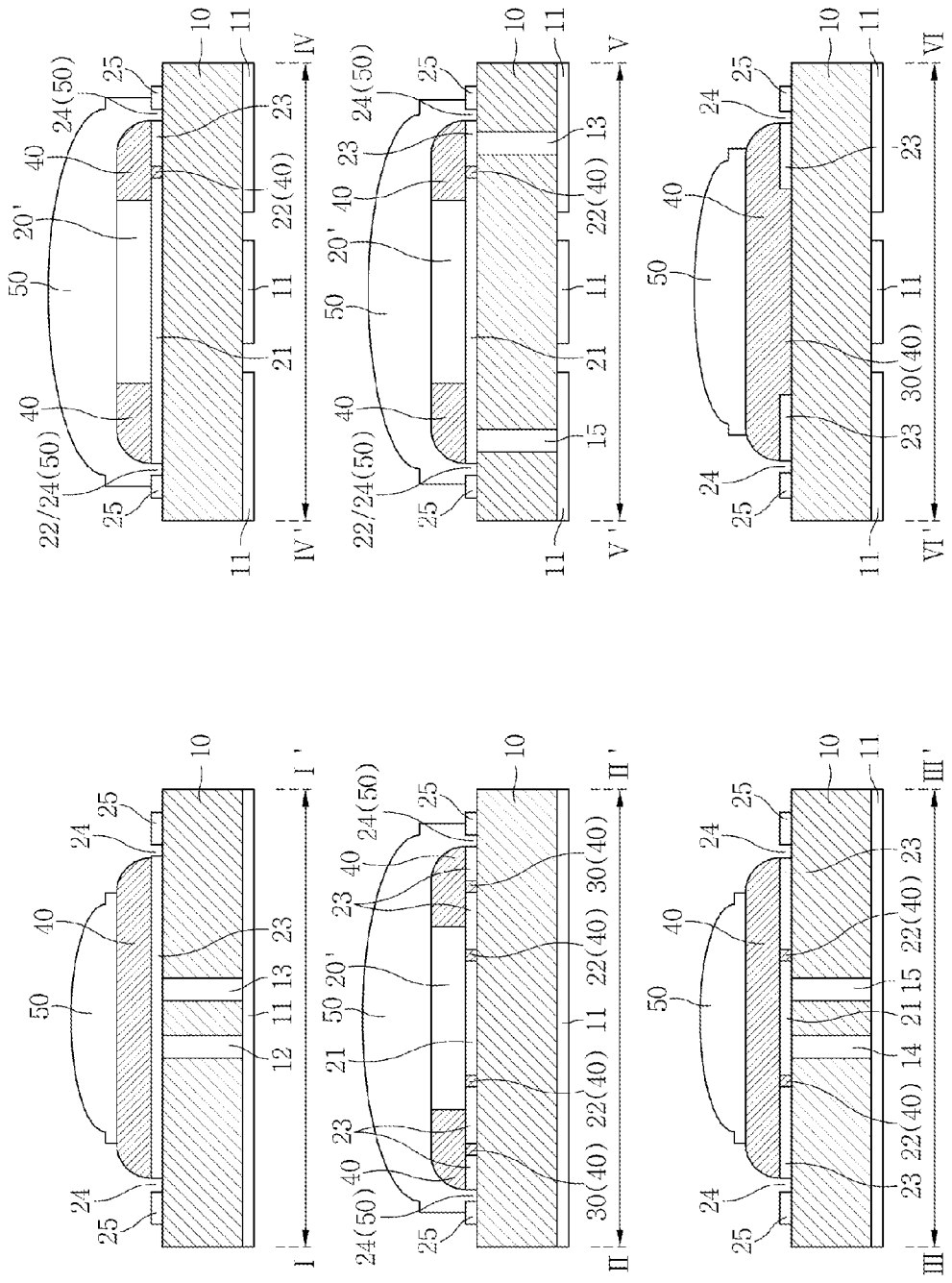
FIG. 11B shows cross-sectional views taken along lines I-I', II-II', III-III', IV-IV', V-V', and VI-VI' in FIG. 11A.

FIG. 11A is a top perspective view showing a flip-chip LED package structure in accordance with an embodiment of the inventive concept, and FIG. 11B shows cross-sectional views taken along lines I-I', II-II', III-III', IV-IV', V-V', and VI-VI' in FIG. 11A.

Referring to FIGS. 11A and 11B, a flip-chip LED package structure in accordance with an embodiment of the inventive concept may include a substrate 10, a first metal pattern 21, a second metal pattern 23, a third metal pattern 25, a first isolation line 22, a second isolation line 24, a slit 30, a lower pad 11, vias 12, 13, 14, and 15, a flip chip LED 20', a reflector 40, and a lens 50.

The substrate 10, the first metal pattern 21, the second metal pattern 23, the third metal pattern 25, the first isolation line 22, the second isolation line 24, the slit 30, the lower pad 11, and the vias 12, 13, 14, and 15 may be understood with reference to FIGS. 2A and 2B.

The flip chip LED 20', the reflector 40, and the lens 50 may be understood with reference to FIGS. 8A and 8B.

The slit 30 may be gap-filled by the reflector 40.

Figure 12A:
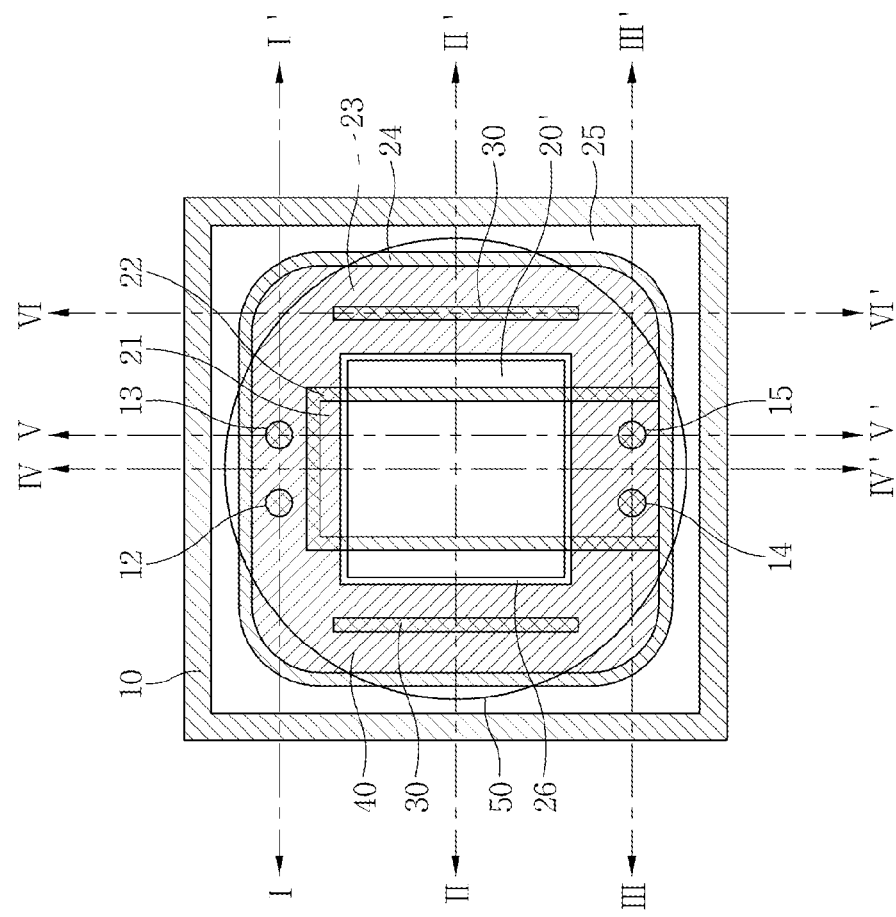
FIG. 12A is a top perspective view of a flip-chip LED package structure in accordance with an embodiment of the inventive concept.
Figure 12B:
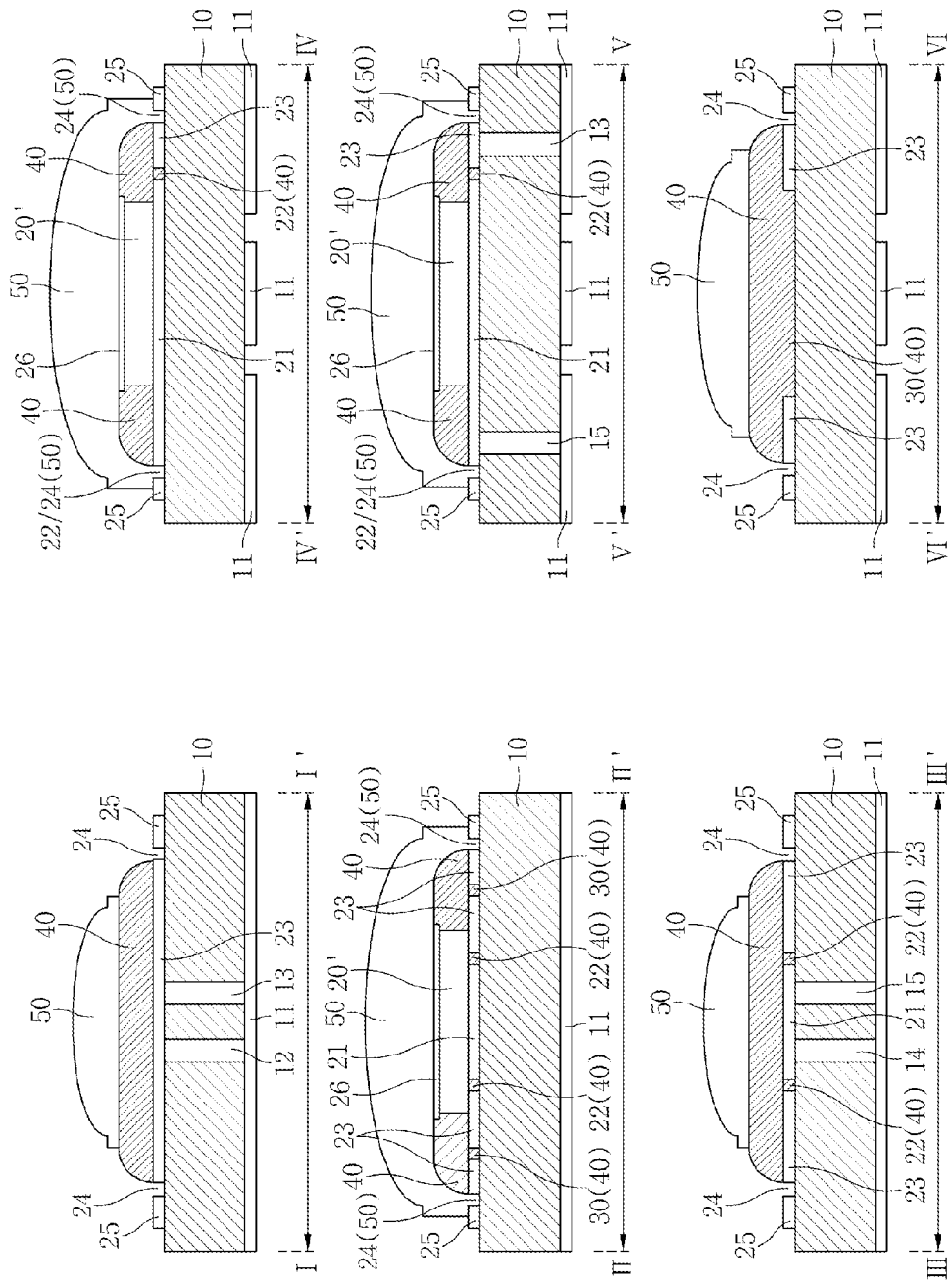
FIG. 12B shows cross-sectional views taken along lines I-I', II-II', III-III', IV-IV', V-V', and VI-VI' in FIG. 12A.

FIG. 12A is a top perspective view showing a flip-chip LED package structure in accordance with an embodiment of the inventive concept, and FIG. 12B shows cross-sectional views taken along lines I-I', II-II', III-III', IV-IV', V-V', and VI-VI' in FIG. 12A.

Referring to FIGS. 12A and 12B, a flip-chip LED package structure in accordance with an embodiment of the inventive concept may include a substrate 10, a first metal pattern 21, a second metal pattern 23, a third metal pattern 25, a first isolation line 22, a second isolation line 24, a slit 30, a lower pad 11, vias 12, 13, 14, and 15, a flip chip LED 20', a phosphor layer pad 26, a reflector 40, and a lens 50.

The substrate 10, the first metal pattern 21, the second metal pattern 23, the third metal pattern 25, the first isolation line 22, the second isolation line 24, the slit 30, the lower pad 11, the vias 12, 13, 14, and 15, the flip chip LED 20', the reflector 40, and the lens 50 may be understood with reference to FIGS. 11A and 11B.

The phosphor layer pad 26 may be understood with reference to FIGS. 9A and 9B.

Figure 13A:
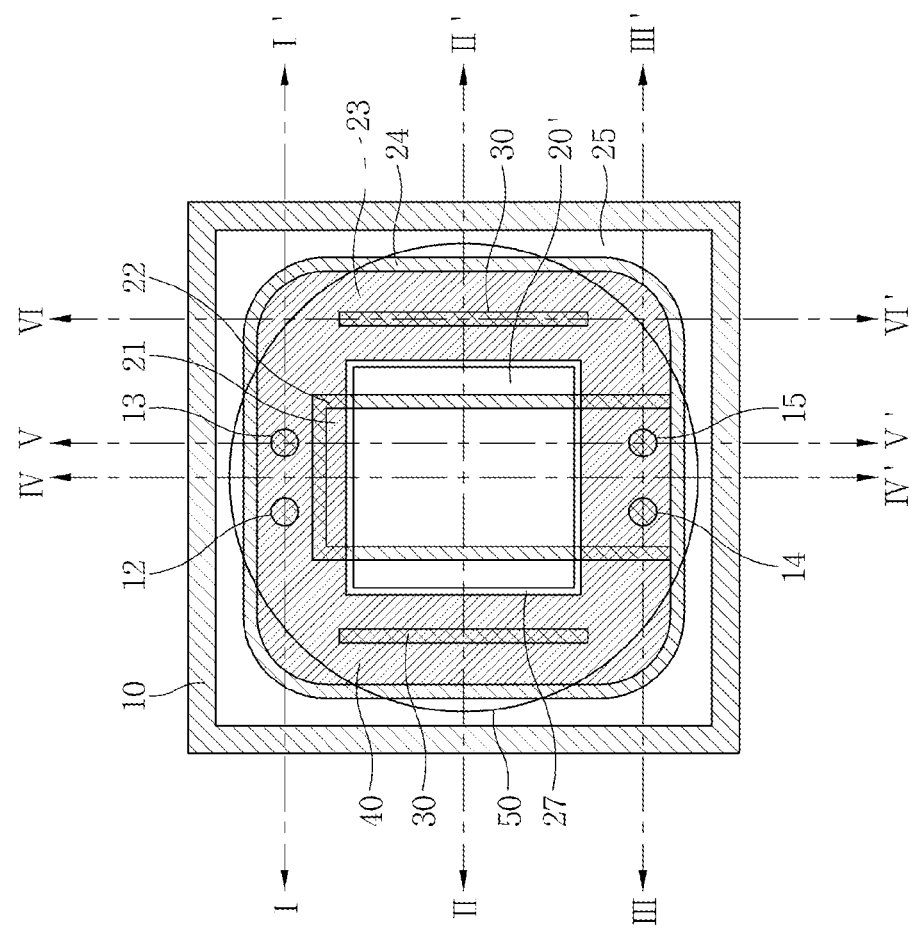
FIG. 13A is a top perspective view of a flip-chip LED package structure in accordance with an embodiment of the inventive concept.
Figure 13B:
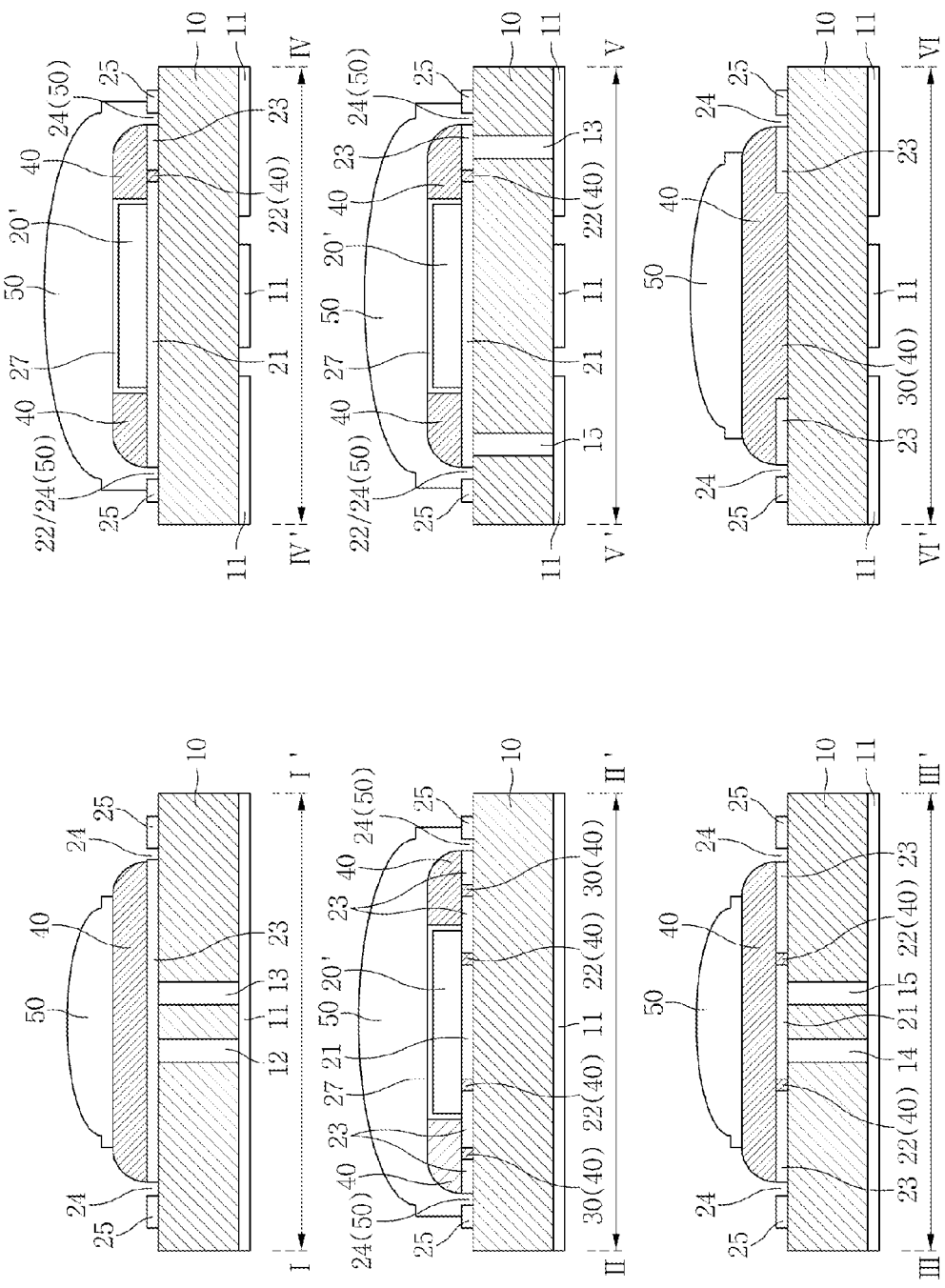
FIG. 13B shows cross-sectional views taken along lines I-I', II-II', III-III', IV-IV', V-V', and VI-VI' in FIG. 13A.

FIG. 13A is a top perspective view showing a flip-chip LED package structure in accordance with an embodiment of the inventive concept, and FIG. 13B shows cross-sectional views taken along lines I-I', II-II', III-III', IV-IV', V-V', and VI-VI' in FIG. 13A.

Referring to FIGS. 13A and 13B, a flip-chip LED package structure in accordance with an embodiment of the inventive concept may include a substrate 10, a first metal pattern 21, a second metal pattern 23, a third metal pattern 25, a first isolation line 22, a second isolation line 24, a slit 30, a lower pad 11, vias 12, 13, 14, and 15, a flip chip LED 20', a phosphor layer cap 27, a reflector 40, and a lens 50.

The substrate 10, the first metal pattern 21, the second metal pattern 23, the third metal pattern 25, the first isolation line 22, the second isolation line 24, the slit 30, the lower pad 11, the vias 12, 13, 14, and 15, the flip chip LED 20', the reflector 40, and the lens 50 may be understood with reference to FIGS. 11A and 11B.

The phosphor layer cap 27 may be understood with reference to FIGS. 10A and 10B.

Figure 14A:
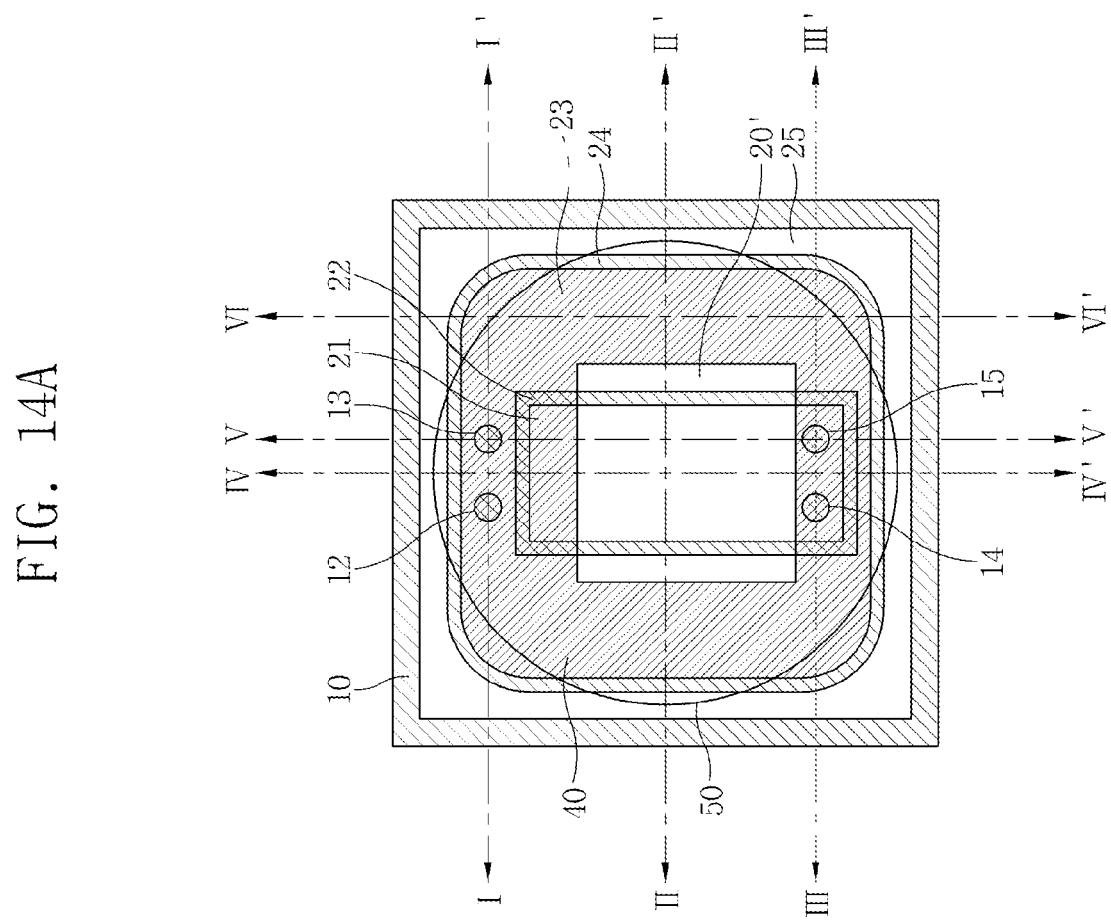
FIG. 14A is a top perspective view of a flip-chip LED package structure in accordance with an embodiment of the inventive concept.
Figure 14B:
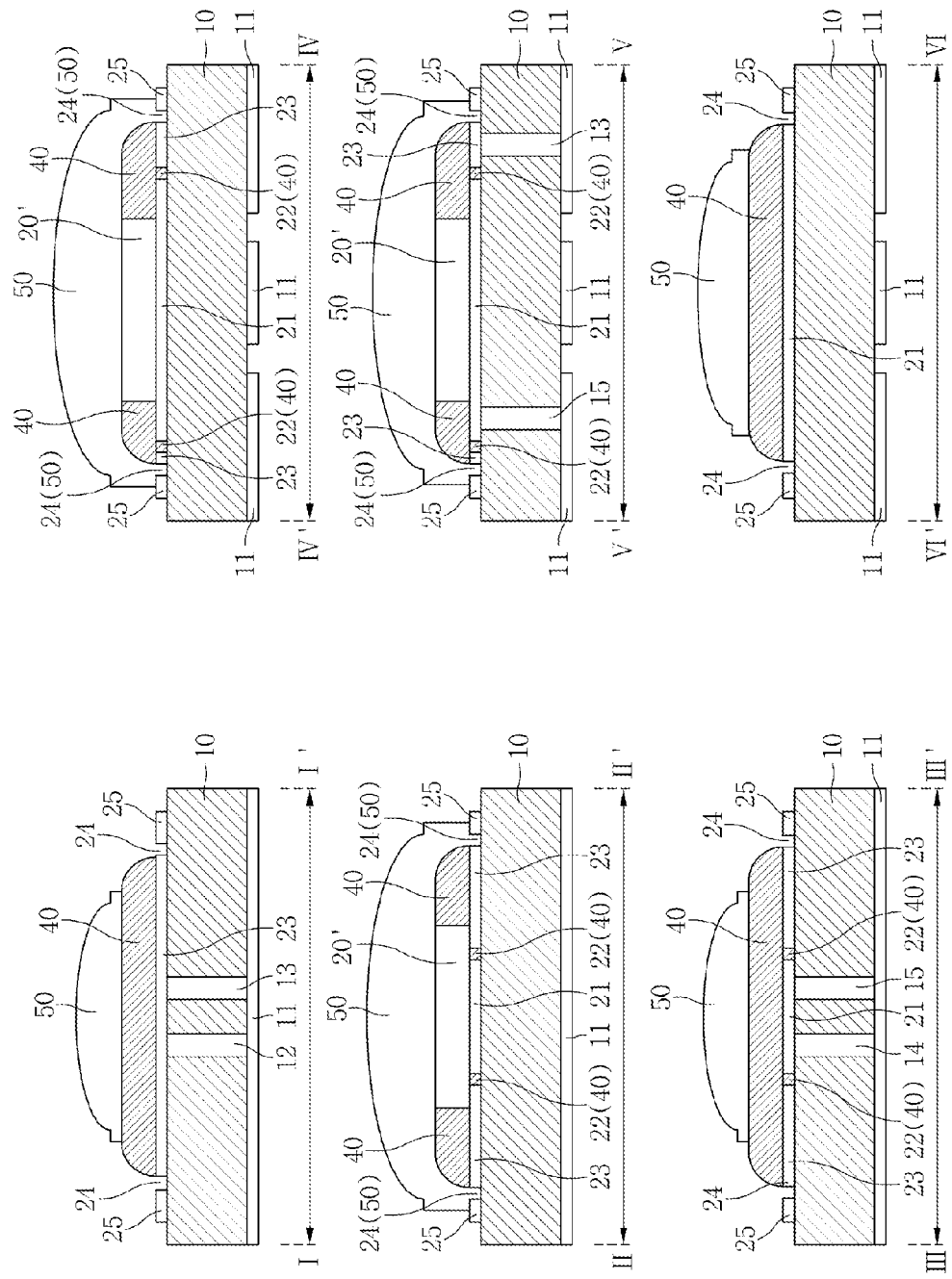
FIG. 14B shows cross-sectional views taken along lines I-I', II-II', III-III', IV-IV', V-V', and VI-VI' in FIG. 14A.

FIG. 14A is a top perspective view showing a flip-chip LED package structure in accordance with an embodiment of the inventive concept, and FIG. 14B shows cross-sectional views taken along lines I-I', II-II', III-III', IV-IV', V-V', and VI-VI' in FIG. 14A.

Referring to FIGS. 14A and 14B, a flip-chip LED package structure in accordance with an embodiment of the inventive concept may include a substrate 10, a first metal pattern 21, a second metal pattern 23, a third metal pattern 25, a first isolation line 22, a second isolation line 24, a lower pad 11, vias 12, 13, 14, and 15, a flip chip LED 20', a reflector 40, and a lens 50.

The substrate 10, the first metal pattern 21, the second metal pattern 23, the third metal pattern 25, the first isolation line 22, the second isolation line 24, the lower pad 11, and the vias 12, 13, 14, and 15 may be understood with reference to FIGS. 4A and 4B.

The flip chip LED 20', the reflector 40, and the lens 50 may be understood with reference to FIGS. 8A and 8B.

Figure 15A:
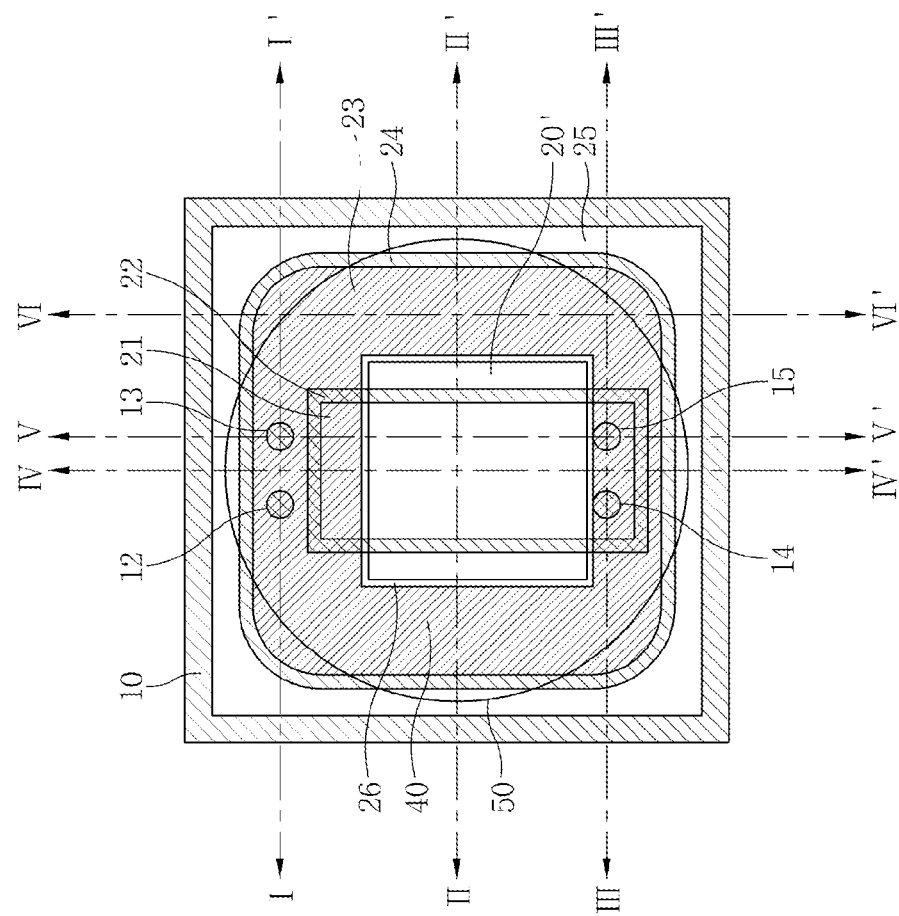
FIG. 15A is a top perspective view of a flip-chip LED package structure in accordance with an embodiment of the inventive concept.
Figure 15B:
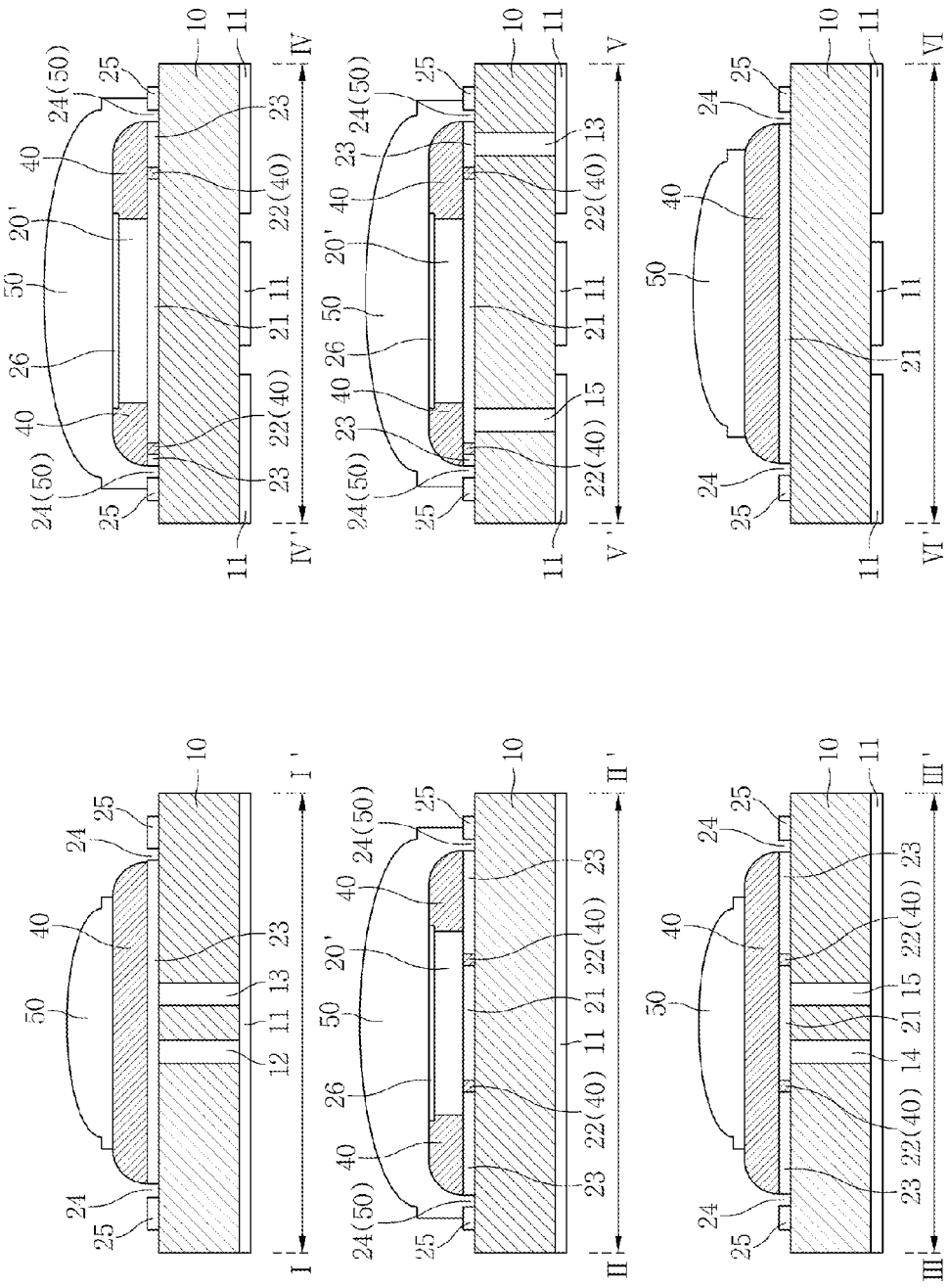
FIG. 15B shows cross-sectional views taken along lines I-I', II-II', III-III', IV-IV', V-V', and VI-VI' in FIG. 15A.

FIG. 15A is a top perspective view showing a flip-chip LED package structure in accordance with an embodiment of the inventive concept, and FIG. 15B shows cross-sectional views taken along lines I-I', II-II', III-III', IV-IV', V-V', and VI-VI' in FIG. 15A.

Referring to FIGS. 15A and 15B, a flip-chip LED package structure in accordance with an embodiment of the inventive concept may include a substrate 10, a first metal pattern 21, a second metal pattern 23, a third metal pattern 25, a first isolation line 22, a second isolation line 24, a lower pad 11, vias 12, 13, 14, and 15, a flip chip LED 20', a phosphor layer pad 26, a reflector 40, and a lens 50.

The substrate 10, the first metal pattern 21, the second metal pattern 23, the third metal pattern 25, the first isolation line 22, the second isolation line 24, the lower pad 11, the vias 12, 13, 14, and 15, the flip chip LED 20', the reflector 40, and the lens 50 may be understood with reference to FIGS. 14A and 14B.

The phosphor layer pad 26 may be understood with reference to FIGS. 9A and 9B.

Figure 16A:
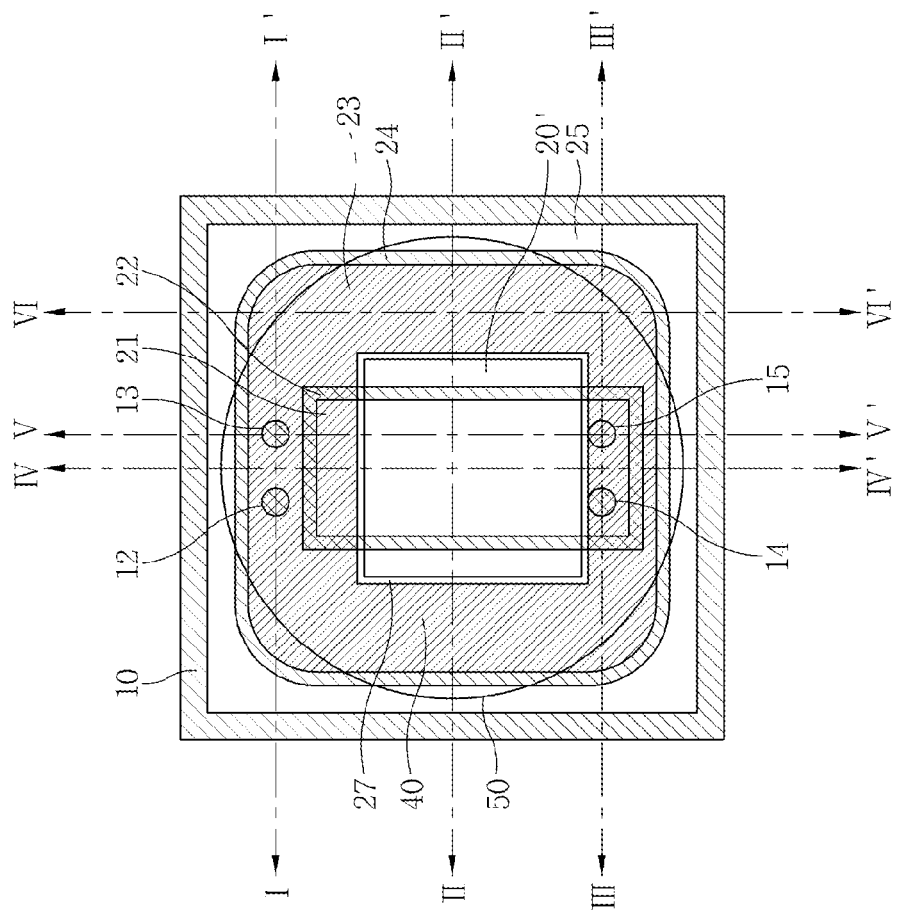
FIG. 16A is a top perspective view of a flip-chip LED package structure in accordance with an embodiment of the inventive concept.
Figure 16B:
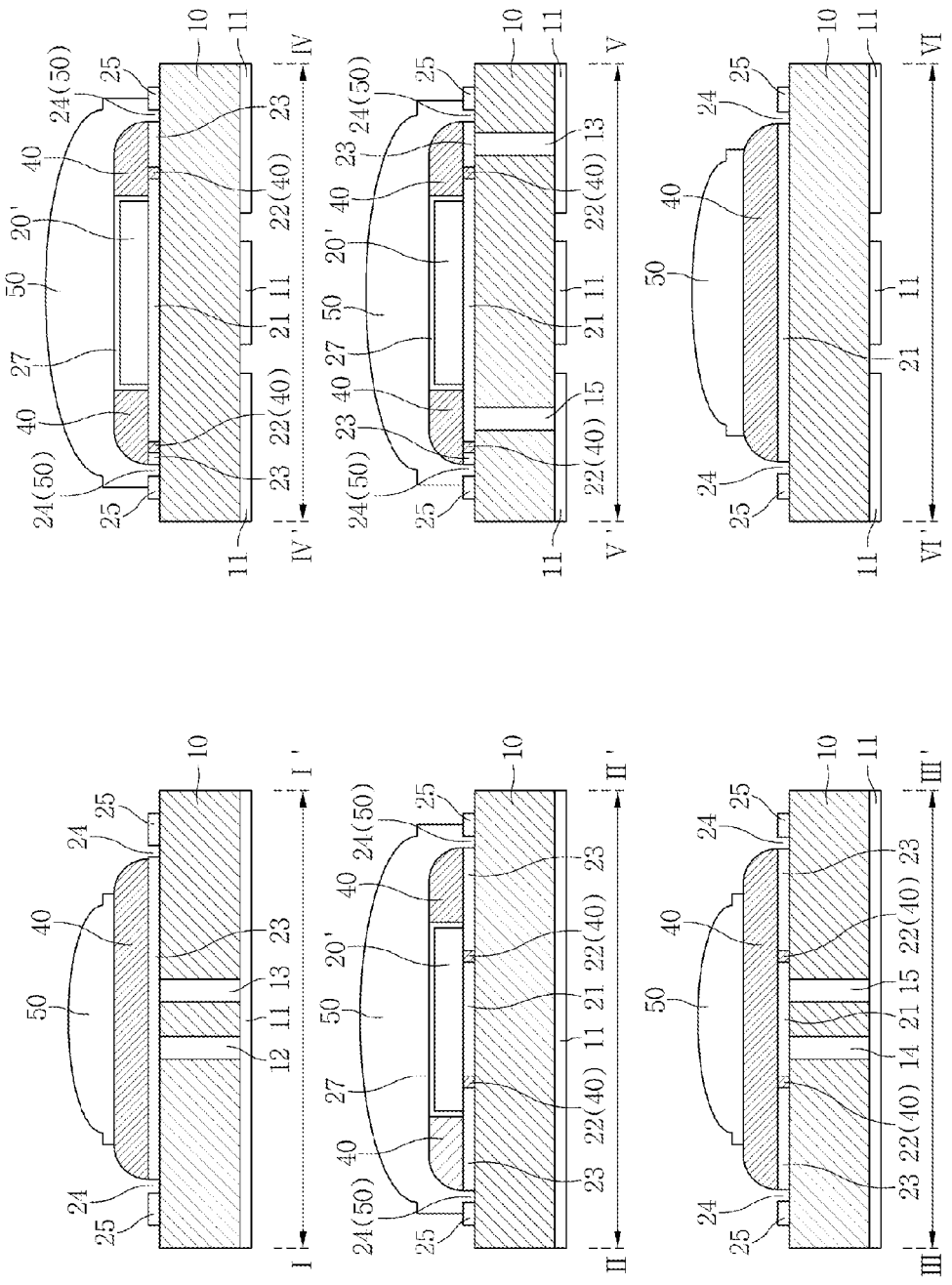
FIG. 16B shows cross-sectional views taken along lines I-I', II-II', III-III', IV-IV', V-V', and VI-VI' in FIG. 16A.

FIG. 16A is a top perspective view showing a flip-chip LED package structure in accordance with an embodiment of the inventive concept, and FIG. 16B shows cross-sectional views taken along lines I-I', II-II', III-III', IV-IV', V-V', and VI-VI' in FIG. 16A.

Referring to FIGS. 16A and 16B, a flip-chip LED package structure in accordance with an embodiment of the inventive concept may include a substrate 10, a first metal pattern 21, a second metal pattern 23, a third metal pattern 25, a first isolation line 22, a second isolation line 24, a lower pad 11, vias 12, 13, 14, and 15, a flip chip LED 20', a phosphor layer cap 27, a reflector 40, and a lens 50.

The substrate 10, the first metal pattern 21, the second metal pattern 23, the third metal pattern 25, the first isolation line 22, the second isolation line 24, the lower pad 11, the vias 12, 13, 14, and 15, the flip chip LED 20', the reflector 40, and the lens 50 may be understood with reference to FIGS. 14A and 14B.

The phosphor layer cap 27 may be understood with reference to FIGS. 10A and 10B.

Figure 17A:
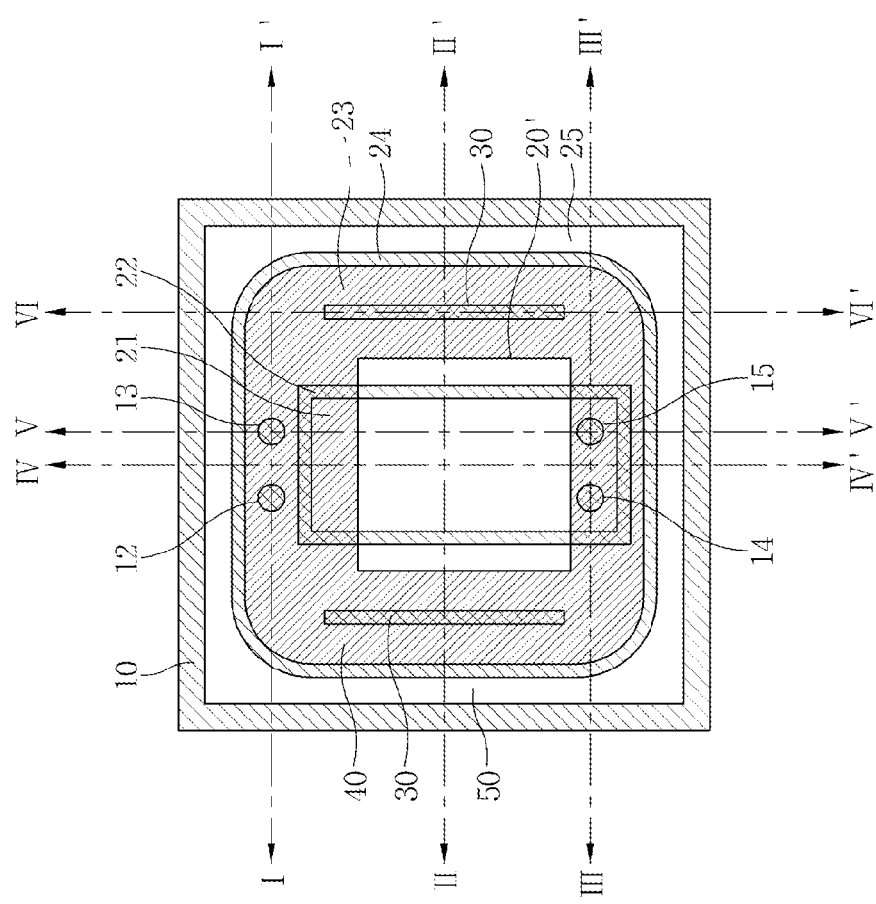
FIG. 17A is a top perspective view of a flip-chip LED package structure in accordance with an embodiment of the inventive concept.
Figure 17B:
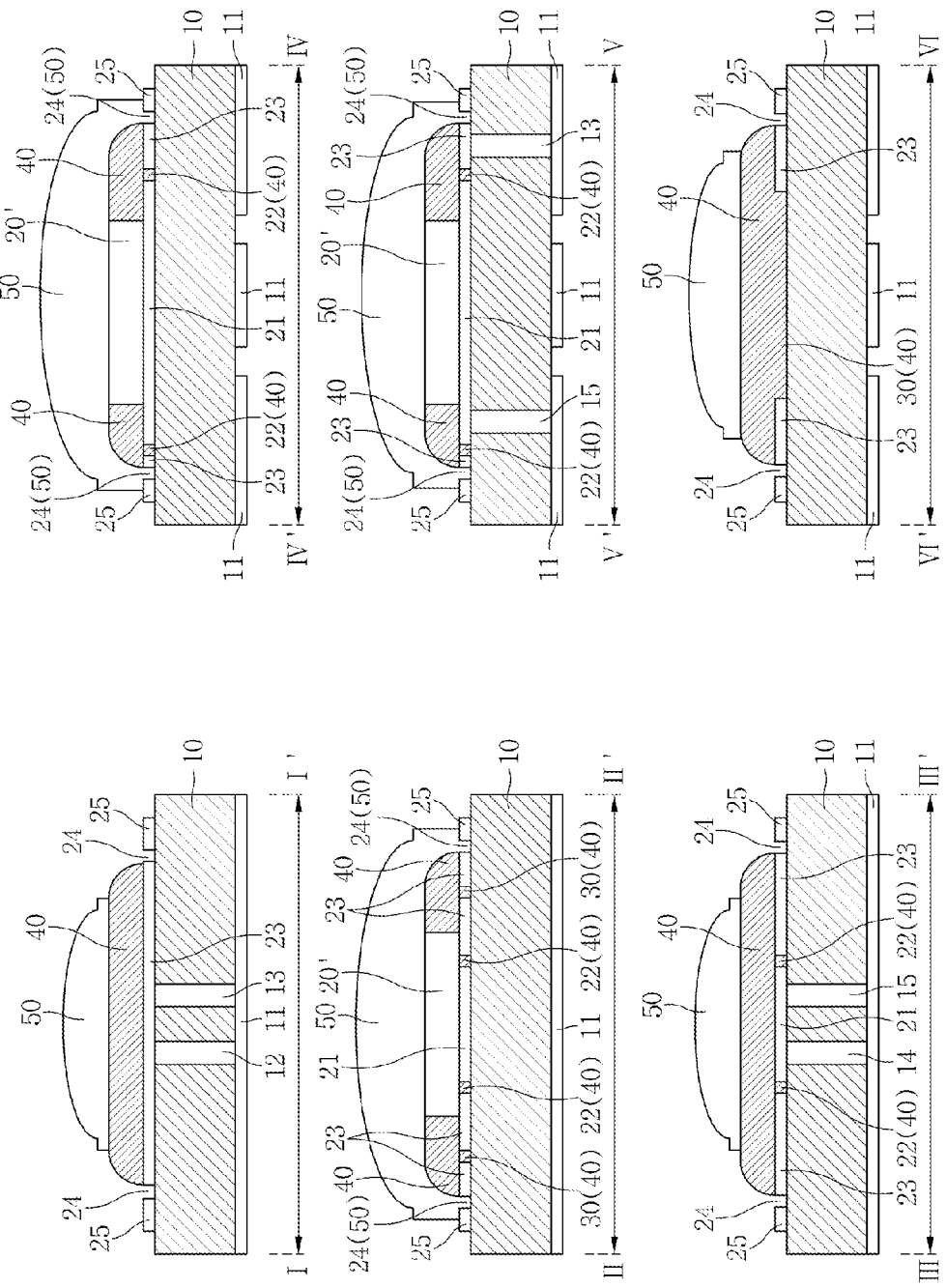
FIG. 17B shows cross-sectional views taken along lines I-I', II-II', III-III', IV-IV', V-V', and VI-VI' in FIG. 17A.

FIG. 17A is a top perspective view showing a flip-chip LED package structure in accordance with an embodiment of the inventive concept, and FIG. 17B shows cross-sectional views taken along lines I-I', II-II', III-III', IV-IV', V-V', and VI-VI' in FIG. 17A.

Referring to FIGS. 17A and 17B, a flip-chip LED package structure in accordance with an embodiment of the inventive concept may include a substrate 10, a first metal pattern 21, a second metal pattern 23, a third metal pattern 25, a first isolation line 22, a second isolation line 24, a slit 30, a lower pad 11, vias 12, 13, 14, and 15, a flip chip LED 20', a reflector 40, and a lens 50.

The substrate 10, the first metal pattern 21, the second metal pattern 23, the third metal pattern 25, the first isolation line 22, the second isolation line 24, the lower pad 11, and the vias 12, 13, 14, and 15 may be understood with reference to FIGS. 5A and 5B.

The slit 30, the flip chip LED 20', the reflector 40, and the lens 50 may be understood with reference to FIGS. 11A and 11B.

Figure 18A:
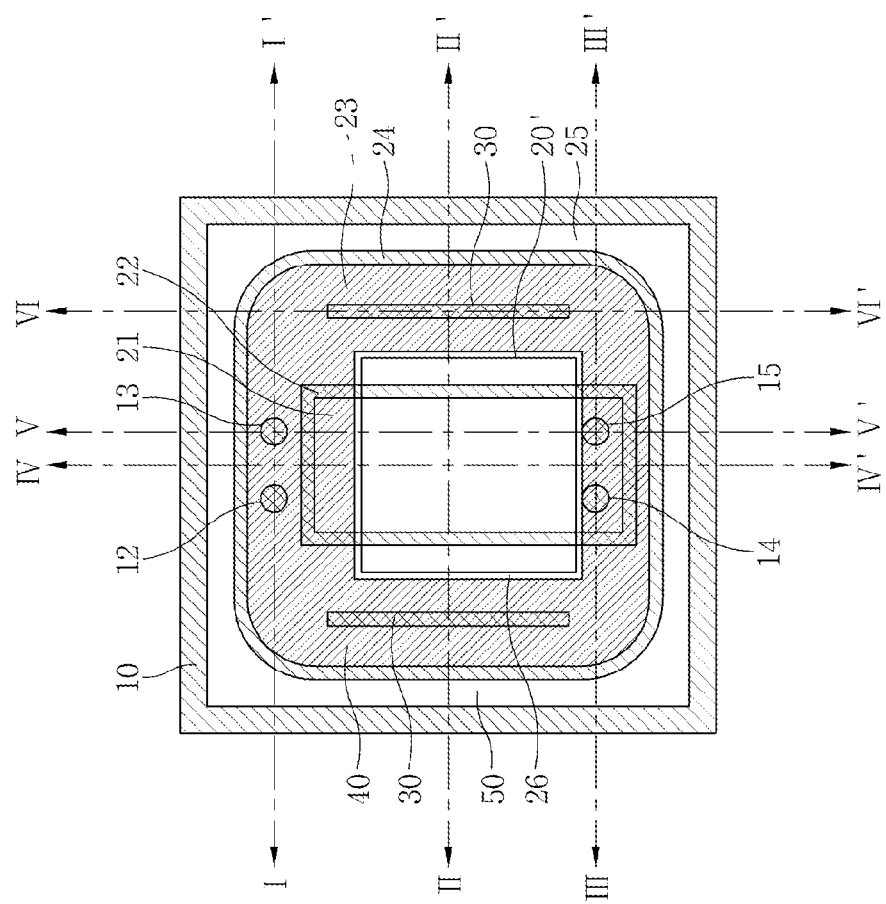
FIG. 18A is a top perspective view of a flip-chip LED package structure in accordance with an embodiment of the inventive concept.
Figure 18B:
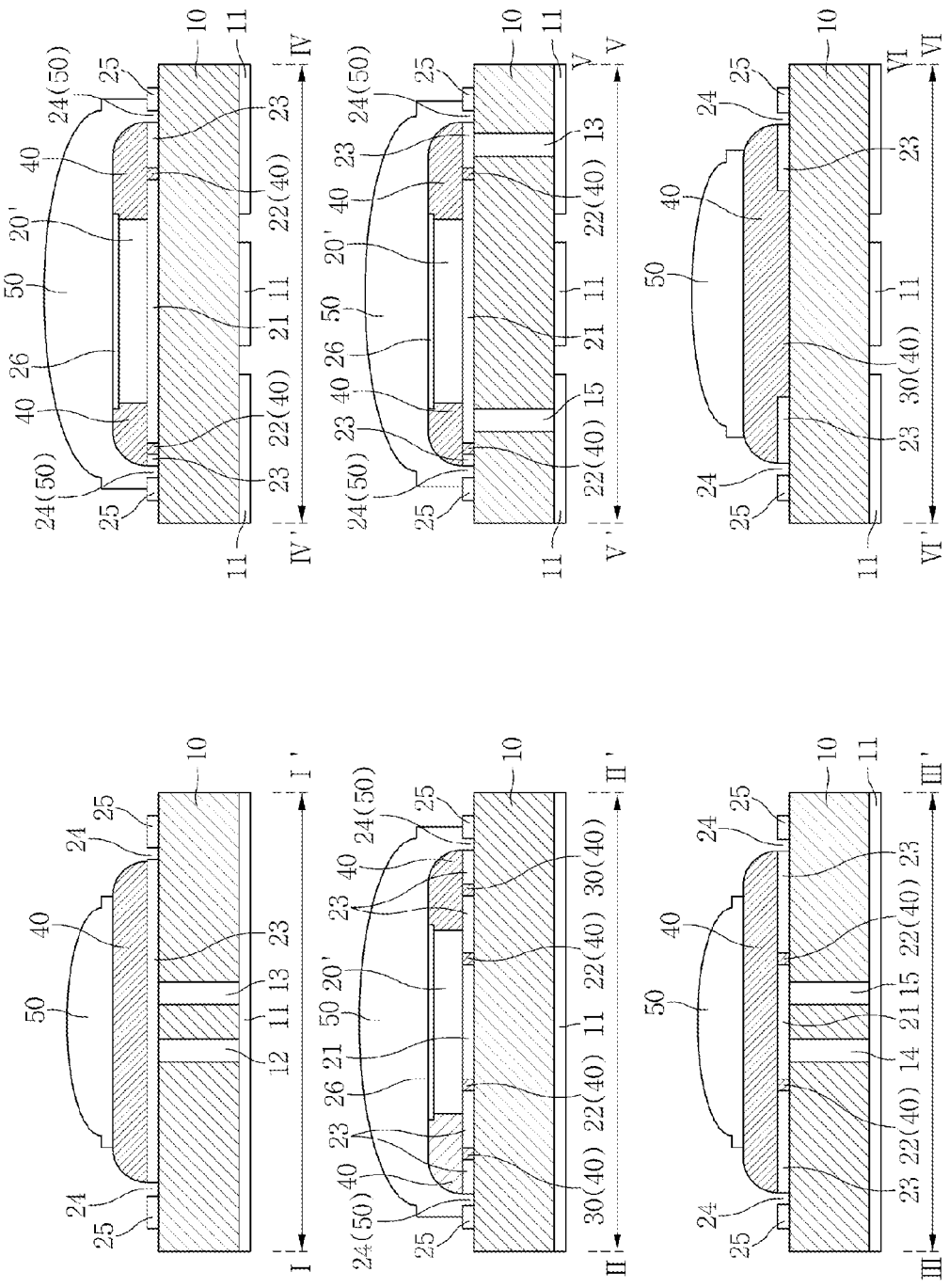
FIG. 18B shows cross-sectional views taken along lines I-I', II-II', III-III', IV-IV', V-V', and VI-VI' in FIG. 18A.

FIG. 18A is a top perspective view showing a flip-chip LED package structure in accordance with an embodiment of the inventive concept, and FIG. 18B shows cross-sectional views taken along lines I-I', II-II', III-III', IV-IV', V-V', and VI-VI' in FIG. 18A.

Referring to FIGS. 18A and 18B, a flip-chip LED package structure in accordance with an embodiment of the inventive concept may include a substrate 10, a first metal pattern 21, a second metal pattern 23, a third metal pattern 25, a first isolation line 22, a second isolation line 24, a slit 30, a lower pad 11, vias 12, 13, 14, and 15, a flip chip LED 20', a phosphor layer pad 26, a reflector 40, and a lens 50.

The substrate 10, the first metal pattern 21, the second metal pattern 23, the third metal pattern 25, the first isolation line 22, the second isolation line 24, the slit 30, the lower pad 11, the vias 12, 13, 14, and 15, the flip chip LED 20', the reflector 40, and the lens 50 may be understood with reference to FIGS. 17A and 17B.

The phosphor layer pad 26 may be understood with reference to FIGS. 9A and 9B.

Figure 19A:
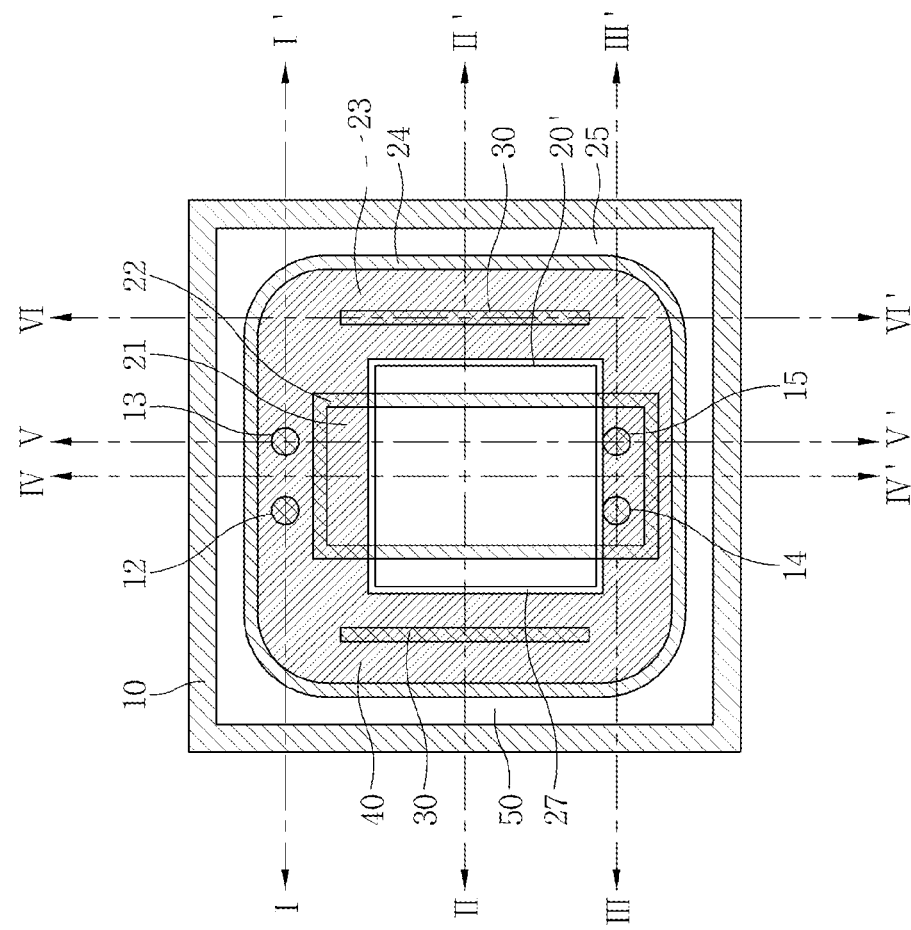
FIG. 19A is a top perspective view of a flip-chip LED package structure in accordance with an embodiment of the inventive concept.
Figure 19B:
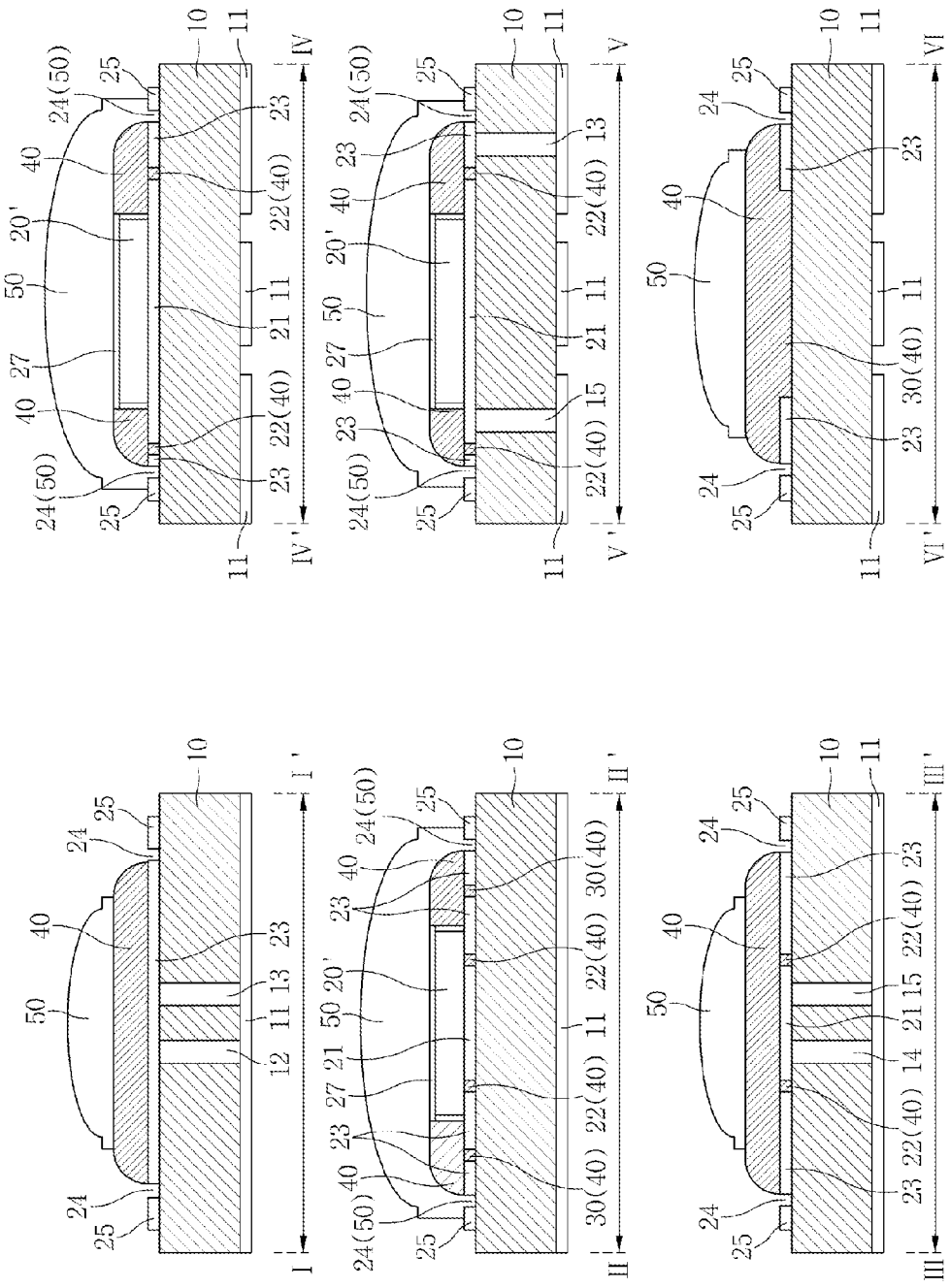
FIG. 19B shows cross-sectional views taken along lines I-I', II-II', III-III', IV-IV', V-V', and VI-VI' in FIG. 19A.

FIG. 19A is a top perspective view showing a flip-chip LED package structure in accordance with an embodiment of the inventive concept, and FIG. 19B shows cross-sectional views taken along lines I-I', II-II', III-III', IV-IV', V-V', and VI-VI' in FIG. 19A.

Referring to FIGS. 19A and 19B, a flip-chip LED package structure in accordance with an embodiment of the inventive concept may include a substrate 10, a first metal pattern 21, a second metal pattern 23, a third metal pattern 25, a first isolation line 22, a second isolation line 24, a slit 30, a lower pad 11, vias 12, 13, 14, and 15, a flip chip LED 20', a phosphor layer cap 27, a reflector 40, and a lens 50.

The substrate 10, the first metal pattern 21, the second metal pattern 23, the third metal pattern 25, the first isolation line 22, the second isolation line 24, the slit 30, the lower pad 11, the vias 12, 13, 14, and 15, the flip chip LED 20', the reflector 40, and the lens 50 may be understood with reference to FIGS. 17A and 17B.

The phosphor layer cap 27 may be understood with reference to FIGS. 10A and 10B.

Figure 20A:
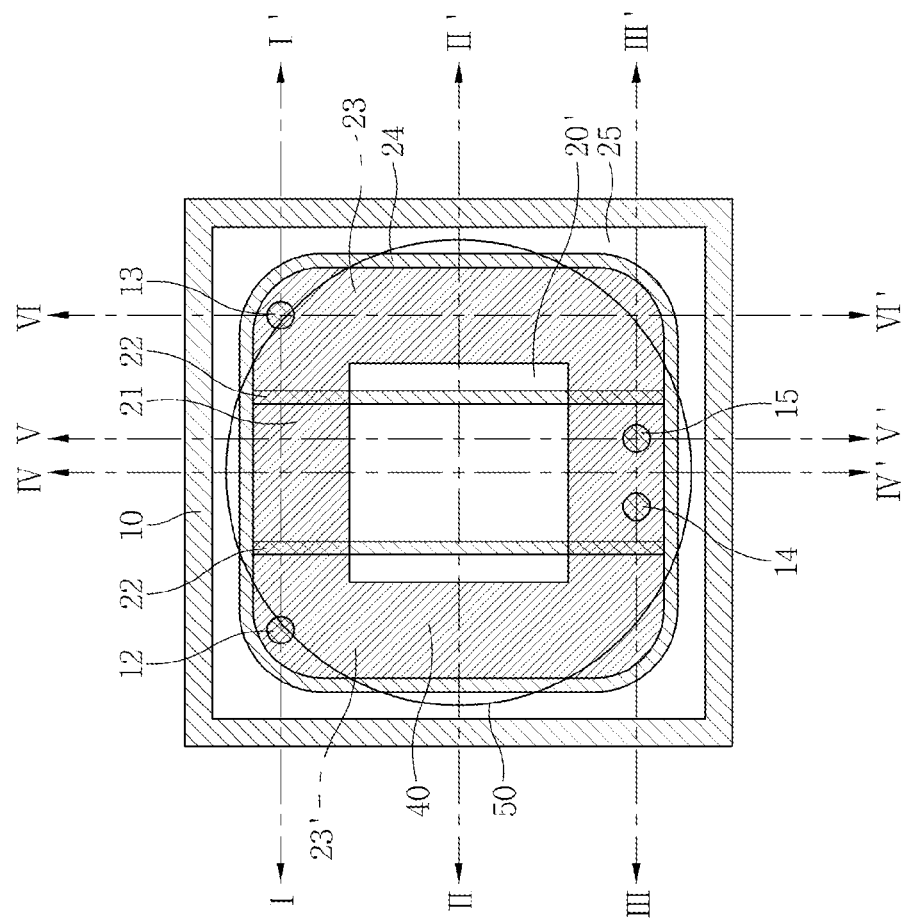
FIG. 20A is a top perspective view of a flip-chip LED package structure in accordance with an embodiment of the inventive concept.
Figure 20B:
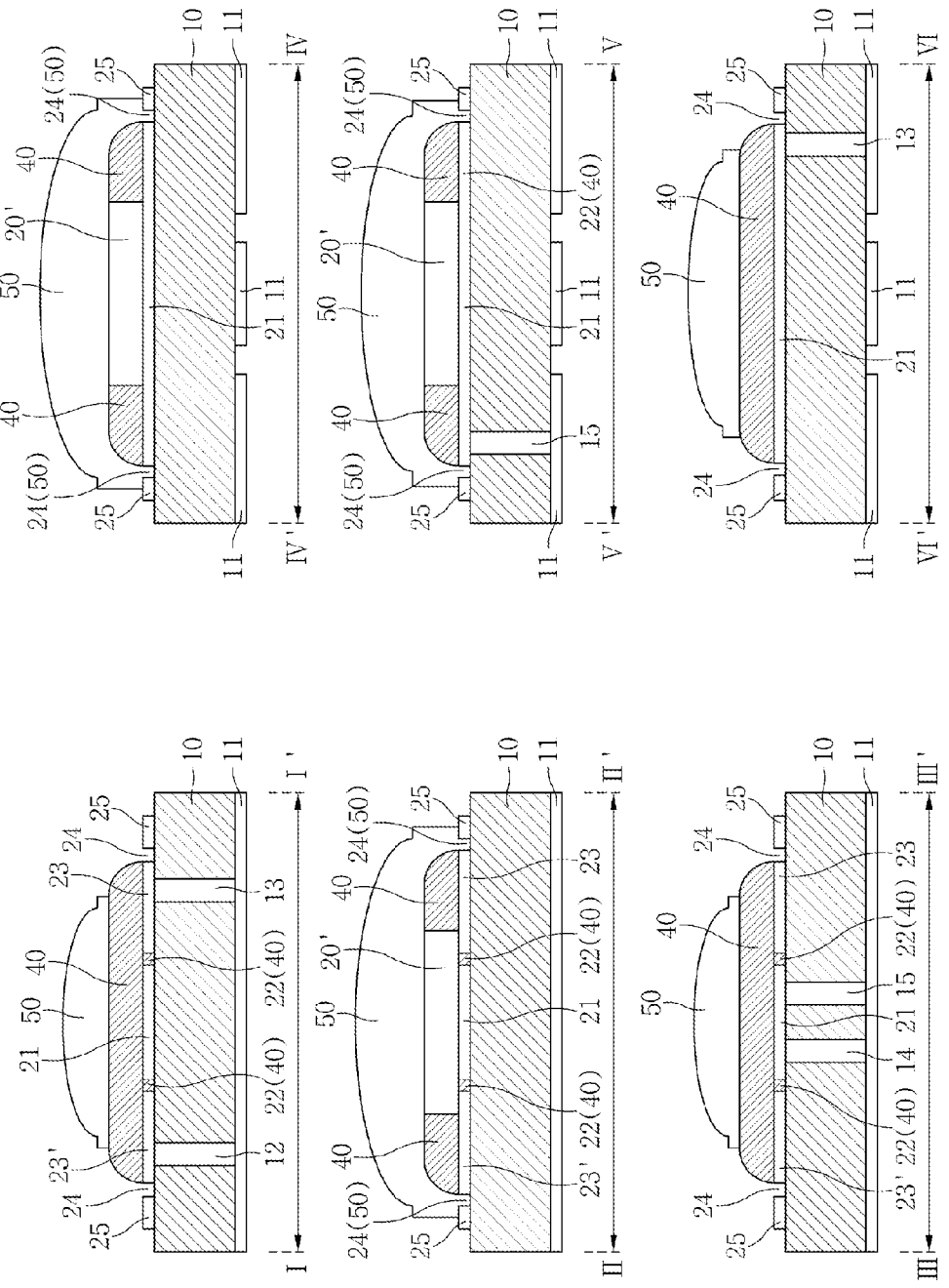
FIG. 20B shows cross-sectional views taken along lines I-I', II-II', III-III', IV-IV', V-V', and VI-VI' in FIG. 20A.

FIG. 20A is a top perspective view showing a flip-chip LED package structure in accordance with an embodiment of the inventive concept, and FIG. 20B shows cross-sectional views taken along lines I-I', II-II', III-III', IV-IV', V-V', and VI-VI' in FIG. 20A.

Referring to FIGS. 20A and 20B, a flip-chip LED package structure in accordance with an embodiment of the inventive concept may include a substrate 10, a first metal pattern 21, a second metal patterns 23 and 23', a third metal pattern 25, a first isolation line 22, a second isolation line 24, a lower pad 11, vias 12, 13, 14, and 15, a flip chip LED 20', a reflector 40, and a lens 50.

The substrate 10, the first metal pattern 21, the second metal patterns 23 and 23', the third metal pattern 25, the first isolation line 22, the second isolation line 24, the lower pad 11, and the vias 12, 13, 14, and 15 may be understood with reference to FIGS. 6A and 6B.

The flip chip LED 20', the reflector 40, and the lens 50 may be understood with reference to FIGS. 8A and 8B.

Figure 21A:
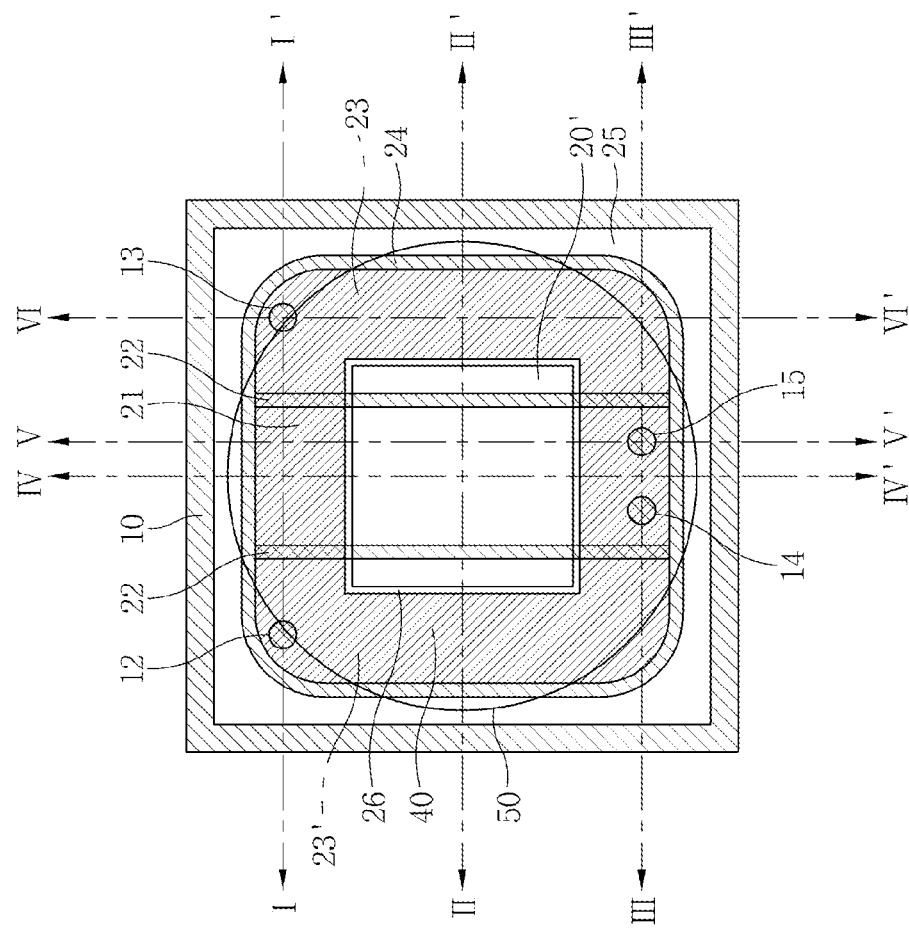
FIG. 21A is a top perspective view of a flip-chip LED package structure in accordance with an embodiment of the inventive concept.
Figure 21B:
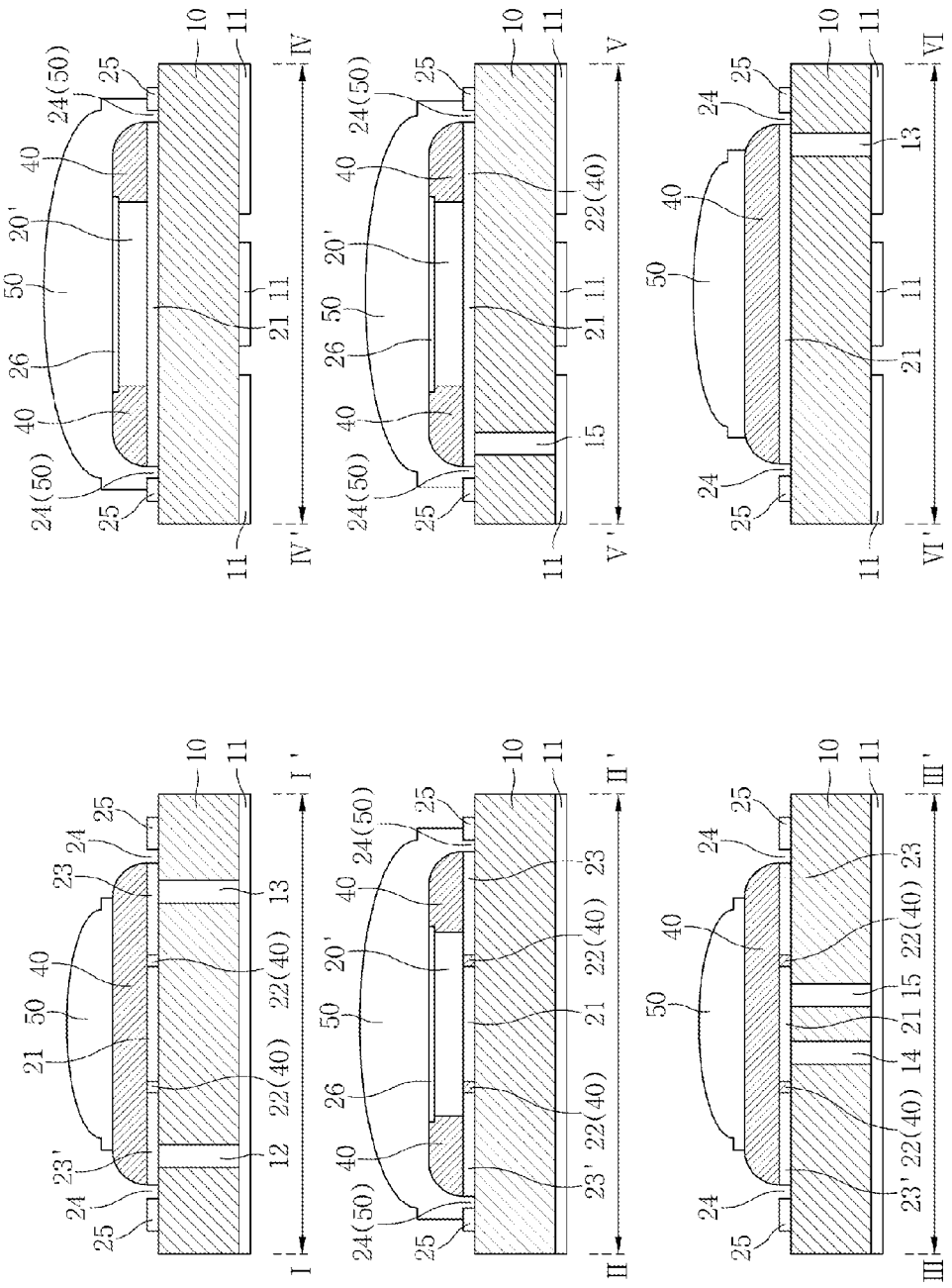
FIG. 21B shows cross-sectional views taken along lines I-I', II-II', III-III', IV-IV', V-V', and VI-VI' in FIG. 21A.

FIG. 21A is a top perspective view showing a flip-chip LED package structure in accordance with an embodiment of the inventive concept, and FIG. 21B shows cross-sectional views taken along lines I-I', II-II', III-III', IV-IV', V-V', and VI-VI' in FIG. 21A.

Referring to FIGS. 21A and 21B, a flip-chip LED package structure in accordance with an embodiment of the inventive concept may include a substrate 10, a first metal pattern 21, a second metal patterns 23 and 23', a third metal pattern 25, a first isolation line 22, a second isolation line 24, a lower pad 11, vias 12, 13, 14, and 15, a flip chip LED 20', a phosphor layer pad 26, a reflector 40, and a lens 50.

The substrate 10, the first metal pattern 21, the second metal patterns 23 and 23', the third metal pattern 25, the first isolation line 22, the second isolation line 24, the lower pad 11, the vias 12, 13, 14, and 15, the flip chip LED 20', the reflector 40, and the lens 50 may be understood with reference to FIGS. 20A and 20B.

The phosphor layer pad 26 may be understood with reference to FIGS. 9A and 9B.

Figure 22A:
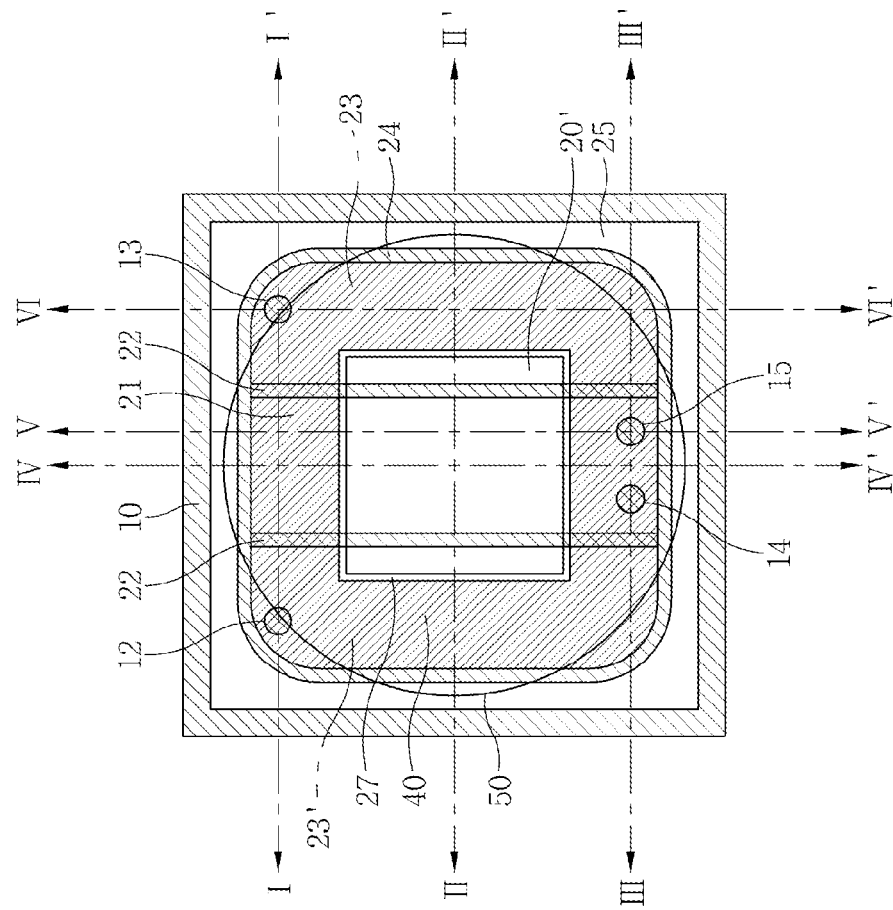
FIG. 22A is a top perspective view of a flip-chip LED package structure in accordance with an embodiment of the inventive concept.
Figure 22B:
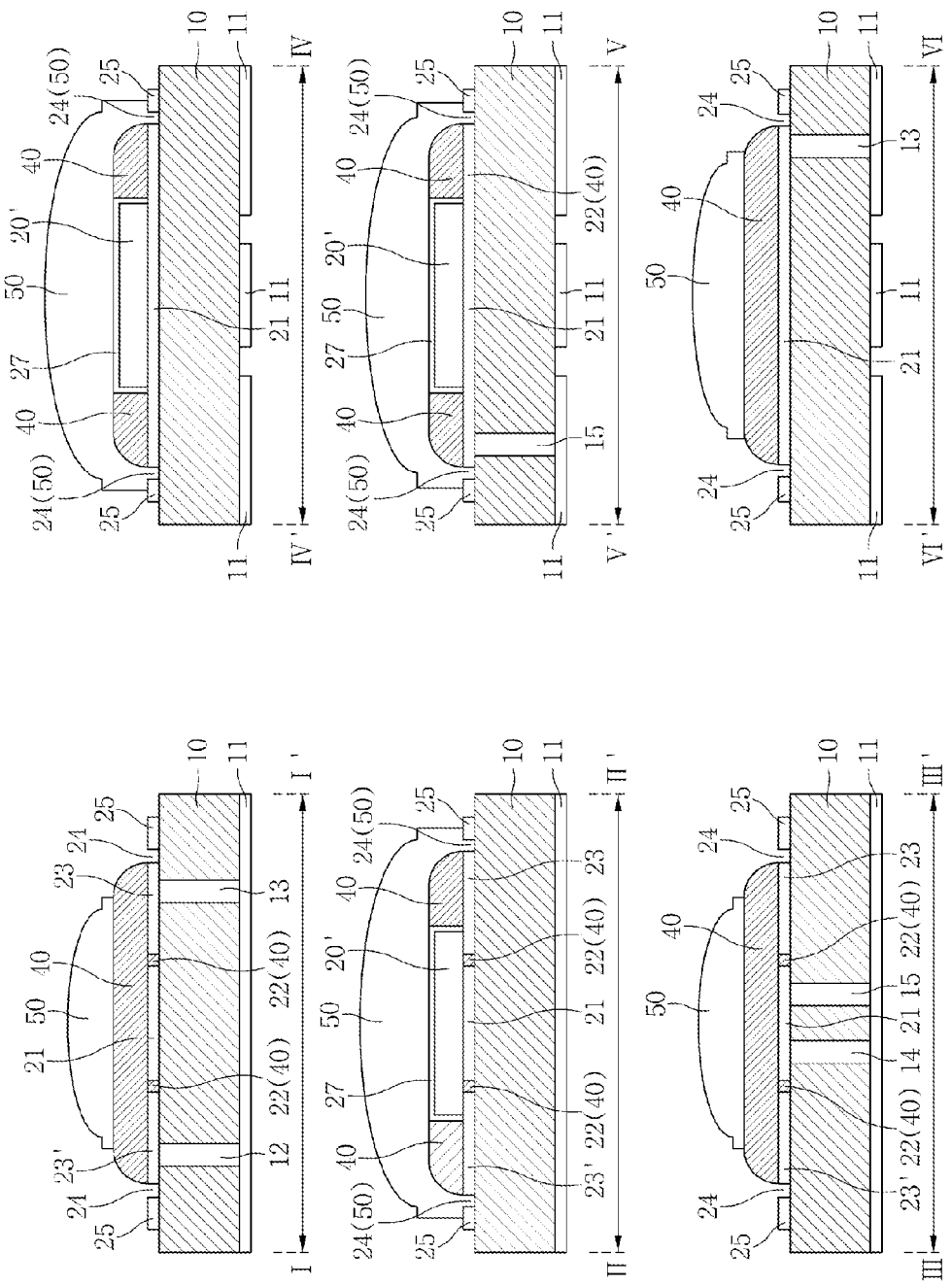
FIG. 22B shows cross-sectional views taken along lines I-I', II-II', III-III', IV-IV', V-V', and VI-VI' in FIG. 22A.

FIG. 22A is a top perspective view showing a flip-chip LED package structure in accordance with an embodiment of the inventive concept, and FIG. 22B shows cross-sectional views taken along lines I-I', II-II', III-III', IV-IV', V-V', and VI-VI' in FIG. 22A.

Referring to FIGS. 22A and 22B, a flip-chip LED package structure in accordance with an embodiment of the inventive concept may include a substrate 10, a first metal pattern 21, a second metal patterns 23 and 23', a third metal pattern 25, a first isolation line 22, a second isolation line 24, a lower pad 11, vias 12, 13, 14, and 15, a flip chip LED 20', a phosphor layer cap 27, a reflector 40, and a lens 50.

The substrate 10, the first metal pattern 21, the second metal patterns 23 and 23', the third metal pattern 25, the first isolation line 22, the second isolation line 24, the lower pad 11, the vias 12, 13, 14, and 15, the flip chip LED 20', the reflector 40, and the lens 50 may be understood with reference to FIGS. 20A and 20B.

The phosphor layer cap 27 may be understood with reference to FIGS. 10A and 10B.

Figure 23A:
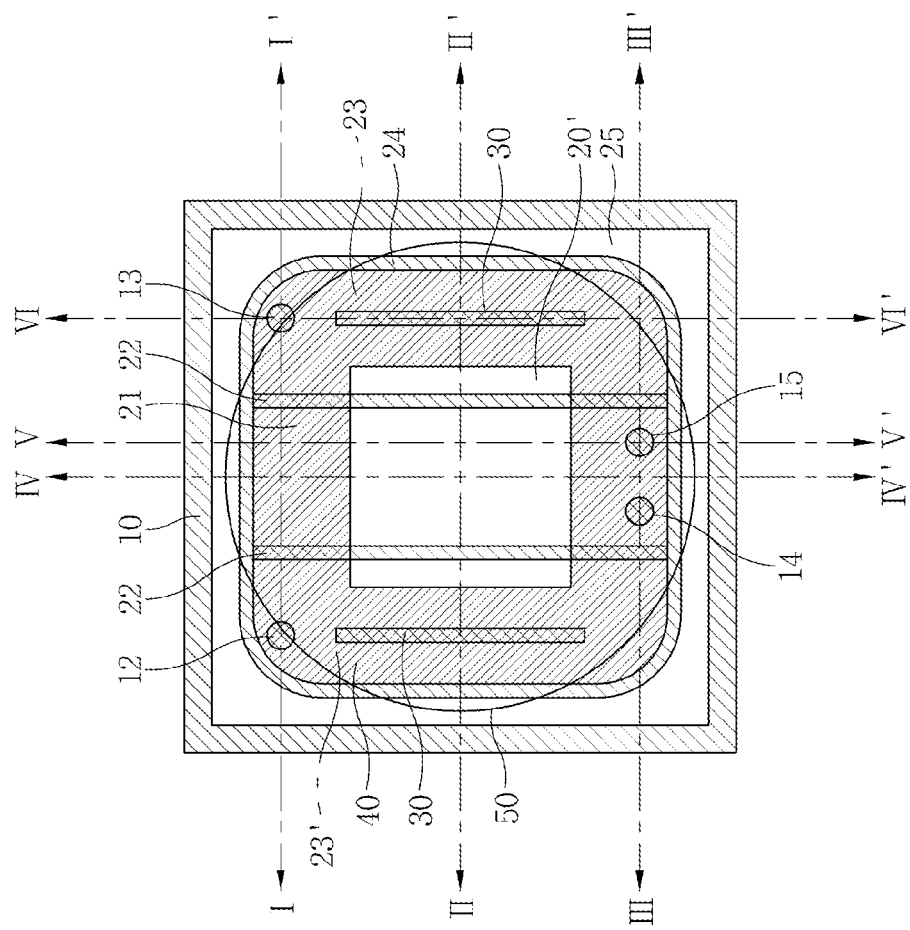
FIG. 23A is a top perspective view of a flip-chip LED package structure in accordance with an embodiment of the inventive concept.
Figure 23B:
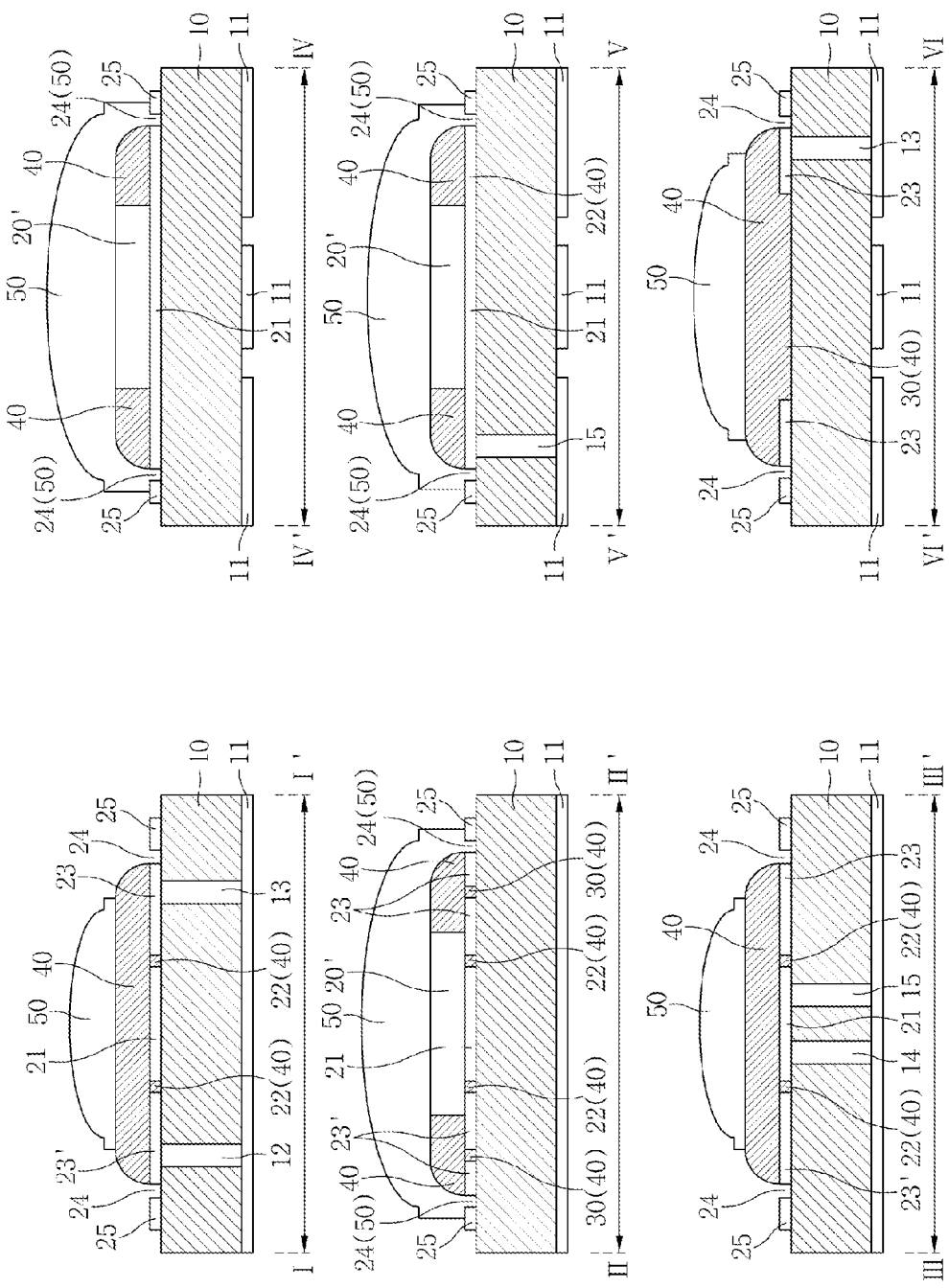
FIG. 23B shows cross-sectional views taken along lines I-I', II-II', III-III', IV-IV', V-V', and VI-VI' in FIG. 23A.

FIG. 23A is a top perspective view showing a flip-chip LED package structure in accordance with an embodiment of the inventive concept, and FIG. 23B shows cross-sectional views taken along lines I-I', II-II', III-III', IV-IV', V-V', and VI-VI' in FIG. 23A.

Referring to FIGS. 23A and 23B, a flip-chip LED package structure in accordance with an embodiment of the inventive concept may include a substrate 10, a first metal pattern 21, a second metal patterns 23 and 23', a third metal pattern 25, a first isolation line 22, a second isolation line 24, a slit 30, a lower pad 11, vias 12, 13, 14, and 15, a flip chip LED 20', a reflector 40, and a lens 50.

The substrate 10, the first metal pattern 21, the second metal patterns 23 and 23', the third metal pattern 25, the first isolation line 22, the second isolation line 24, the lower pad 11, and the vias 12, 13, 14, and 15 may be understood with reference to FIGS. 7A and 7B.

The slit 30, the flip chip LED 20', the reflector 40, and the lens 50 may be understood with reference to FIGS. 11A and 11B.

Figure 24A:
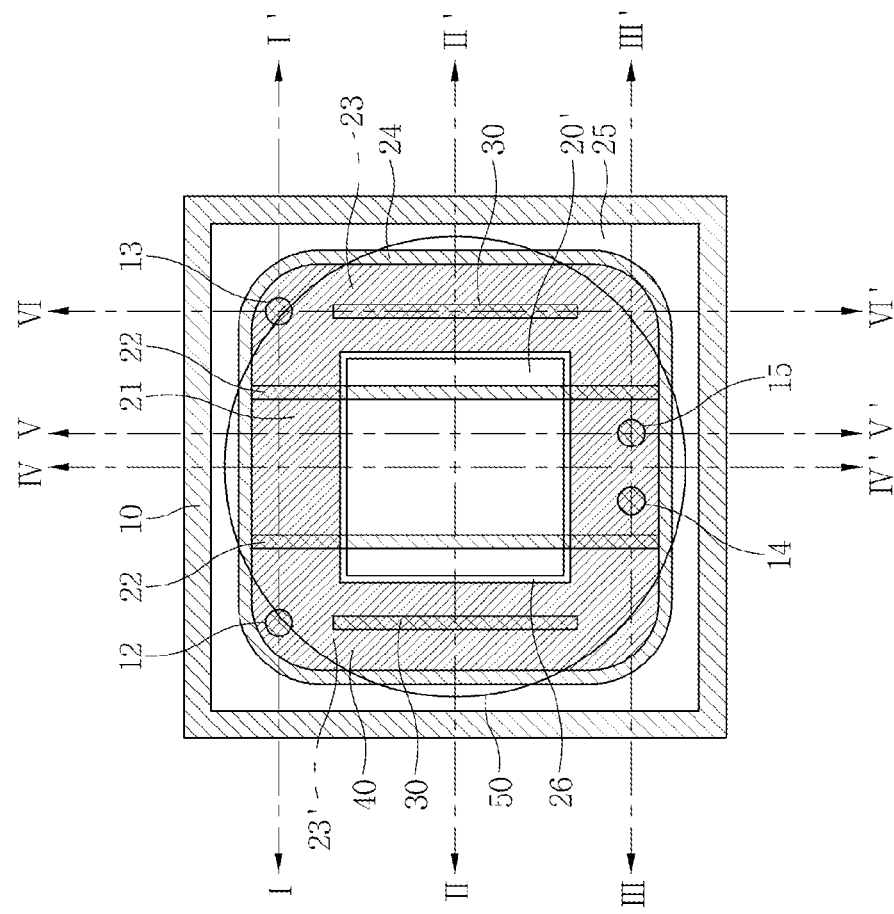
FIG. 24A is a top perspective view of a flip-chip LED package structure in accordance with an embodiment of the inventive concept.
Figure 24B:
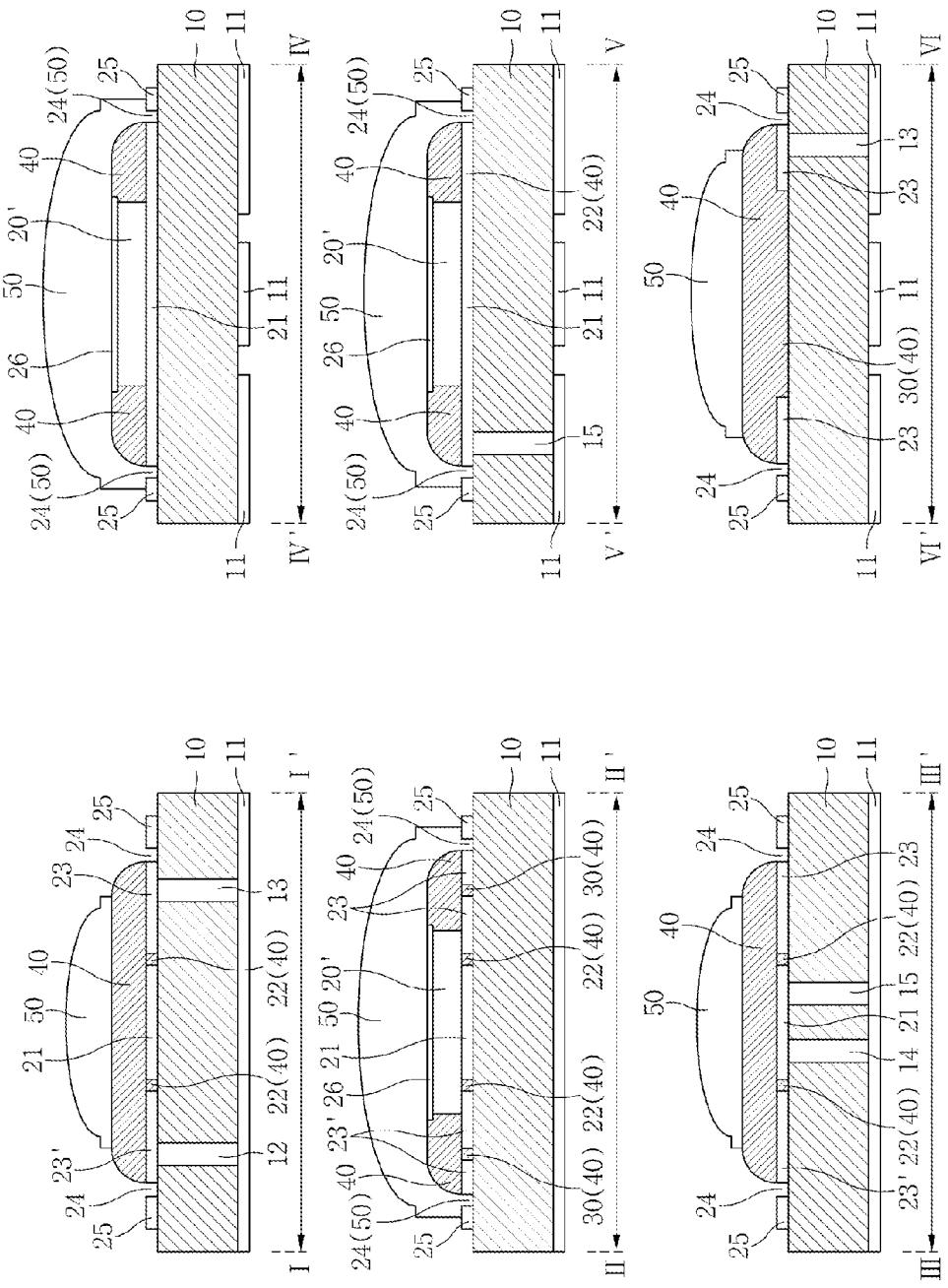
FIG. 24B shows cross-sectional views taken along lines I-I', II-II', III-III', IV-IV', V-V', and VI-VI' in FIG. 24A.

FIG. 24A is a top perspective view showing a flip-chip LED package structure in accordance with an embodiment of the inventive concept, and FIG. 24B shows cross-sectional views taken along lines I-I', II-II', III-III', IV-IV', V-V', and VI-VI' in FIG. 24A.

Referring to FIGS. 24A and 24B, a flip-chip LED package structure in accordance with an embodiment of the inventive concept may include a substrate 10, a first metal pattern 21, a second metal patterns 23 and 23', a third metal pattern 25, a first isolation line 22, a second isolation line 24, a slit 30, a lower pad 11, vias 12, 13, 14, and 15, a flip chip LED 20', a phosphor layer pad 26, a reflector 40, and a lens 50.

The substrate 10, the first metal pattern 21, the second metal patterns 23 and 23', the third metal pattern 25, the first isolation line 22, the second isolation line 24, the slit 30, the lower pad 11, the vias 12, 13, 14, and 15, the flip chip LED 20', the reflector 40, and the lens 50 may be understood with reference to FIGS. 23A and 23B.

The phosphor layer pad 26 may be understood with reference to FIGS. 9A and 9B.

Figure 25A:
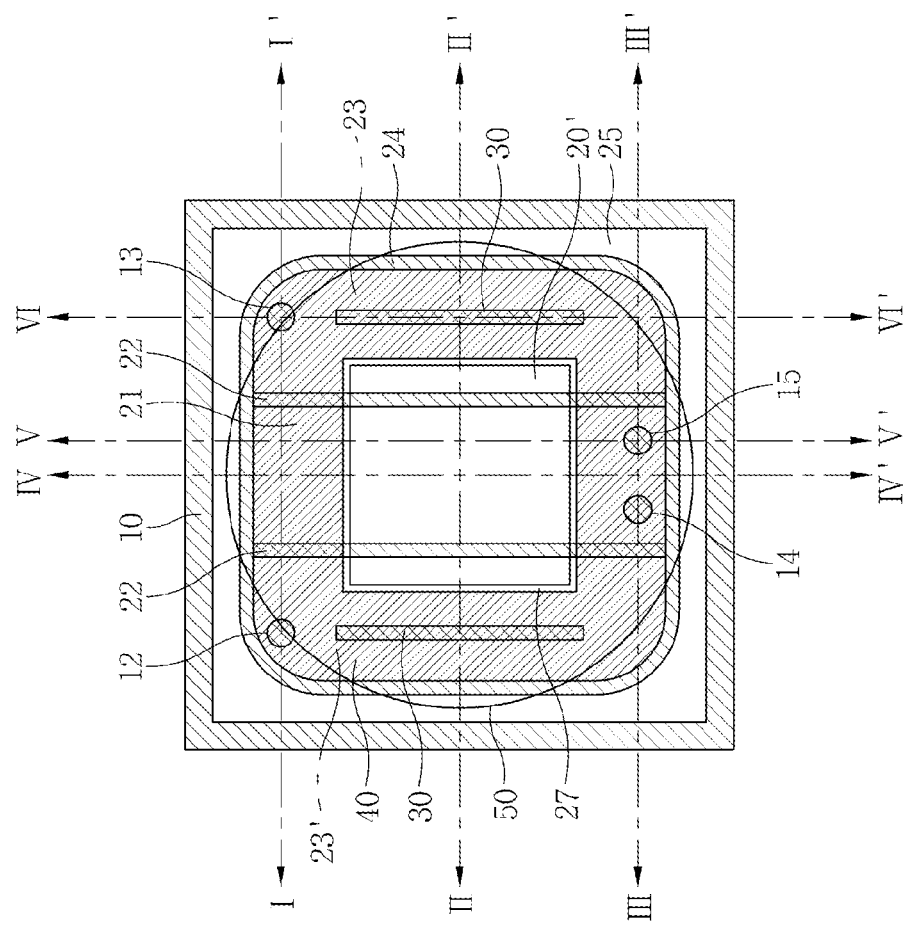
FIG. 25A is a top perspective view of a flip-chip LED package structure in accordance with an embodiment of the inventive concept.
Figure 25B:
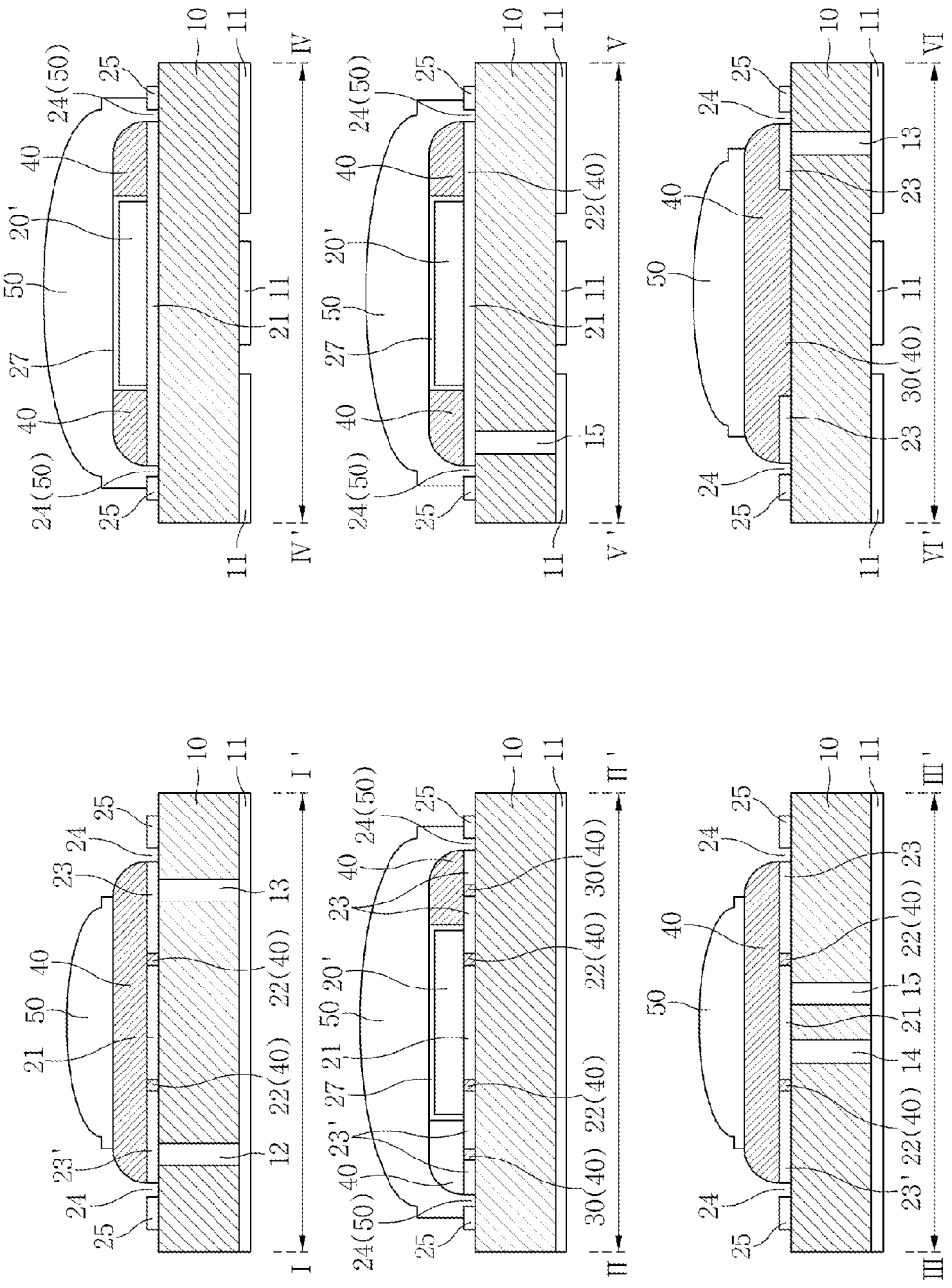
FIG. 25B shows cross-sectional views taken along lines I-I', II-II', III-III', IV-IV', V-V', and VI-VI' in FIG. 25A, FIGS. 26A to 26C are exploded views schematically showing a display apparatus in accordance with an embodiment of the inventive concept.

FIG. 25A is a top perspective view showing a flip-chip LED package structure in accordance with an embodiment of the inventive concept, and FIG. 25B shows cross-sectional views taken along lines I-I', II-II', III-III', IV-IV', V-V', and VI-VI' in FIG. 25A.

Referring to FIGS. 25A and 25B, a flip-chip LED package structure in accordance with an embodiment of the inventive concept may include a substrate 10, a first metal pattern 21, a second metal patterns 23 and 23', a third metal pattern 25, a first isolation line 22, a second isolation line 24, a slit 30, a lower pad 11, vias 12, 13, 14, and 15, a flip chip LED 20', a phosphor layer cap 27, a reflector 40, and a lens 50.

The substrate 10, the first metal pattern 21, the second metal patterns 23 and 23', the third metal pattern 25, the first isolation line 22, the second isolation line 24, the slit 30, the lower pad 11, the vias 12, 13, 14, and 15, the flip chip LED 20', the reflector 40, and the lens 50 may be understood with reference to FIGS. 23A and 23B.

The phosphor layer cap 27 may be understood with reference to FIGS. 10A and 10B.

Figure 26A:
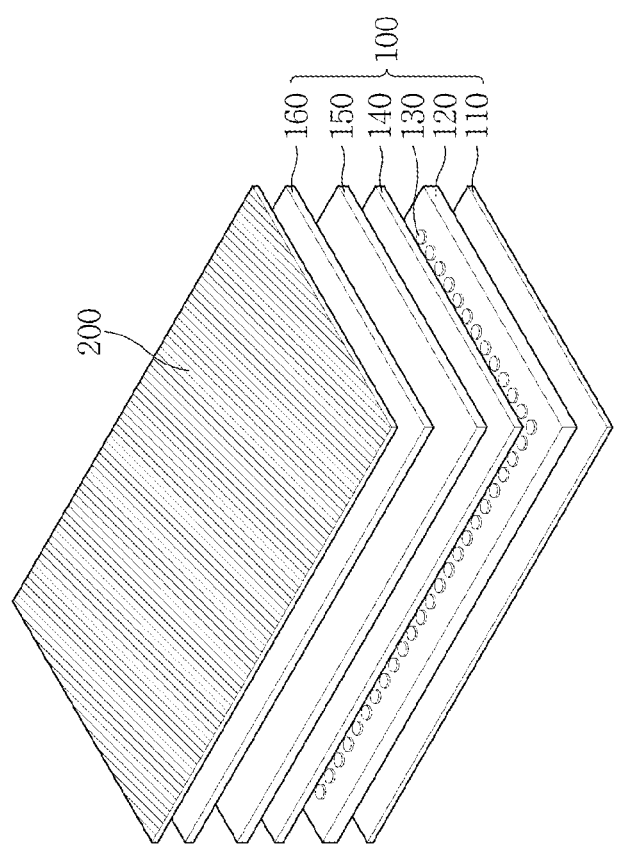

FIGS. 26A to 26C are exploded views schematically showing a display apparatus in accordance with an embodiment of the inventive concept.

Referring to FIG. 26A, a display apparatus in accordance with an embodiment of the inventive concept may include a back light unit 100 and a liquid crystal display (LCD) panel 200.

The back light unit 100, which supplies visible light required for the display apparatus, may include a reflection sheet 110, a light guide plate 120, an LED module 130, a diffusion sheet 140, a prism sheet 150, and a protection sheet 160.

The reflection sheet 110 may function to reflect an incident light upwards.

The light guide plate 120 may be formed on the reflection sheet 110 and function to distribute the incident light uniformly across the entire area. As an example, the light guide plate 120 may be formed of a transparent acryl panel. The acryl panel may include a pattern having a certain area and shape on a surface thereof, and the pattern may function to distribute light uniformly across the entire area. When the back light unit 100 is a direct type, the light guide plate 120 may include a diffusion plate. When the back light unit 100 is an edge type, the light guide plate 120 may function to distribute light uniformly.

The LED module 130 may be formed on a top or bottom of the light guide plate 120, and function as a light source that supply light to the back light unit 100. When the back light unit 100 is a direct type, the LED module 130 may include a plurality of LEDs L formed as an array-type module as shown in FIG. 26B. The LED module 130 may be formed on the bottom of the light guide plate 120. When the back light unit 100 is an edge type, the LED module 130 may include a plurality of LEDs L formed as a bar-type module as shown in FIG. 26C. The LED module 130 may be formed on the upper edge of the light guide plate 120.

The LED L may include a substrate for packaging the flip-chip LED of FIGS. 1A to 7B in accordance with embodiments of the inventive concept. The LED L may include a flip-chip LED package structure of FIGS. 8A to 25B in accordance with embodiments of the inventive concept.

The diffusion sheet 140 may be formed on the light guide plate 120 including the LED module 130, and distribute light uniformly on the entire surface of the light guide plate 120 by scattering light supplied from the surface of the light guide plate 120.

The prism sheet 150 may be formed on the diffusion sheet 140, and function to increase brightness by converging light emitted from the diffusion sheet 140. The prism sheet 150 may be formed in a stacked structure of a vertical prism sheet and a horizontal prism sheet.

The protection sheet 160 may be formed on the prism sheet 150, and function to prevent damage of the prism sheet 150. When the prism sheet 150 has the stacked structure of the vertical prism sheet and the horizontal prism sheet, the protection sheet 160 may prevent a moire phenomenon generated in the prism sheet 150.

The LCD panel 200 may implement image formation by controlling visible light supplied from the back light unit 100.

In the substrate for flip-chip LED in accordance with various embodiments of the inventive concept, a first isolation line which isolates a first metal pattern and a second metal pattern may be formed to include a couple of lines which are opposite to each other and centered around a chip mount region and symmetrical to each other with respect to the chip mount region in the chip mount region in a direction. Accordingly, during a process of packaging the flip-chip LED or during operation of the manufactured LED, stress due to a difference of thermal expansion coefficients between the flip chip LED and the metal patterns, or between the substrate and the metal patterns can be minimized, and defects such as chip crack can be prevented by minimizing stress by thermal expansion.

The substrate for packaging a flip-chip LED in accordance with various embodiments of the inventive concept may include a slit formed to be symmetrical with respect to the chip mount region at an outer side of the chip mount region and parallel to the first isolation line formed in the chip mount region. Accordingly, during a process of packaging the flip-chip LED or during operation of the manufactured LED, stress due to a difference of thermal expansion coefficients between the flip chip LED and the metal patterns, or between the substrate and the metal patterns can be minimized, and defects such as chip crack can be prevented by minimizing stress by thermal expansion.

The flip-chip LED package structure in accordance with various embodiments of the inventive concept may include a reflector uniformly formed on the substrate located at an outer side of the flip chip LED using the second metal pattern formed by the first isolation line. Accordingly, light efficiency of an LED device can increase, and reliability of a manufacturing process and a manufactured LED device can be improved.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A substrate for packaging a flip-chip light emitting device (LED), comprising:
a substrate including a chip mount region for mounting a single flip-chip LED;
a first metal pattern overlapping a part of the chip mount region for mounting the single flip-chip LED and disposed on the substrate;
a second metal pattern disposed in a region including the chip mount region for mounting the single flip-chip LED that is not overlapped with the first metal pattern, at an outer side of the first metal pattern;
a third metal pattern disposed at an outer side of the second metal pattern;
a first isolation line defining a boundary providing electrical isolation between the first metal pattern and the second metal pattern;
a second isolation line defining a boundary providing electrical isolation between the second metal pattern and the third metal pattern;
a first lower pad and a second lower pad;
a first via disposed to connect the first metal pattern to the first lower pad through the substrate; and
a second via disposed to connect the second metal pattern to the second lower pad through the substrate,
wherein the first isolation line comprises two line segments that each extend from one side to an opposite side of the chip mount region for mounting the single flip-chip LED,
wherein the two line segments are equidistantly spaced inward from a corresponding outer side of the chip mount region in a direction.

2. The substrate of claim 1, wherein the first isolation line includes mutually opposite a plurality of second line segments that are centered around the chip mount region in another direction.

3. The substrate of claim 2, wherein one of the second segments overlaps the second isolation line.

4. The substrate of claim 1, comprising a plurality of slits, each being equidistantly spaced from a corresponding outer side of the chip mount region and formed in the second metal pattern located at the corresponding outer side of the chip mount region.

5. The substrate of claim 4, wherein each of the plurality of slits includes a single line or a plurality of lines.

6. The substrate of claim 5, wherein the single line or a plurality of lines include a plurality of grids having a circular, a polygonal, or a moire shape.

7. The substrate of claim 4, wherein each of the plurality of slits has a length greater than or equal to a width of the chip mount region.

8. The substrate of claim 1, wherein the second metal pattern includes a rounded corner.

9. The substrate of claim 1, wherein the substrate includes a plurality of chip mount regions each for mounting a respective single flip-chip LED.

10. A flip-chip light emitting device (LED) package structure, comprising:
a substrate including a chip mount region for mounting a single flip-chip LED;
a first metal pattern overlapping a first part of the chip mount region and disposed on the substrate;
a second metal pattern disposed in a region including a second part of the chip mount region that is non-overlapping with the first part of the chip mount region, at an outer side of the first metal pattern;
a third metal pattern disposed at an outer side of the second metal pattern;
a first isolation line defining a boundary providing electrical isolation between the first metal pattern and the second metal pattern;
a second isolation line defining a boundary providing electrical isolation between the second metal pattern and the third metal pattern;
a first lower pad and a second lower pad;
a first via disposed to connect the first metal pattern to the first lower pad through the substrate;
a second via disposed to connect the second metal pattern to the second lower pad through the substrate;
a flip chip LED disposed on the chip mount region of the substrate;
a reflector disposed on the first and second metal patterns located at an outer side of the flip chip LED; and
a plurality of slits, each being equidistantly spaced from a corresponding outer side of the flip chip LED formed in the second metal pattern located at the corresponding outer side of the flip chip LED, and gap-filled with the reflector,
wherein the first isolation line comprises two line segments that each extend from one side to an opposite side of the chip mount region for mounting the single flip-chip LED.

11. The flip-chip LED package structure of claim 10, comprising a phosphor layer pad disposed on the flip chip LED.

12. The flip-chip LED package structure of claim 11, wherein the phosphor layer pad has an area greater than or equal to an area of an upper surface of the flip chip LED.

13. The flip-chip LED package structure of claim 11, wherein the phosphor layer pad is a phosphor sheet including one of a yellow phosphor material, or both a green phosphor material and a red phosphor material.

14. The flip-chip LED package structure of claim 10, further comprising a phosphor layer cap disposed on upper and side surfaces of the flip chip LED.

15. The substrate of claim 10, wherein the substrate includes a plurality of chip mount regions each for mounting a respective single flip-chip LED.

16. A display apparatus, comprising:
a plurality of light emitting devices (LEDs) including the substrate of claim 1 and having the form of an array or a bar;
a light guide plate configured to uniformly distribute light supplied from the LEDs in the entire area;

a back light unit including a reflection sheet disposed under the light guide plate;
a diffusion sheet disposed on the light guide plate;
a prism sheet disposed on the diffusion sheet;
a protection sheet disposed on the prism sheet, and
an LCD panel disposed on the back light unit.

17. A display apparatus, comprising:
a plurality of light emitting devices (LEDs) including the flip-chip LED package structure of claim 10 and having the form of an array or a bar;
a light guide plate configured to uniformly distribute light supplied from the LEDs in the entire area;
a back light unit including a reflection sheet disposed under the light guide plate;
a diffusion sheet disposed on the light guide plate;
a prism sheet disposed on the diffusion sheet;
a protection sheet disposed on the prism sheet, and
an LCD panel disposed on the back light unit.

\* \* \* \* \*